(12) United States Patent
Yoshimura

(10) Patent No.: US 10,777,746 B2
(45) Date of Patent: Sep. 15, 2020

(54) COMPOUND AND ELECTRONIC DEVICE

(71) Applicant: SUMITOMO CHEMICAL COMPANY, LIMITED, Tokyo (JP)

(72) Inventor: Ken Yoshimura, Tsukuba (JP)

(73) Assignee: SUMITOMO CHEMICAL COMPANY, LIMITED, Chuo-ku, Tokyo (JP)

( * ) Notice: Subject to any disclaimer, the term of this patent is extended or adjusted under 35 U.S.C. 154(b) by 0 days.

(21) Appl. No.: 15/109,674

(22) PCT Filed: Jan. 19, 2015

(86) PCT No.: PCT/JP2015/051937
§ 371 (c)(1),
(2) Date: Jul. 5, 2016

(87) PCT Pub. No.: WO2015/108206
PCT Pub. Date: Jul. 23, 2015

(65) Prior Publication Data
US 2016/0329495 A1 Nov. 10, 2016

(30) Foreign Application Priority Data
Jan. 20, 2014 (JP) ................. 2014-007480

(51) Int. Cl.
*H01L 51/00* (2006.01)
*C08G 61/12* (2006.01)
*H01L 51/42* (2006.01)
*H02S 40/38* (2014.01)
(Continued)

(52) U.S. Cl.
CPC ........ *H01L 51/0036* (2013.01); *C08G 61/126* (2013.01); *H01L 51/0043* (2013.01); *C08G 2261/146* (2013.01); *C08G 2261/1412* (2013.01); *C08G 2261/3245* (2013.01); *C08G 2261/3246* (2013.01); *C08G 2261/3247* (2013.01); *C08G 2261/344* (2013.01); *C08G 2261/414* (2013.01); *C08G 2261/91* (2013.01); *C08G 2261/92* (2013.01); *G01N 27/4141* (2013.01); *H01L 51/0047* (2013.01);
(Continued)

(58) Field of Classification Search
CPC ........... H01L 51/00–56; H01L 51/0043; H01L 51/0034–0044; H01L 51/4253–4273
See application file for complete search history.

(56) References Cited

U.S. PATENT DOCUMENTS 9,601,695 B2 * 3/2017 Yoshimura ........... C08G 61/122
2011/0156018 A1 6/2011 Moriwaki et al.
(Continued)

FOREIGN PATENT DOCUMENTS

GB WO 2013120591 A2 * 8/2013 ......... H01L 51/0043
JP 2009-506519 A 2/2009
(Continued)

OTHER PUBLICATIONS

Machine translation of JP-2012107187-A.*
Falzon, et al. "Designing acceptor polymers for organic photovoltaic devices." The Journal of Physical Chemistry C, 115.7 (2011): 3178-3187.*
Dang, et al. "Fluorine substitution enhanced photovoltaic performance of a D-A 1-D-A 2 copolymer." Chemical Communications, 49.81 (2013): 9335-9337.*
Zhou, et al. "Development of fluorinated benzothiadiazole as a structural unit for a polymer solar cell of 7% efficiency." Angewandte Chemie, 123.13 (2011): 3051-3054.*
(Continued)

*Primary Examiner* — William E McClain
(74) *Attorney, Agent, or Firm* — Sughrue Mion, PLLC

(57) ABSTRACT

Compound comprising structural units represented by formula (1) and formula (2):

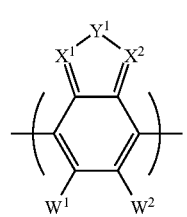

(1)

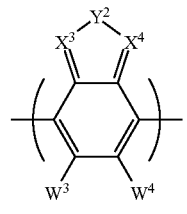

(2)

wherein $X^1$, $X^2$, $X^3$ and $X^4$ are the same or mutually different and represent a nitrogen atom or =CH—; $Y^1$ and $Y^2$ are the same or mutually different and represent a sulfur atom, an oxygen atom, a selenium atom, —N($R^1$)— or —$CR^2$=$CR^3$—; $R^1$, $R^2$ and $R^3$ are the same or mutually different and represent a hydrogen atom, a halogen atom, an amino group, a cyano group or a monovalent organic group; $W^1$ and $W^3$ are the same or mutually different and represent a halogen atom, a cyano group or a monovalent organic group; $W^2$ and $W^4$ are the same or mutually different and represent a hydrogen atom, a halogen atom, a cyano group or a monovalent organic group. The structural unit represented by formula (1) and the structural unit represented by formula (2) are not the same.

3 Claims, No Drawings

(51) Int. Cl.
*G01N 27/414* (2006.01)
*H01L 51/05* (2006.01)

(52) U.S. Cl.
CPC ...... *H01L 51/0566* (2013.01); *H01L 51/4253* (2013.01); *H02S 40/38* (2014.12)

(56) References Cited

U.S. PATENT DOCUMENTS

| | | | |
|---|---|---|---|
| 2012/0152357 A1* | 6/2012 | Brown | C07D 285/14 136/263 |
| 2012/0205596 A1 | 8/2012 | Yoshimura et al. | |
| 2012/0232237 A1* | 9/2012 | Li | B82Y 10/00 526/257 |
| 2013/0026459 A1 | 1/2013 | Yoshimura et al. | |
| 2014/0239284 A1 | 8/2014 | Yoshimura et al. | |
| 2014/0338750 A1* | 11/2014 | Iijima | C08G 61/123 136/263 |
| 2014/0346407 A1* | 11/2014 | Byrne | H01L 51/0043 252/500 |
| 2015/0340616 A1* | 11/2015 | Blouin | C08K 3/04 252/500 |

FOREIGN PATENT DOCUMENTS

| | | | | |
|---|---|---|---|---|
| JP | 2012107187 A | * | 6/2012 | ........... C08G 61/122 |
| JP | 2013-199590 A | | 10/2013 | |
| JP | 2013-237767 A | | 11/2013 | |
| WO | 2007/011739 A2 | | 1/2007 | |
| WO | 2010/026972 A1 | | 3/2010 | |
| WO | 2011/060526 A1 | | 5/2011 | |
| WO | 2011/136311 A1 | | 11/2011 | |
| WO | 2012/054910 A1 | | 4/2012 | |
| WO | WO-2012111811 A1 | * | 8/2012 | ........... C07D 333/08 |
| WO | WO-2012153845 A1 | * | 11/2012 | ......... H01L 51/0036 |

OTHER PUBLICATIONS

Chen, et al. "Fluorinated thienyl-quinoxaline-based D-π-A-type copolymer toward efficient polymer solar cells: synthesis, characterization, and photovoltaic properties." Polymer Chemistry, 4.11 (2013): 3411-3418. APA.*
Chen, et al. "Prominent short-circuit currents of fluorinated quinoxaline-based copolymer solar cells with a power conversion efficiency of 8.0%." Chemistry of Materia.*
Lu, et al. "Fluorine substituted thiophene-quinoxaline copolymer to reduce the HOMO level and increase the dielectric constant for high open-circuit voltage organic solar cells." Journal of Materials Chemistry C, 1.4 (2013): 630-637. APA.*
Price, et al. "Fluorine substituted conjugated polymer of medium band gap yields 7% efficiency in polymer—fullerene solar cells." Journal of the Am.*
Zhou, et al. "Tuning energy levels of low bandgap semi-random two acceptor copolymers." Macromolecules 46.9 (2013): 3391-3394.*
Sun, et al. "An alternating D-A1-D-A2 copolymer containing two electron-deficient moieties for efficient polymer solar cells." Journal of Materials Chemistry A 1.37 (2013): 11141-11144.*
International Search Report dated Apr. 21, 2015, issued by the International Searching Authority in application No. PCT/JP2015/051937.
International Preliminary Report on Patentability with translation of Written Opinion dated Jul. 26, 2016, issued by the International Searching Authority in application No. PCT/JP2015/051937.
Translation of Office Action dated Nov. 13, 2018 in Japanese Patent Application No. 2015-557925.

* cited by examiner

COMPOUND AND ELECTRONIC DEVICE

CROSS REFERENCE TO RELATED APPLICATIONS

This is a National Stage of International Application No. PCT/JP2015/051937 filed Jan. 19, 2015, claiming priority based on Japanese Patent Application No. 2014-007480 filed Jan. 20, 2014, the contents of all of which are incorporated herein by reference in their entirety.

TECHNICAL FIELD

The present invention relates to a compound, and an organic photoelectric conversion device and an organic film transistor using the same.

BACKGROUND ART

A polymer compound consisting of a repeating unit (A) and a repeating unit (B) is known as a compound used in an organic film solar battery (Patent document 1).

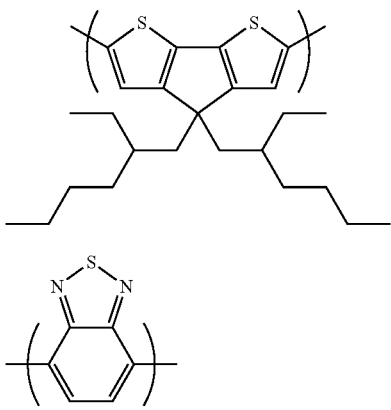

PRIOR ART DOCUMENT

Patent Document

Patent document 1: Japanese Patent Application National Publication No. 2009-506519

SUMMARY OF THE INVENTION

An organic film solar battery containing an organic layer containing the above-described polymer compound, however, has not necessarily fully high photoelectric conversion efficiency.

The present invention has an object of providing a compound capable of producing an organic film solar battery manifesting high photoelectric conversion efficiency.

The present invention provides the following [1] to [11].

[1] A compound comprising a structural unit represented by the formula (1) and a structural unit represented by the formula (2):

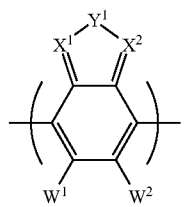

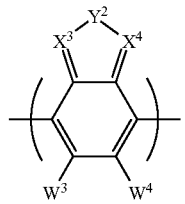

[wherein $X^1$, $X^2$, $X^3$ and $X^4$ are the same or mutually different and represent a nitrogen atom or =CH—. $Y^1$ and $Y^2$ are the same or mutually different and represent a sulfur atom, an oxygen atom, a selenium atom, —N($R^1$)- or —$CR^2$=$CR^3$-. $R^1$, $R^2$ and $R^3$ are the same or mutually different and represent a hydrogen atom, a halogen atom, an amino group, a cyano group or a monovalent organic group. $W^1$ and $W^3$ are the same or mutually different and represent a halogen atom, a cyano group or a monovalent organic group. $W^2$ and $W^4$ are the same or mutually different and represent a hydrogen atom, a halogen atom, a cyano group or a monovalent organic group. Here, the structural unit represented by the formula (1) and the structural unit represented by the formula (2) are not the same.].

[2] The compound according to [1], wherein $Y^1$ and $Y^2$ are not the same.

[3] The compound according to [1] or [2], wherein $W^1$, $W^2$, $W^3$ and $W^4$ are all a halogen atom.

[4] The compound according to any one of [1] to [3], further comprising a structural unit represented by the formula (3):

$Ar^I$ (3) [wherein $Ar^I$ represents an arylene group or a heteroarylene group.].

[5] The compound according to [4], wherein $Ar^I$ is a heteroarylene group.

[6] The compound according to [4] or [5], wherein the heteroarylene group is a group containing a thiophene ring.

[7] The compound according to any one of [1] to [6], wherein the compound is a polymer compound.

[8] The polymer compound according to [7], having a polystyrene-equivalent weight-average molecular weight of $3 \times 10^3$ or more.

[9] A photoelectric conversion device comprising a first electrode and a second electrode and having an active layer between the first electrode and the second electrode, wherein the active layer comprises the compound according to any one of [1] to [6] or the polymer compound according to [7] or [8].

[10] An organic film transistor comprising a gate electrode, a source electrode, a drain electrode and an active layer, wherein the active layer comprising the compound according to any one of [1] to [6] or the polymer compound according to [7] or [8].

[11] A sensor comprising the compound according to any one of [1] to [6] or the polymer compound according to [7] or [8].

MODES FOR CARRYING OUT THE INVENTION

The present invention will be illustrated in detail below.

The compound of the present invention has a structural unit represented by the formula (1) and a structural unit represented by the formula (2) shown below.

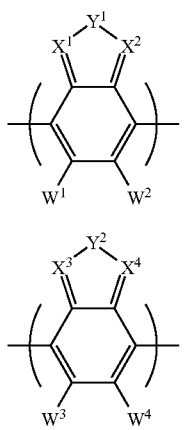

Here, the structure of the formula (1) and the structure of the formula (2) are not the same.

In the formulae, $X^1$, $X^2$, $X^3$ and $X^4$ are the same or mutually different and represent a nitrogen atom or =CH—. $X^1$, $X^2$, $X^3$ and $X^4$ are preferably a nitrogen atom.

$Y^1$ represents any of a sulfur atom, an oxygen atom, a selenium atom, —N($R^1$)— or —$CR^2$=$CR^3$—. $Y^1$ is preferably a sulfur atom, an oxygen atom or —N($R^1$)—, more preferably a sulfur atom or an oxygen atom, further preferably an oxygen atom.

$Y^2$ represents any of a sulfur atom, an oxygen atom, a selenium atom, —N($R^1$)— or —$CR^2$=$CR^3$—. $Y^2$ is preferably a sulfur atom, an oxygen atom or —N($R^1$)—, more preferably a sulfur atom or an oxygen atom, further preferably a sulfur atom.

Though $Y^1$ and $Y^2$ may be the same, it is preferable that $Y^1$ and $Y^2$ are mutually different, from the standpoint of enhancing photoelectric conversion efficiency.

When $Y^1$ and $Y^2$ are mutually different, it is preferable that one of $Y^1$ and $Y^2$ is a sulfur atom and the other is an oxygen atom.

$R^1$, $R^2$ and $R^3$ are the same or mutually different and represent a hydrogen atom, a halogen atom, an amino group, a cyano group or a monovalent organic group. $R^1$ is preferably a hydrogen atom or a monovalent organic group.

The monovalent organic group denotes an alkyl group which may be substituted, a cycloalkyl group which may be substituted, an alkoxy group which may be substituted, a cycloalkoxy group which may be substituted, an alkylthio group which may be substituted, a cycloalkylthio group which may be substituted, an aryl group which may be substituted, an aryloxy group which may be substituted, an arylthio group which may be substituted, an arylalkyl group which may be substituted, an arylalkoxy group which may be substituted, an arylalkylthio group which may be substituted, an acyl group, an acyloxy group, an amide group, an imide group, a substituted amino group, a substituted silyl group, a substituted silyloxy group, a substituted silylthio group, a substituted silylamino group, a monovalent heterocyclic group, a heterocyclicoxy group, a heterocyclicthio group, an arylalkenyl group, an arylalkynyl group or a carboxyl group.

The halogen atom includes a fluorine atom, a chlorine atom, a bromine atom and an iodine atom.

The alkyl group which may be substituted may be linear or branched. The alkyl group has a number of carbon atoms of usually 1 to 30. The alkyl group may be substituted, and the substituent includes a halogen atom. The halogen atom is preferably a fluorine atom. Specific examples of the alkyl group which may be substituted include a methyl group, an ethyl group, a propyl group, an isopropyl group, a butyl group, an isobutyl group, a sec-butyl group, a tert-butyl group, a pentyl group, an isopentyl group, a 2-methylbutyl group, a 1-methylbutyl group, a hexyl group, an isohexyl group, a 3-methylpentyl group, a 2-methylpentyl group, a 1-methylpentyl group, a heptyl group, an octyl group, an isooctyl group, a 2-ethylhexyl group, a 3,7-dimethyloctyl group, a nonyl group, a decyl group, an undecyl group, a dodecyl group, a tetradecyl group, a hexadecyl group, an octadecyl group and an eicosyl group. In the cycloalkyl group which may be substituted, the cycloalkyl group has a number of carbon atoms of usually 3 to 30. The cycloalkyl group may be substituted, and the substituent includes a halogen atom and an alkyl group (having a number of carbon atoms of, for example, 1 to 20). The halogen atom is preferably a fluorine atom. Two or more alkyl groups substituted on the cycloalkyl group may be mutually linked to form a cyclic structure together with carbon atoms to which they are linked. Specific examples of the cycloalkyl group which may be substituted include a cyclopentyl group, a cyclohexyl group and an adamantyl group.

The alkyl portion of the alkoxy group may be linear or branched. The alkoxy group may have a substituent. The alkoxy group has a number of carbon atoms of usually 1 to 20. The alkoxy group may be substituted, and the substituent includes a halogen atom, an alkoxy group (having a number of carbon atoms of, for example, 1 to 20) and a cycloalkoxy group (having a number of carbon atoms of, for example, 3 to 20). The halogen atom is preferably a fluorine atom. Specific examples of the alkoxy group which may be substituted include a methoxy group, an ethoxy group, a propoxy group, an isopropoxy group, a butoxy group, an isobutoxy group, a tert-butoxy group, a pentyloxy group, a hexyloxy group, a heptyloxy group, an octyloxy group, a 2-ethylhexyloxy group, a nonyloxy group, a decyloxy group, a 3,7-dimethyloctyloxy group, a lauryloxy group, a trifluoromethoxy group, a pentafluoroethoxy group, a perfluorobutoxy group, a perfluorohexyloxy group, a perfluorooctyloxy group, a methoxymethyloxy group and a 2-methoxyethyloxy group. In the cycloalkoxy group which may be substituted, the cycloalkoxy group has a number of carbon atoms of usually 3 to 20. The cycloalkoxy group may be substituted, and the substituent includes a halogen atom, an alkoxy group (having a number of carbon atoms of, for example, 1 to 20) and a cycloalkoxy group (having a number of carbon atoms of, for example, 3 to 20). The halogen atom is preferably a fluorine atom. The cycloalkoxy group which may be substituted includes, for example, a cyclopentyloxy group and a cyclohexyloxy group.

The alkyl portion of the alkylthio group may be linear or branched. The alkylthio group has a number of carbon atoms of usually 1 to 20. The alkylthio group may be substituted, and the substituent includes a halogen atom. The halogen atom is preferably a fluorine atom. Specific examples of the alkylthio group which may be substituted include a methylthio group, an ethylthio group, a propylthio group, an isopropylthio group, a butylthio group, an isobutylthio group, a tert-butylthio group, a pentylthio group, a hexylthio group, a cyclohexylthio group, a heptylthio group, an octylthio group, a 2-ethylhexylthio group, a nonylthio group, a decylthio group, a 3,7-dimethyloctylthio group, a laurylthio group and a trifluoromethylthio group. In the cycloalkylthio group which may be substituted, the cycloalkylthio group has a number of carbon atoms of 3 to 20. The cycloalkylthio group may be substituted, and the substituent includes a halogen atom. The halogen atom is preferably a fluorine atom.

The aryl group means a group obtained by removing from an aromatic hydrocarbon one hydrogen atom on the aromatic ring, and has a number of carbon atoms of usually 6 to 60. The aryl group may be substituted, and the substituent includes a halogen atom, an alkoxy group (having a number of carbon atoms of, for example, 1 to 20) and a cycloalkoxy group (having a number of carbon atoms of, for example, 3 to 20). The halogen atom is preferably a fluorine atom. Specific examples of the aryl group which may be substituted include a phenyl group, a C1 to C12 alkoxyphenyl group (the C1 to C12 alkoxy denotes an alkoxy having a number of carbon atoms of 1 to 12), a C1 to C12 alkylphenyl group (the C1 to C12 alkyl denotes an alkyl having a number of carbon atoms of 1 to 12), a 1-naphthyl group, a 2-naphthyl group and a pentafluorophenyl group. Of the C1 to C12 alkoxyphenyl group, a preferable embodiment is a C1 to C8 alkoxyphenyl group, a more preferable embodiment is a C1 to C6 alkoxyphenyl group. Specific examples of the C1 to C8 alkoxy and the C1 to C6 alkoxy include C1 to C8 and C1 to C6 alkoxys among alkoxys exemplified for the above-described alkoxy group.

The aryloxy group has a number of carbon atoms of usually 6 to 60. The aryl portion may be substituted, and the substituent includes a halogen atom, an alkoxy group (having a number of carbon atoms of, for example, 1 to 20) and a cycloalkoxy group (having a number of carbon atoms of, for example, 3 to 20). Specific examples of the aryloxy group which may be substituted include a phenoxy group, a C1 to C12 alkoxyphenoxy group, a C1 to C12 alkylphenoxy group, a 1-naphthyloxy group, a 2-naphthyloxy group and a pentafluorophenoxy group.

The arylthio group has a number of carbon atoms of usually 6 to 60. The aryl portion may be substituted, and the substituent includes a halogen atom, an alkoxy group (having a number of carbon atoms of, for example, 1 to 20) and a cycloalkoxy group (having a number of carbon atoms of, for example, 3 to 20). Specific examples of the arylthio group which may be substituted include a phenylthio group, a C1 to C12 alkoxyphenylthio group, a C1 to C12 alkylphenylthio group, a 1-naphthylthio group, a 2-naphthylthio group and a pentafluorophenylthio group.

The arylalkyl group has a number of carbon atoms of usually 7 to 60. The aryl portion may be substituted, and the substituent includes a halogen atom, an alkoxy group (having a number of carbon atoms of, for example, 1 to 20)) and a cycloalkoxy group (having a number of carbon atoms of, for example, 3 to 20). Specific examples of the arylalkyl group which may be substituted include a phenyl-C1 to C12 alkyl group, a C1 to C12 alkoxyphenyl-C1 to C12 alkyl group, a C1 to C12 alkylphenyl-C1 to C12 alkyl group, a 1-naphthyl-C1 to C12 alkyl group and a 2-naphthyl-C1 to C12 alkyl group.

The arylalkoxy group has a number of carbon atoms of usually 7 to 60. The aryl portion may be substituted, and the substituent includes a halogen atom, an alkoxy group (having a number of carbon atoms of, for example, 1 to 20)) and a cycloalkoxy group (having a number of carbon atoms of, for example, 3 to 20). Specific examples of the arylalkoxy group which may be substituted include a phenyl-C1 to C12 alkoxy group, a C1 to C12 alkoxyphenyl-C1 to C12 alkoxy group, a C1 to C12 alkylphenyl-C1 to C12 alkoxy group, a 1-naphthyl-C1 to C12 alkoxy group and a 2-naphthyl-C1 to C12 alkoxy group.

The arylalkylthio group has a number of carbon atoms of usually 7 to 60. The aryl portion may be substituted, and the substituent includes a halogen atom, an alkoxy group (having a number of carbon atoms of, for example, 1 to 20)) and a cycloalkoxy group (having a number of carbon atoms of, for example, 3 to 20). Specific examples of the arylalkylthio group which may be substituted include a phenyl-C1 to C12 alkylthio group, a C1 to C12 alkoxyphenyl-C1 to C12 alkylthio group, a C1 to C12 alkylphenyl-C1 to C12 alkylthio group, a 1-naphthyl-C1 to C12 alkylthio group and a 2-naphthyl-C1 to C12 alkylthio group.

The acyl group means a group obtained by removing a hydroxyl group from a carboxyl group (—COOH) of a carboxylic acid, and has a number of carbon atoms of usually 2 to 20. Specific examples of the acyl group include alkylcarbonyl groups having a number of carbon atoms of 2 to 20 which may be substituted with a halogen such as an acetyl group, a propionyl group, a butylyl group, an isobutylyl group, a pivaloyl group, a trifluoroacetyl group and the like, and phenylcarbonyl groups which may be substituted with a halogen such as a benzoyl group, a pentafluorobenzoyl group and the like.

The acyloxy group means a group obtained by removing a hydrogen atom from a carboxyl group (—COOH) of a carboxylic acid, and has a number of carbon atoms of usually 2 to 20. Specific examples of the acyloxy group include an acetoxy group, a propionyloxy group, a butylyloxy group, an isobutylyloxy group, a pivaloyloxy group, a benzoyloxy group, a trifluoroacetyloxy group and a pentafluorobenzoyloxy group.

The amide group means a group obtained by removing from an amide one hydrogen atom linked to its nitrogen atom, and has a number of carbon atoms of usually 2 to 20. Specific examples of the amide group include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group and a dipentafluorobenzamide group.

The imide group means a group obtained by removing from an imide one hydrogen atom linked to its nitrogen atom, and specific examples thereof include a succinimide group and a phthalimide group. The imide group has a number of carbon atoms of usually 2 to 20.

The substituted amino group is one obtained by substituting one or two hydrogen atoms of an amino group with a substituent. The substituent is, for example, an alkyl group which may be substituted, a cycloalkyl group which may be substituted and an aryl group which may be substituted. Specific examples of the alkyl group which may be substituted, the cycloalkyl group which may be substituted and the aryl group which may be substituted are the same as specific examples of the alkyl group which may be substituted, the cycloalkyl group which may be substituted and the aryl group which may be substituted represented by $R^1$. The substituted amino group has a number of carbon atoms of usually 1 to 40. Specific examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a tert-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a C1 to C12 alkyloxyphenylamino group, a di(C1 to C12 alkoxyphenyl)amino group, a di(C1 to C12 alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-C1 to C12 alkylamino group, a C1 to C12 alkoxyphenyl-C1 to C12 alkylamino group, a C1 to C12 alkylphenyl-C1 to C12 alkylamino group, a di(C1 to C12 alkoxyphenyl-C1 to C12 alkyl)amino group, a di(C1 to C12 alkylphenyl-C1 to C12 alkyl)amino group, a 1-naphthyl-C1 to C12 alkylamino group and a 2-naphthyl-C1 to C12 alkylamino group.

The substituted silyl group is one obtained by substituting one, two or three hydrogen atoms of a silyl group with a substituent, and generally one obtained by substituting all three hydrogen atoms of a silyl group, and the substituent is, for example, an alkyl group which may be substituted, a cycloalkyl group which may be substituted and an aryl group which may be substituted. Specific examples of the alkyl group which may be substituted, the cycloalkyl group which may be substituted and the aryl group which may be substituted are the same as specific examples of the alkyl group which may be substituted, the cycloalkyl group which may be substituted and the aryl group which may be substituted represented by $R^1$. The substituted silyl group has a number of carbon atoms of usually 1 to 36. Specific examples of the substituted silyl group include a trimethylsilyl group, a triethylsilyl group, a tripropylsilyl group, a triisopropylsilyl group, a tert-butyldimethylsilyl group, a triphenylsilyl group, a tri-p-xylylsilyl group, a tribenzylsilyl group, a diphenylmethylsilyl group, a tert-butyldiphenylsilyl group and a dimethylphenylsilyl group.

The substituted silyloxy group is one obtained by linking an oxygen atom to the above-described substituted silyl group, and the substituent includes those exemplified for the above-described substituted silyl group. The substituted silyloxy group has a number of carbon atoms of usually 1 to 36. Specific examples of the substituted silyloxy group include a trimethylsilyloxy group, a triethylsilyloxy group, a tripropylsilyloxy group, a triisopropylsilyloxy group, a tert-butyldimethylsilyloxy group, a triphenylsilyloxy group, a tri-p-xylylsilyloxy group, a tribenzylsilyloxy group, a diphenylmethylsilyloxy group, a tert-butyldiphenylsilyloxy group and a dimethylphenylsilyloxy group.

The substituted silylthio group is one obtained by linking a sulfur atom to the above-described substituted silyl group, and the substituent includes those exemplified for the above-described substituted silyl group. The substituted silylthio group has a number of carbon atoms of usually 1 to 36. Specific examples of the substituted silylthio group include a trimethylsilylthio group, a triethylsilylthio group, a tripropylsilylthio group, a triisopropylsilylthio group, a tert-butyldimethylsilylthio group, a triphenylsilylthio group, a tri-p-xylylsilylthio group, a tribenzylsilylthio group, a diphenylmethylsilylthio group, a tert-butyldiphenylsilylthio group and a dimethylphenylsilylthio group.

The substituted silylamino group is one obtained by substituting one or two hydrogen atoms of an amino group with a substituted silyl group, and the substituted silyl group is as described above. The substituted silylamino group has a number of carbon atoms of usually 1 to 36. Specific examples of the substituted silylamino group include a trimethylsilylamino group, a triethylsilylamino group, a tripropylsilylamino group, a triisopropylsilylamino group, a tert-butyldimethylsilylamino group, a triphenylsilylamino group, a tri-p-xylylsilylamino group, a tribenzylsilylamino group, a diphenylmethylsilylamino group, a tert-butyldiphenylsilylamino group, a dimethylphenylsilylamino group, a bis(trimethylsilyl)amino group, a bis(triethylsilyl)amino group, a bis(tripropylsilyl)amino group, a bis(triisopropylsilyl)amino group, a bis(tert-butyldimethylsilyl)amino group, a bis(triphenylsilyl)amino group, a bis(tri-p-xylylsilyl)amino group, a bis(tribenzylsilyl)amino group, a bis(diphenylmethylsilyl)amino group, a bis(tert-butyldiphenylsilyl)amino group and a bis(dimethylphenylsilyl)amino group.

The monovalent heterocyclic group may be substituted.

The monovalent heterocyclic group is one obtained by removing one hydrogen atom from a heterocyclic compound.

The heterocyclic compound includes furan, thiophene, pyrrole, pyrroline, pyrrolidine, oxazole, isooxazole, thiazole, isothiazole, imidazole, imidazoline, imidazolidine, pyrazole, pyrazoline, pyrazolidine, furazan, triazole, thiadiazole, oxadiazole, tetrazole, pyran, pyridine, piperidine, thiopyran, pyridazine, pyrimidine, pyrazine, piperazine, morpholine, triazine, benzofuran, isobenzofuran, benzothiophene, indole, isoindole, indolizine, indoline, isoindoline, chromene, chromane, isochromane, benzopyran, quinoline, isoquinoline, quinolizine, benzoimidazole, benzothiazole, indazole, naphthyridine, quinoxaline, quinazoline, quinazolidine, cinnoline, phthalazine, purine, pteridine, carbazole, xanthene, phenanthridine, acridine, β-carboline, perimidine, phenanthroline, thianthrene, phenoxathiin, phenoxazine, phenothiazine and phenazine. The monovalent heterocyclic group has a number of carbon atoms of usually 1 to 20. The monovalent heterocyclic group is preferably a hetero aryl group.

The heterocyclicoxy group includes a group represented by the formula (D) obtained by linking an oxygen atom to the above-described monovelant heterocyclic group. The heterocyclicthio group includes a group represented by the formula (E) obtained by linking a sulfur atom to the above-described monovalent heterocyclic group.

$$Ar^7\text{—O—} \tag{D}$$

$$Ar^7\text{—S—} \tag{E}$$

[in the formula (D) and the formula (E), each of $Ar^7$ represents a monovalent heterocyclic group.].

The heterocyclicoxy group has a number of carbon atoms of usually 4 to 60. Specific examples of the heterocyclicoxy group include a thienyloxy group, a C1 to C12 alkylthienyloxy group, a pyrrolyloxy group, a furyloxy group, a pyridyloxy group, a C1 to C12 alkylpyridyloxy group, an imidazolyloxy group, a pyrazolyloxy group, a triazolyloxy group, an oxazolyloxy group, a thiazoleoxy group and a thiadiazoleoxy group.

The heterocyclicthio group has a number of carbon atoms of usually 4 to 60. Specific examples of the heterocyclicthio group include a thienylmercapto group, a C1 to C12 alkylthienylmercapto group, a pyrrolylmercapto group, a furylmercapto group, a pyridylmercapto group, a C1 to C12 alkylpyridylmercapto group, an imidazolylmercapto group, a pyrazolylmercapto group, a triazolylmercapto group, an oxazolylmercapto group, a thiazolemercapto group and a thiadiazolemercapto group.

The arylalkenyl group has a number of carbon atoms of usually 8 to 20, and specific examples of the arylalkenyl group include a styryl group.

The arylalkynyl group has a number of carbon atoms of usually 8 to 20, and specific examples of the arylalkynyl group include a phenylacetylenyl group.

$R^1$, $R^2$ and $R^3$ are preferably an alkyl group, an aryl group or an arylalkyl group.

$W^1$ and $W^3$ are the same or mutually different and represent a halogen atom, a cyano group or a monovalent organic group. The definition and specific examples of the monovalent organic group are the same as the definition and specific examples of the monovalent organic group explained for $R^1$, $R^2$ and $R^3$ described above. $W^1$ and $W^3$ are preferably a monovalent organic group or a halogen atom, more preferably a monovalent organic group having a halogen atom or a halogen atom, further preferably a halogen atom. The halogen atom includes a fluorine atom, a chlorine atom, a bromine atom and an iodine atom, preferably a fluorine atom.

$W^2$ and $W^4$ are the same or mutually different and represent a hydrogen atom, a halogen atom, a cyano group or a monovalent organic group. The definition and specific examples of the monovalent organic group are the same as the definition and specific examples of the monovalent organic group explained for $R^1$, $R^2$ and $R^3$ described above. The halogen atom includes a fluorine atom, a chlorine atom, a bromine atom and an iodine atom. $W^2$ and $W^4$ are preferably a monovalent organic group, a halogen atom or a hydrogen atom, more preferably a monovalent organic group having a halogen atom, a halogen atom or a hydrogen atom, further preferably a halogen atom or a hydrogen atom, further more preferably a halogen atom. The halogen atom includes a fluorine atom, a chlorine atom, a bromine atom and an iodine atom, preferably a fluorine atom.

$W^1$, $W^2$, $W^3$ and $W^4$ are preferably all a halogen atom, more preferably all a fluorine atom.

Specific examples of the structural unit represented by the formula (1) include those of the formula (1) in which $X^1$, $X^2$, $Y^1$, $W^1$ and $W^2$ are combined as shown in the following Tables 1 to 4.

TABLE 1

| | $X^1$ | $X^2$ | $Y^1$ | $W^1$ | $W^2$ |
|---|---|---|---|---|---|
| 1-1 | N | N | S | F | F |
| 1-2 | N | N | O | F | F |
| 1-3 | N | N | —$CR^2$=$CR^3$— | F | F |
| 1-4 | N | N | S | F | H |
| 1-5 | N | N | O | F | H |
| 1-6 | N | N | —$CR^2$=$CR^3$— | F | H |
| 1-7 | N | N | S | F | $CF_3$ |
| 1-8 | N | N | O | F | $CF_3$ |
| 1-9 | N | N | —$CR^2$=$CR^3$— | F | $CF_3$ |
| 1-10 | N | N | S | F | $C_6F_{13}$ |
| 1-11 | N | N | O | F | $C_6F_{13}$ |
| 1-12 | N | N | —$CR^2$=$CR^3$— | F | $C_6F_{13}$ |
| 1-13 | N | N | S | F | $OCF_3$ |
| 1-14 | N | N | O | F | $OCF_3$ |
| 1-15 | N | N | —$CR^2$=$CR^3$— | F | $OCF_3$ |
| 1-16 | N | N | S | F | $OC_6F_{13}$ |
| 1-17 | N | N | O | F | $OC_6F_{13}$ |
| 1-18 | N | N | —$CR^2$=$CR^3$— | F | $OC_6F_{13}$ |
| 1-19 | N | N | S | F | $OC_8F_{17}$ |
| 1-20 | N | N | O | F | $OC_8F_{17}$ |
| 1-21 | N | N | —$CR^2$=$CR^3$— | F | $OC_8F_{17}$ |

TABLE 2

| | $X^1$ | $X^2$ | $Y^1$ | $W^1$ | $W^2$ |
|---|---|---|---|---|---|
| 1-22 | N | N | S | F | $CH_3$ |
| 1-23 | N | N | O | F | $CH_3$ |
| 1-24 | N | N | —$CR^2$=$CR^3$— | F | $CH_3$ |
| 1-25 | N | N | S | F | $C_6H_{13}$ |
| 1-26 | N | N | O | F | $C_6H_{13}$ |
| 1-27 | N | N | —$CR^2$=$CR^3$— | F | $C_6H_{13}$ |
| 1-28 | N | N | S | F | $OCH_3$ |
| 1-29 | N | N | O | F | $OCH_3$ |
| 1-30 | N | N | —$CR^2$=$CR^3$— | F | $OCH_3$ |
| 1-31 | N | N | S | F | $OC_6H_{13}$ |
| 1-32 | N | N | O | F | $OC_6H_{13}$ |
| 1-33 | N | N | —$CR^2$=$CR^3$— | F | $OC_6H_{13}$ |
| 1-34 | N | N | S | F | $OC_8H_{17}$ |
| 1-35 | N | N | O | F | $OC_8H_{17}$ |
| 1-36 | N | N | —$CR^2$=$CR^3$— | F | $OC_8H_{17}$ |
| 1-37 | N | N | S | $CF_3$ | $CF_3$ |
| 1-38 | N | N | O | $CF_3$ | $CF_3$ |
| 1-39 | N | N | —$CR^2$=$CR^3$— | $CF_3$ | $CF_3$ |
| 1-40 | N | N | S | $C_6F_{13}$ | $C_6F_{13}$ |
| 1-41 | N | N | O | $C_6F_{13}$ | $C_6F_{13}$ |
| 1-42 | N | N | —$CR^2$=$CR^3$— | $C_6F_{13}$ | $C_6F_{13}$ |
| 1-43 | N | N | S | $OCF_3$ | $OCF_3$ |
| 1-44 | N | N | O | $OCF_3$ | $OCF_3$ |
| 1-45 | N | N | —$CR^2$=$CR^3$— | $OCF_3$ | $OCF_3$ |
| 1-46 | N | N | S | $OC_6F_{13}$ | $OC_6F_{13}$ |
| 1-47 | N | N | O | $OC_6F_{13}$ | $OC_6F_{13}$ |
| 1-48 | N | N | —$CR^2$=$CR^3$— | $OC_6F_{13}$ | $OC_6F_{13}$ |
| 1-49 | N | N | S | $OC_8F_{17}$ | $OC_8F_{17}$ |
| 1-50 | N | N | O | $OC_8F_{17}$ | $OC_8F_{17}$ |
| 1-51 | N | N | —$CR^2$=$CR^3$— | $OC_8F_{17}$ | $OC_8F_{17}$ |

TABLE 3

| | $X^1$ | $X^2$ | $Y^1$ | $W^1$ | $W^2$ |
|---|---|---|---|---|---|
| 1-52 | N | N | S | $CH_3$ | $CH_3$ |
| 1-53 | N | N | O | $CH_3$ | $CH_3$ |
| 1-54 | N | N | —$CR^2$=$CR^3$— | $CH_3$ | $CH_3$ |
| 1-55 | N | N | S | $C_6H_{13}$ | $C_6H_{13}$ |
| 1-56 | N | N | O | $C_6H_{13}$ | $C_6H_{13}$ |
| 1-57 | N | N | —$CR^2$=$CR^3$— | $C_6H_{13}$ | $C_6H_{13}$ |
| 1-58 | N | N | S | $OCH_3$ | $OCH_3$ |
| 1-59 | N | N | O | $OCH_3$ | $OCH_3$ |
| 1-60 | N | N | —$CR^2$=$CR^3$— | $OCH_3$ | $OCH_3$ |
| 1-61 | N | N | S | $OC_6H_{13}$ | $OC_6H_{13}$ |
| 1-62 | N | N | O | $OC_6H_{13}$ | $OC_6H_{13}$ |
| 1-63 | N | N | —$CR^2$=$CR^3$— | $OC_6H_{13}$ | $OC_6H_{13}$ |
| 1-64 | N | N | S | $OC_8H_{17}$ | $OC_8H_{17}$ |
| 1-65 | N | N | O | $OC_8H_{17}$ | $OC_8H_{17}$ |
| 1-66 | N | N | —$CR^2$=$CR^3$— | $OC_8H_{17}$ | $OC_8H_{17}$ |

TABLE 4

| | $X^1$ | $X^2$ | $Y^1$ | $W^1$ | $W^2$ |
|---|---|---|---|---|---|
| 1-67 | N | N | S | $CF_3$ | H |
| 1-68 | N | N | O | $CF_3$ | H |
| 1-69 | N | N | —$CR^2$=$CR^3$— | $CF_3$ | H |
| 1-70 | N | N | S | $C_6F_{13}$ | H |
| 1-71 | N | N | O | $C_6F_{13}$ | H |
| 1-72 | N | N | —$CR^2$=$CR^3$— | $C_6F_{13}$ | H |
| 1-73 | N | N | S | $OCF_3$ | H |

TABLE 4-continued

|  | $X^1$ | $X^2$ | $Y^1$ | $W^1$ | $W^2$ |
|---|---|---|---|---|---|
| 1-74 | N | N | O | $OCF_3$ | H |
| 1-75 | N | N | $-CR^2=CR^3-$ | $OCF_3$ | H |
| 1-76 | N | N | S | $OC_6F_{13}$ | H |
| 1-77 | N | N | O | $OC_6F_{13}$ | H |
| 1-78 | N | N | $-CR^2=CR^3-$ | $OC_6F_{13}$ | H |
| 1-79 | N | N | S | $OC_8F_{17}$ | H |
| 1-80 | N | N | O | $OC_8F_{17}$ | H |
| 1-81 | N | N | $-CR^2=CR^3-$ | $OC_8F_{17}$ | H |
| 1-82 | N | N | S | $CH_3$ | H |
| 1-83 | N | N | O | $CH_3$ | H |
| 1-84 | N | N | $-CR^2=CR^3-$ | $CH_3$ | H |
| 1-85 | N | N | S | $C_6H_{13}$ | H |
| 1-86 | N | N | O | $C_6H_{13}$ | H |
| 1-87 | N | N | $-CR^2=CR^3-$ | $C_6H_{13}$ | H |
| 1-88 | N | N | S | $OCH_3$ | H |
| 1-89 | N | N | O | $OCH_3$ | H |
| 1-90 | N | N | $-CR^2=CR^3-$ | $OCH_3$ | H |
| 1-91 | N | N | S | $OC_6H_{13}$ | H |
| 1-92 | N | N | O | $OC_6H_{13}$ | H |
| 1-93 | N | N | $-CR^2=CR^3-$ | $OC_6H_{13}$ | H |
| 1-94 | N | N | S | $OC_8H_{17}$ | H |
| 1-95 | N | N | O | $OC_8H_{17}$ | H |
| 1-96 | N | N | $-CR^2=CR^3-$ | $OC_8H_{17}$ | H |
| 1-97 | =CH— | =CH— | S | F | F |
| 1-98 | =CH— | =CH— | O | F | F |
| 1-99 | =CH— | =CH— | $-CR^2=CR^3-$ | F | F |
| 1-100 | =CH— | =CH— | S | F | H |
| 1-101 | =CH— | =CH— | O | F | H |
| 1-102 | =CH— | =CH— | $-CR^2=CR^3-$ | F | H |
| 1-103 | =CH— | =CH— | S | F | $CF_3$ |
| 1-104 | =CH— | =CH— | O | F | $CF_3$ |
| 1-105 | =CH— | =CH— | $-CR^2=CR^3-$ | F | $CF_3$ |
| 1-106 | =CH— | =CH— | S | $CF_3$ | $CF_3$ |
| 1-107 | =CH— | =CH— | O | $CF_3$ | $CF_3$ |
| 1-108 | =CH— | =CH— | $-CR^2=CR^3-$ | $CF_3$ | $CF_3$ |

In the above-described Tables 1 to 4, $R^2$ and $R^3$ represent the same meaning as described above. Of them, 1-1 to 1-6 are preferable, 1-1 or 1-2 is more preferable, 1-1 is further preferable.

Specific examples of the structural unit represented by the formula (2) include those of the formula (2) in which $X^3$, $X^4$, $Y^2$, $W^3$ and $W^4$ are combined as shown in Tables 5 to 7.

TABLE 5

|  | $X^3$ | $X^4$ | $Y^2$ | $W^3$ | $W^4$ |
|---|---|---|---|---|---|
| 2-1 | N | N | S | F | F |
| 2-2 | N | N | O | F | F |
| 2-3 | N | N | $-CR^2=CR^3-$ | F | F |
| 2-4 | N | N | S | F | H |
| 2-5 | N | N | O | F | H |
| 2-6 | N | N | $-CR^2=CR^3-$ | F | H |
| 2-7 | N | N | S | F | $CF_3$ |
| 2-8 | N | N | O | F | $CF_3$ |
| 2-9 | N | N | $-CR^2=CR^3-$ | F | $CF_3$ |
| 2-10 | N | N | S | F | $C_6F_{13}$ |
| 2-11 | N | N | O | F | $C_6F_{13}$ |
| 2-12 | N | N | $-CR^2=CR^3-$ | F | $C_6F_{13}$ |
| 2-13 | N | N | S | F | $OCF_3$ |
| 2-14 | N | N | O | F | $OCF_3$ |
| 2-15 | N | N | $-CR^2=CR^3-$ | F | $OCF_3$ |
| 2-16 | N | N | S | F | $OC_6F_{13}$ |
| 2-17 | N | N | O | F | $OC_6F_{13}$ |
| 2-18 | N | N | $-CR^2=CR^3-$ | F | $OC_6F_{13}$ |
| 2-19 | N | N | S | F | $OC_8F_{17}$ |
| 2-20 | N | N | O | F | $OC_8F_{17}$ |
| 2-21 | N | N | $-CR^2=CR^3-$ | F | $OC_8F_{17}$ |
| 2-22 | N | N | S | F | $CH_3$ |
| 2-23 | N | N | O | F | $CH_3$ |
| 2-24 | N | N | $-CR^2=CR^3-$ | F | $CH_3$ |
| 2-25 | N | N | S | F | $C_6H_{13}$ |
| 2-26 | N | N | O | F | $C_6H_{13}$ |
| 2-27 | N | N | $-CR^2=CR^3-$ | F | $C_6H_{13}$ |

TABLE 5-continued

|  | $X^3$ | $X^4$ | $Y^2$ | $W^3$ | $W^4$ |
|---|---|---|---|---|---|
| 2-28 | N | N | S | F | $OCH_3$ |
| 2-29 | N | N | O | F | $OCH_3$ |
| 2-30 | N | N | $-CR^2=CR^3-$ | F | $OCH_3$ |
| 2-31 | N | N | S | F | $OC_6H_{13}$ |
| 2-32 | N | N | O | F | $OC_6H_{13}$ |
| 2-33 | N | N | $-CR^2=CR^3-$ | F | $OC_6H_{13}$ |
| 2-34 | N | N | S | F | $OC_8H_{17}$ |
| 2-35 | N | N | O | F | $OC_8H_{17}$ |
| 2-36 | N | N | $-CR^2=CR^3-$ | F | $OC_8H_{17}$ |

TABLE 6

|  | $X^3$ | $X^4$ | $Y^2$ | $W^3$ | $W^4$ |
|---|---|---|---|---|---|
| 2-37 | N | N | S | $CF_3$ | $CF_3$ |
| 2-38 | N | N | O | $CF_3$ | $CF_3$ |
| 2-39 | N | N | $-CR^2=CR^3-$ | $CF_3$ | $CF_3$ |
| 2-40 | N | N | S | $C_6F_{13}$ | $C_6F_{13}$ |
| 2-41 | N | N | O | $C_6F_{13}$ | $C_6F_{13}$ |
| 2-42 | N | N | $-CR^2=CR^3-$ | $C_6F_{13}$ | $C_6F_{13}$ |
| 2-43 | N | N | S | $OCF_3$ | $OCF_3$ |
| 2-44 | N | N | O | $OCF_3$ | $OCF_3$ |
| 2-45 | N | N | $-CR^2=CR^3-$ | $OCF_3$ | $OCF_3$ |
| 2-46 | N | N | S | $OC_6F_{13}$ | $OC_6F_{13}$ |
| 2-47 | N | N | O | $OC_6F_{13}$ | $OC_6F_{13}$ |
| 2-48 | N | N | $-CR^2=CR^3-$ | $OC_6F_{13}$ | $OC_6F_{13}$ |
| 2-49 | N | N | S | $OC_8F_{17}$ | $OC_8F_{17}$ |
| 2-50 | N | N | O | $OC_8F_{17}$ | $OC_8F_{17}$ |
| 2-51 | N | N | $-CR^2=CR^3-$ | $OC_8F_{17}$ | $OC_8F_{17}$ |
| 2-52 | N | N | S | $CH_3$ | $CH_3$ |
| 2-53 | N | N | O | $CH_3$ | $CH_3$ |
| 2-54 | N | N | $-CR^2=CR^3-$ | $CH_3$ | $CH_3$ |
| 2-55 | N | N | S | $C_6H_{13}$ | $C_6H_{13}$ |
| 2-56 | N | N | O | $C_6H_{13}$ | $C_6H_{13}$ |
| 2-57 | N | N | $-CR^2=CR^3-$ | $C_6H_{13}$ | $C_6H_{13}$ |
| 2-58 | N | N | S | $OCH_3$ | $OCH_3$ |
| 2-59 | N | N | O | $OCH_3$ | $OCH_3$ |
| 2-60 | N | N | $-CR^2=CR^3-$ | $OCH_3$ | $OCH_3$ |
| 2-61 | N | N | S | $OC_6H_{13}$ | $OC_6H_{13}$ |
| 2-62 | N | N | O | $OC_6H_{13}$ | $OC_6H_{13}$ |
| 2-63 | N | N | $-CR^2=CR^3-$ | $OC_6H_{13}$ | $OC_6H_{13}$ |
| 2-64 | N | N | S | $OC_8H_{17}$ | $OC_8H_{17}$ |
| 2-65 | N | N | O | $OC_8H_{17}$ | $OC_8H_{17}$ |
| 2-66 | N | N | $-CR^2=CR^3-$ | $OC_8H_{17}$ | $OC_8H_{17}$ |

TABLE 7

|  | $X^3$ | $X^4$ | $Y^2$ | $W^3$ | $W^4$ |
|---|---|---|---|---|---|
| 2-67 | N | N | S | $CF_3$ | H |
| 2-68 | N | N | O | $CF_3$ | H |
| 2-69 | N | N | $-CR^2=CR^3-$ | $CF_3$ | H |
| 2-70 | N | N | S | $C_6F_{13}$ | H |
| 2-71 | N | N | O | $C_6F_{13}$ | H |
| 2-72 | N | N | $-CR^2=CR^3-$ | $C_6F_{13}$ | H |
| 2-73 | N | N | S | $OCF_3$ | H |
| 2-74 | N | N | O | $OCF_3$ | H |
| 2-75 | N | N | $-CR^2=CR^3-$ | $OCF_3$ | H |
| 2-76 | N | N | S | $OC_6F_{13}$ | H |
| 2-77 | N | N | O | $OC_6F_{13}$ | H |
| 2-78 | N | N | $-CR^2=CR^3-$ | $OC_6F_{13}$ | H |
| 2-79 | N | N | S | $OC_8F_{17}$ | H |
| 2-80 | N | N | O | $OC_8F_{17}$ | H |
| 2-81 | N | N | $-CR^2=CR^3-$ | $OC_8F_{17}$ | H |
| 2-82 | N | N | S | $CH_3$ | H |
| 2-83 | N | N | O | $CH_3$ | H |
| 2-84 | N | N | $-CR^2=CR^3-$ | $CH_3$ | H |
| 2-85 | N | N | S | $C_6H_{13}$ | H |
| 2-86 | N | N | O | $C_6H_{13}$ | H |
| 2-87 | N | N | $-CR^2=CR^3-$ | $C_6H_{13}$ | H |
| 2-88 | N | N | S | $OCH_3$ | H |
| 2-89 | N | N | O | $OCH_3$ | H |
| 2-90 | N | N | $-CR^2=CR^3-$ | $OCH_3$ | H |

TABLE 7-continued

| | X³ | X⁴ | Y² | W³ | W⁴ |
|---|---|---|---|---|---|
| 2-91 | N | N | S | OC₆H₁₃ | H |
| 2-92 | N | N | O | OC₆H₁₃ | H |
| 2-93 | N | N | —CR²=CR³— | OC₆H₁₃ | H |
| 2-94 | N | N | S | OC₈H₁₇ | H |
| 2-95 | N | N | O | OC₈H₁₇ | H |
| 2-96 | N | N | —CR²=CR³— | OC₈H₁₇ | H |
| 2-97 | =CH— | =CH— | S | F | F |
| 2-98 | =CH— | =CH— | O | F | F |
| 2-99 | =CH— | =CH— | —CR²=CR³— | F | F |
| 2-100 | =CH— | =CH— | S | F | H |
| 2-101 | =CH— | =CH— | O | F | H |
| 2-102 | =CH— | =CH— | —CR²=CR³— | F | H |
| 2-103 | =CH— | =CH— | S | F | CF₃ |
| 2-104 | =CH— | =CH— | O | F | CF₃ |
| 2-105 | =CH— | =CH— | —CR²=CR³— | F | CF₃ |
| 2-106 | =CH— | =CH— | S | CF₃ | CF₃ |
| 2-107 | =CH— | =CH— | O | CF₃ | CF₃ |
| 2-108 | =CH— | =CH— | —CR²=CR³— | CF₃ | CF₃ |

In the above-described Tables 5 to 7, $R^2$ and $R^3$ represent the same meaning as described above. Of them, 2-1 to 2-6 are preferable, 2-1 or 2-2 is more preferable, 2-2 is further preferable.

The compound of the present invention may have a structure represented by the formula (3) in addition to structures represented by the formula (1) and the formula (2) described above.

$$—Ar^1—\qquad(3)$$

In the formula, $Ar^1$ represents an arylene group or a heteroarylene group.

Here, the arylene group is an atomic group obtained by removing two hydrogen atoms from an aromatic hydrocarbon which may be substituted. The number of carbon atoms constituting an aromatic ring contained in the arylene group is usually about 6 to 60, preferably 6 to 20. The aromatic hydrocarbon includes those having a benzene ring, those having a condensed ring, and those having two or more independent benzene rings or condensed rings linked directly or linked via a group such as vinylene and the like.

The heteroarylene group is an atomic group obtained by removing two hydrogen atoms from an aromatic heterocyclic compound which may be substituted. The number of carbon atoms constituting an aromatic ring contained in the heteroarylene group is usually about 2 to 60, preferably 3 to 20. The aromatic heterocyclic compound includes organic compounds having an aromatic cyclic structure in which elements constituting the ring include not only a carbon atom but also hetero atoms such as oxygen, sulfur, nitrogen, phosphorus, boron, arsenic, silicon and the like contained in the ring.

$Ar^1$ is preferably a heteroarylene group, more preferably a heteroarylene group containing a thiophene ring.

Two or more structural units represented by the formula (3) may be present in series in the compound of the present invention, and structural units represented by the formula (1) and/or the formula (2) may be present at both sides of the structural unit represented by the formula (3). When two or more structural units are present in series, the structural units represented by the formula (3) present in series may be the same or mutually different.

The structural unit represented by the formula (3) includes, for example, a structural unit represented by the formula (D-1) and a structural unit represented by the formula (D-2).

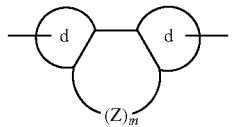 (D-1)

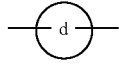 (D-2)

[wherein the ring d represents an aromatic carbocyclic ring which may be substituted or an aromatic heterocyclic ring which may be substituted. m represents an integer of 1 or more. Z is a group represented by the formula (z-1) to the formula (z-8). When a plurality of rings d are present, these may be the same or mutually different. When there are a plurality of Z, these may be the same or mutually different.

 (z-1)

 (z-2)

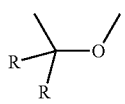 (z-3)

 (z-4)

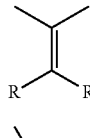 (z-5)

(z-6)

 (z-7)

 (z-8)

(in the formula (z-1) to the formula (z-8), R represents a hydrogen atom, a halogen atom, an amino group, a cyano group or a monovalent organic group. When there are two R, these may be the same or mutually different. Two R may be mutually linked to form a cyclic structure together with carbon atoms to which they are linked.)]

The aromatic carbocyclic ring includes a benzene ring, a naphthalene ring, an anthracene ring and the like.

The aromatic heterocyclic ring includes a furan ring, a thiophene ring, a pyrrole ring, a silole ring, a borole ring, a phosphole ring, an imidazole ring, a triazole ring, a thiazole ring, an oxazole ring, an isooxazole ring, a pyrazole ring, an isothiazole ring, a pyridine ring, a pyrazine ring, a pyrimidine ring, a quinolone ring, an isoquinoline ring, an indole ring, a benzofuran ring, an isobenzofuran ring, a benzoimidazole ring, a benzothiophene ring, a benzothiazole ring, a benzooxazole ring and the like.

m represents an integer of 1 or more, preferably 1 to 3, more preferably 1 to 2, further preferably 1.

The monovalent organic group represented by R includes the same groups as those listed for the monovalent organic group represented by $R^1$ described above.

R is preferably an alkyl group which may be substituted, a cycloalkyl group which may be substituted, an alkoxy group which may be substituted, an aryl group which may be substituted or an aryloxy group which may be substituted, more preferably an alkyl group which may be substituted having a number of carbon atoms of 9 to 18, a cycloalkyl group which may be substituted having a number of carbon atoms of 9 to 18, an alkoxy group which may be substituted having a number of carbon atoms of 9 to 18, a cycloalkoxy group which may be substituted having a number of carbon atoms of 9 to 18, an aryl group which may be substituted having a number of carbon atoms of 9 to 18 or an aryloxy group which may be substituted having a number of carbon atoms of 9 to 18, further preferably an alkyl group having a number of carbon atoms of 9 to 18.

The aromatic carbocyclic ring and the aromatic heterocyclic ring may have a substituent. When the aromatic carbocyclic ring and the aromatic heterocyclic ring have two or more substituents, the substituents may be mutually linked to form a cyclic structure together with carbon atoms to which they are linked. The substituent which the aromatic carbocyclic ring and the aromatic heterocyclic ring may have include the same groups as those listed for the halogen atom, the amino group, the cyano group or the monovalent organic group represented by $R^1$ described above.

The structural unit represented by the formula (D-2) includes a structural unit represented by the formula (D-3), a structural unit represented by the formula (D-4) and a structural unit represented by the formula (D-5).

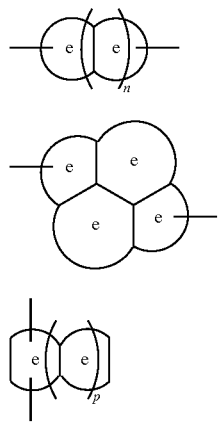

(D-3)

(D-4)

(D-5)

[wherein the ring e represents a monocyclic aromatic carbocylic ring which may be substituted or a monocyclic aromatic heterocyclic ring which may be substituted. n represents an integer of 1 or more. p represents an integer of 0 to 5. When a plurality of rings e are present, these may be the same or mutually different.].

n represents an integer of 1 or more, preferably 1 to 4, more preferably 1 to 3, further preferably 1 to 2.

p represents an integer of 0 to 5, preferably 0 to 4, more preferably 0 to 3, further preferably 0 to 2.

The substituent which the monocyclic aromatic carbocyclic ring and the monocyclic aromatic heterocyclic ring may have includes the same groups as the substituent which the aromatic carbocyclic ring or the aromatic heterocyclic ring may have in the ring d.

When the compound of the present invention is used in a photoelectric conversion device, a structural unit represented by the formula (D-1) and a structural unit represented by the formula (D-5) are preferable and a structural unit represented by the formula (D-1) is more preferable, among structural units represented by the formula (D-1) to the formulae (D-5), from the standpoint of enhancing photoelectric conversion efficiency.

When the compound of the present invention is used in organic film transistor, a structural unit represented by the formula (D-1) and a structural unit represented by the formula (D-4) are preferable and a structural unit represented by the formula (D-1) is more preferable, among structural units represented by the formula (D-1) to the formulae (D-5), from the standpoint of enhancing hole migration.

The structural unit represented by the formula (D-1) includes groups represented by the formula 1 to the formula 152.

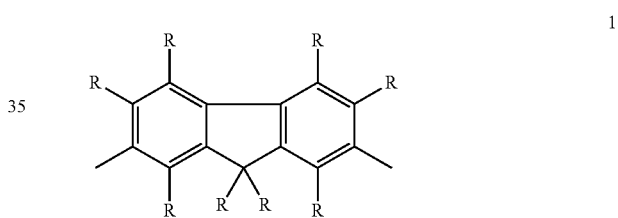

1

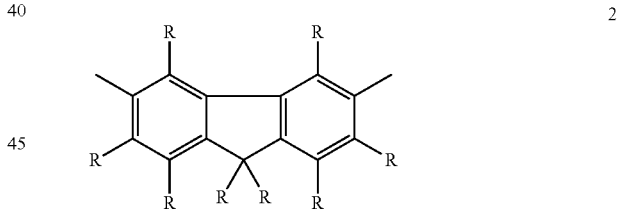

2

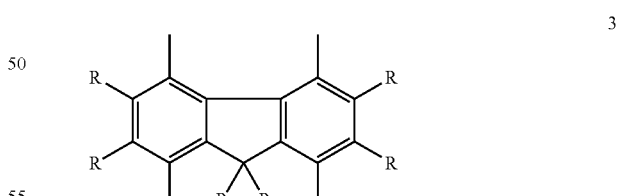

3

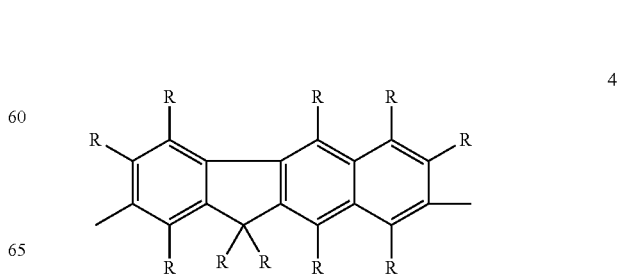

4

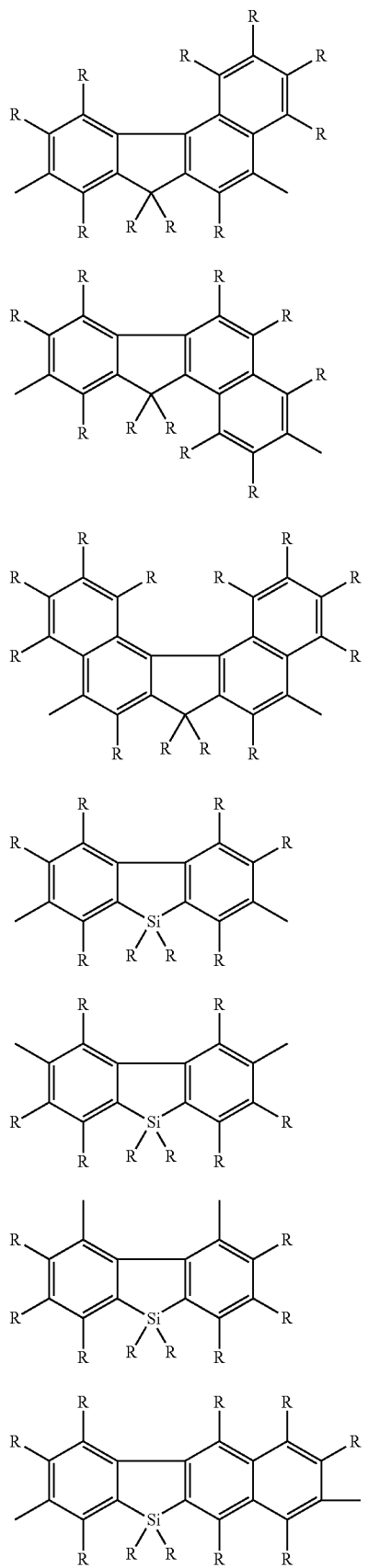
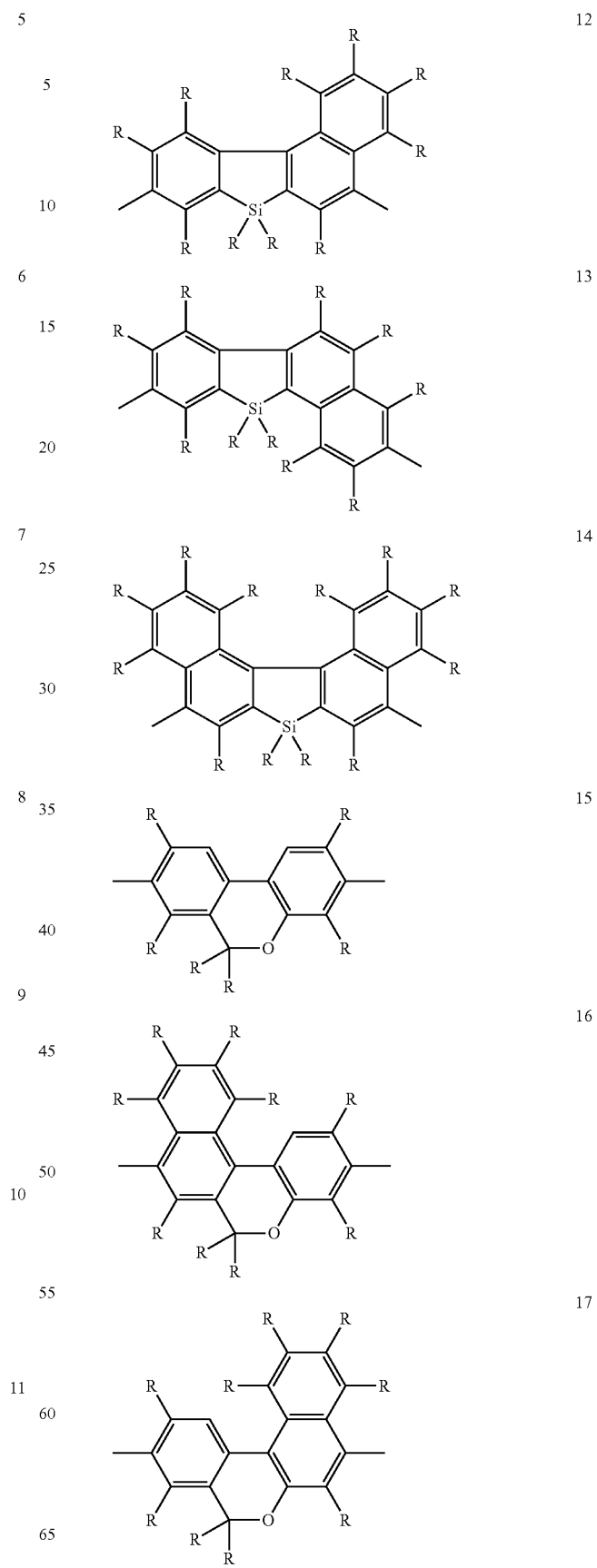

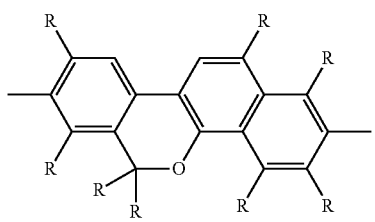
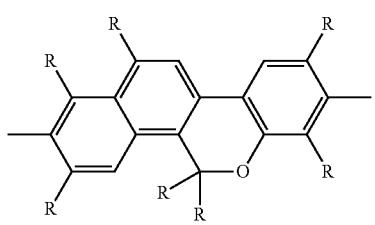
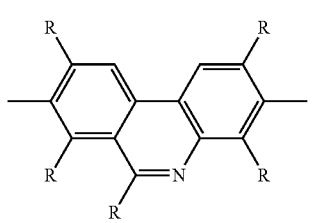
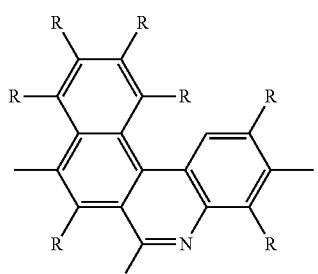
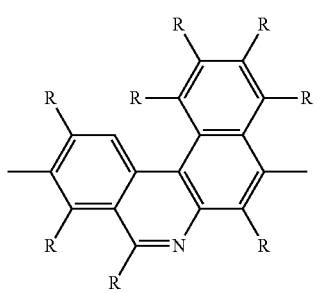
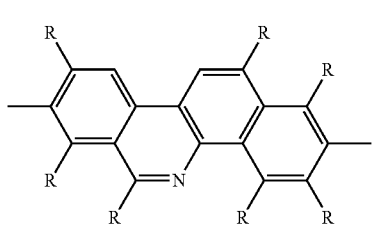
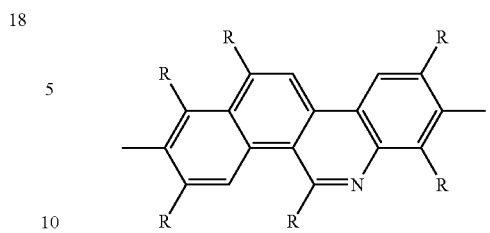
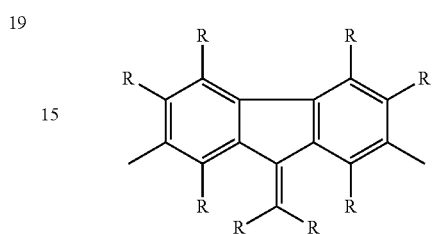
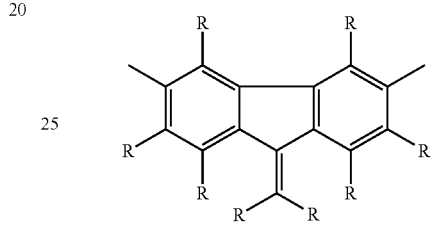
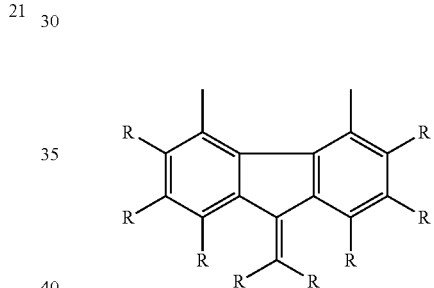
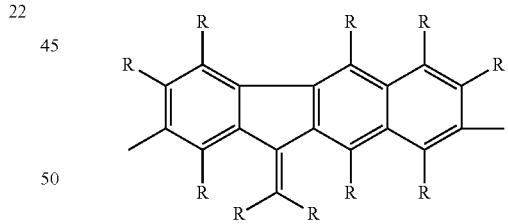
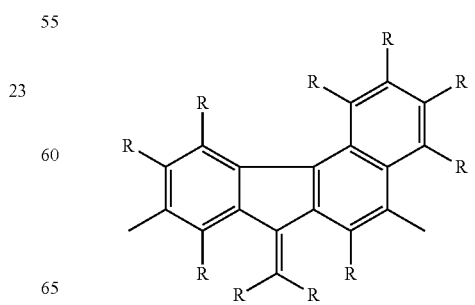

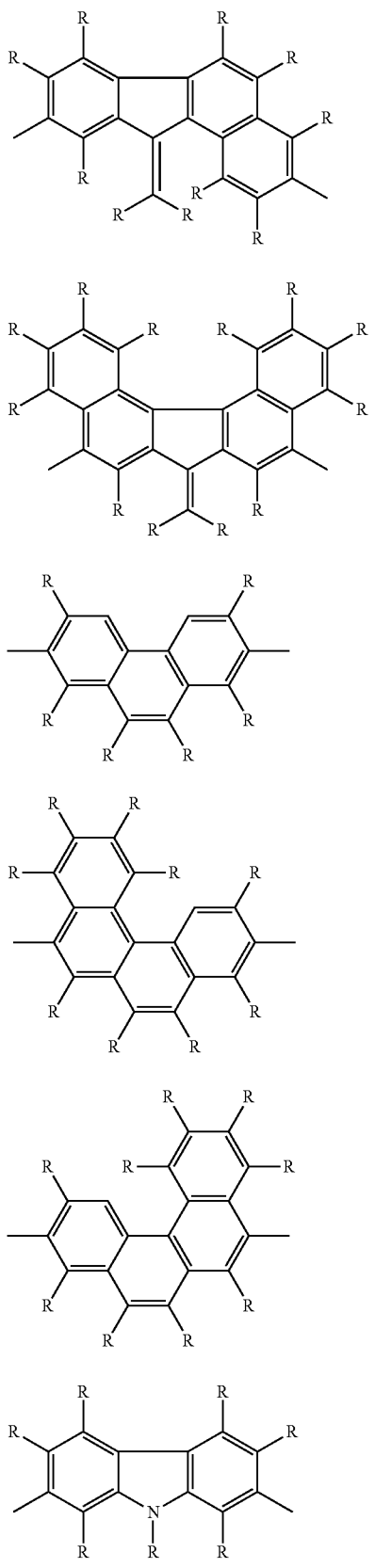
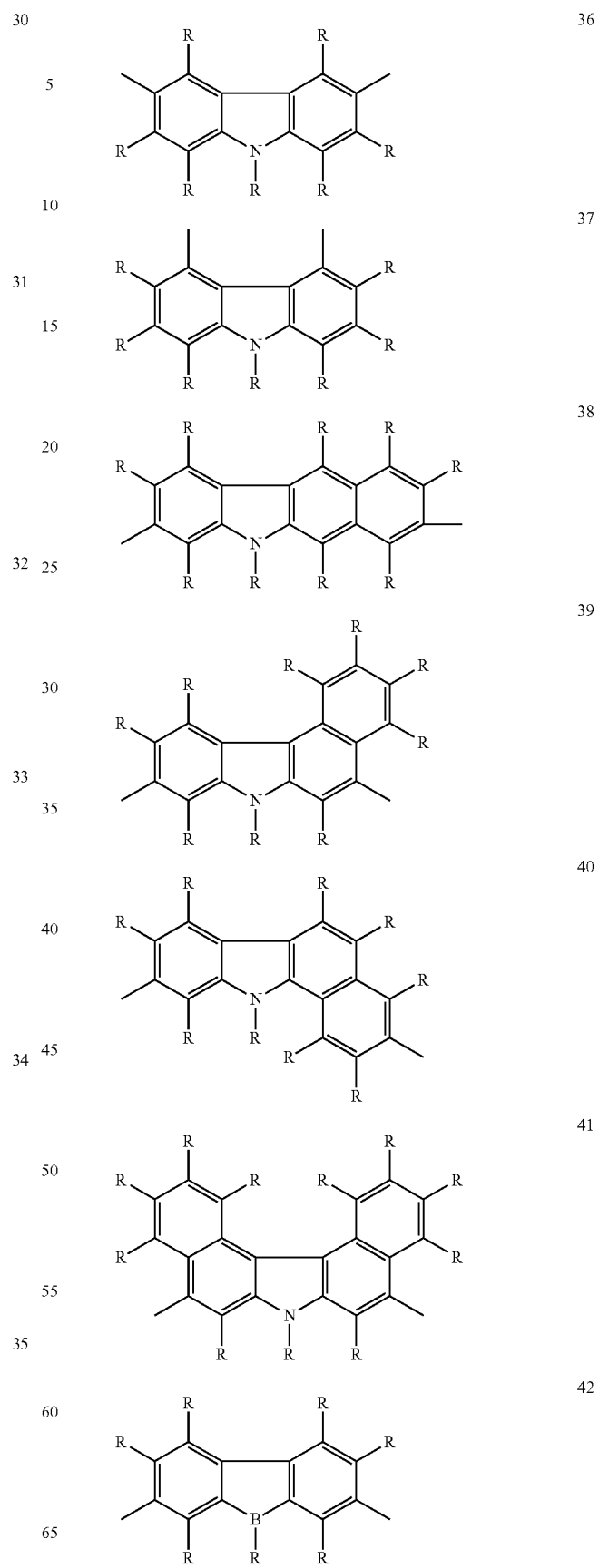

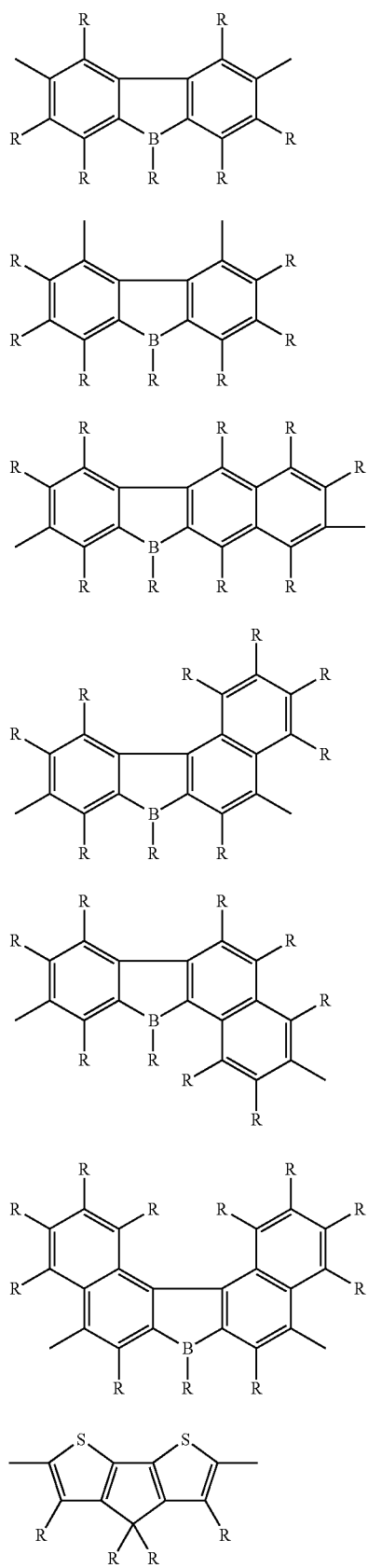
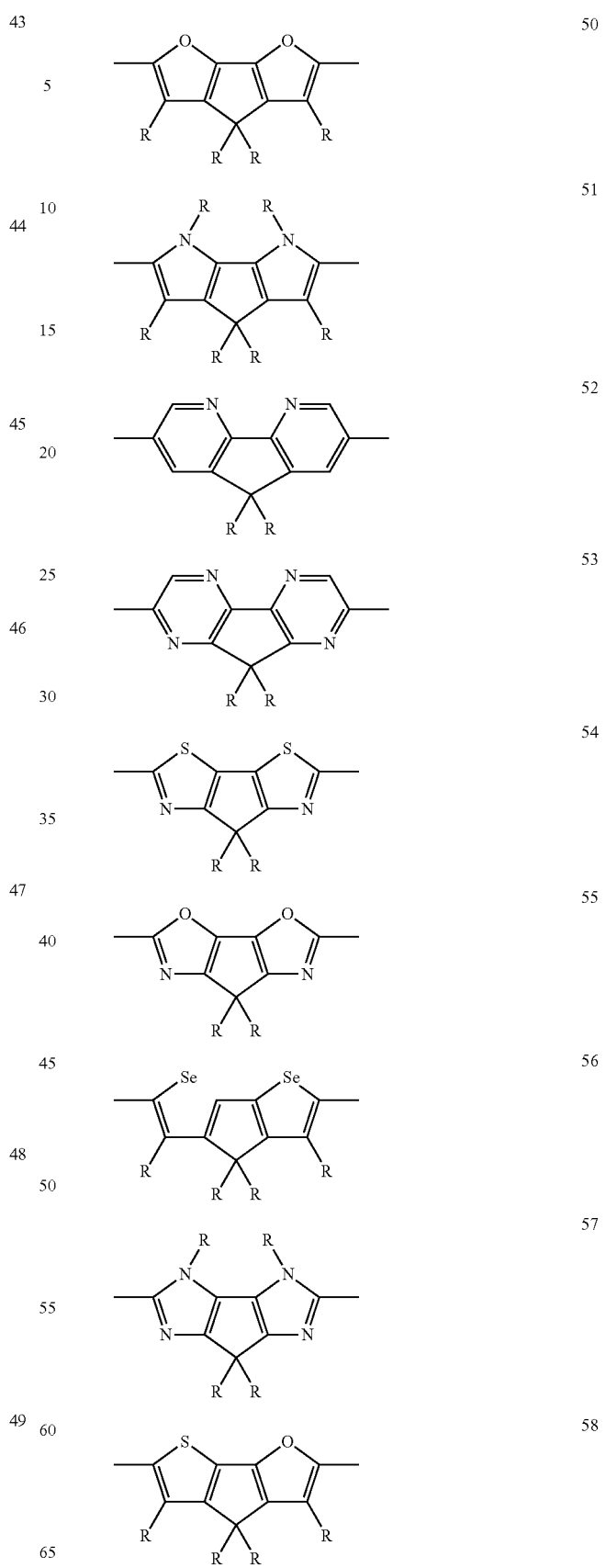

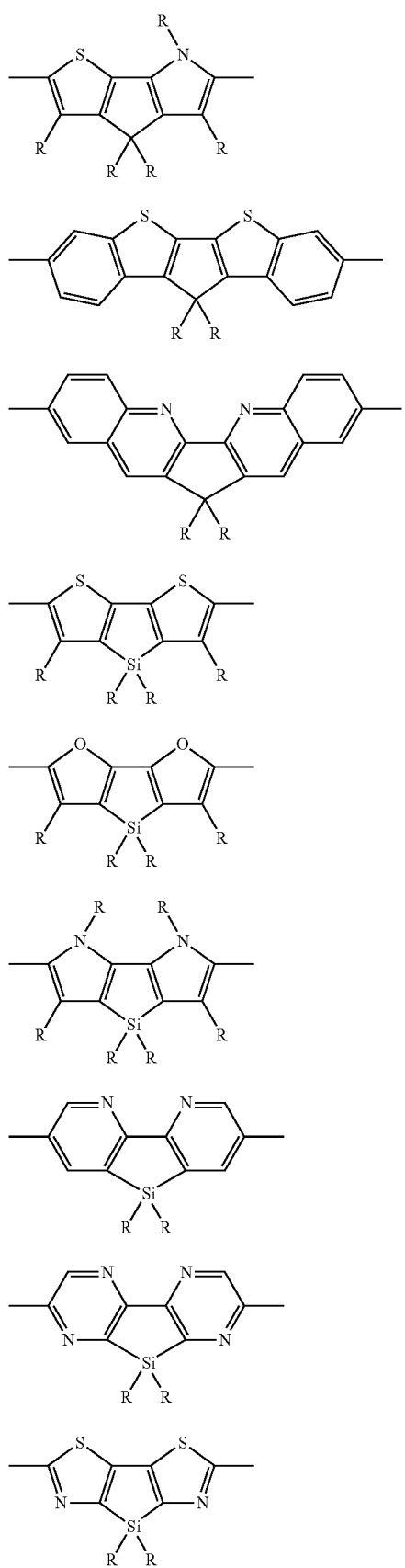
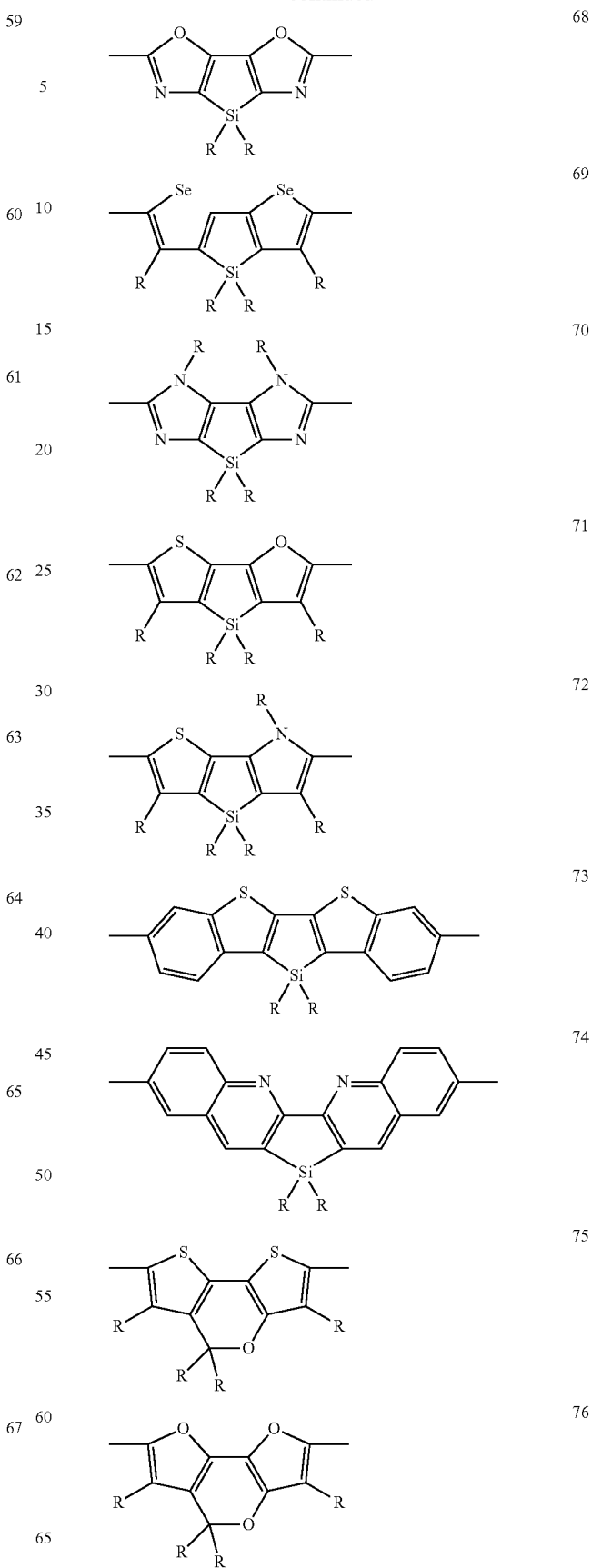

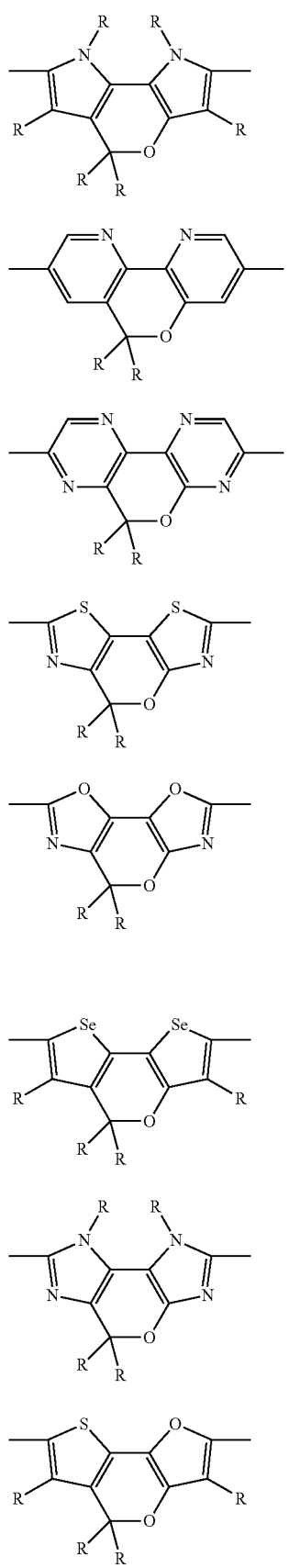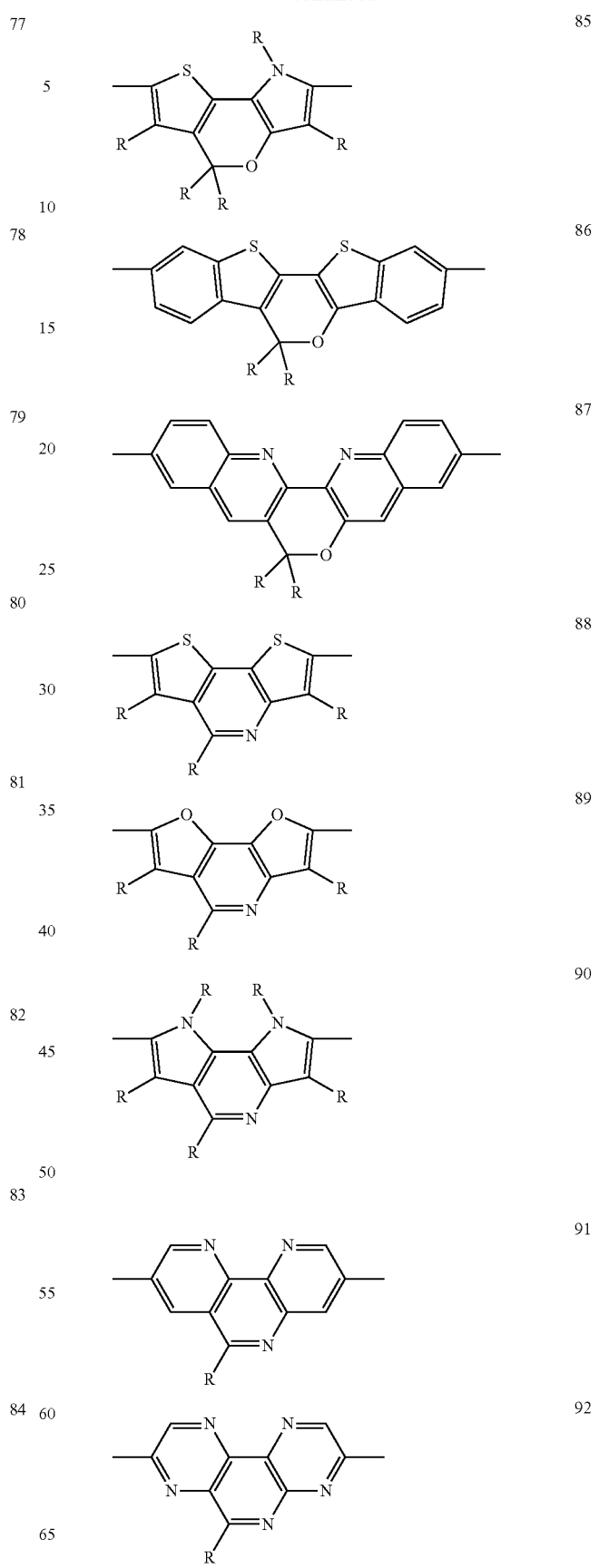

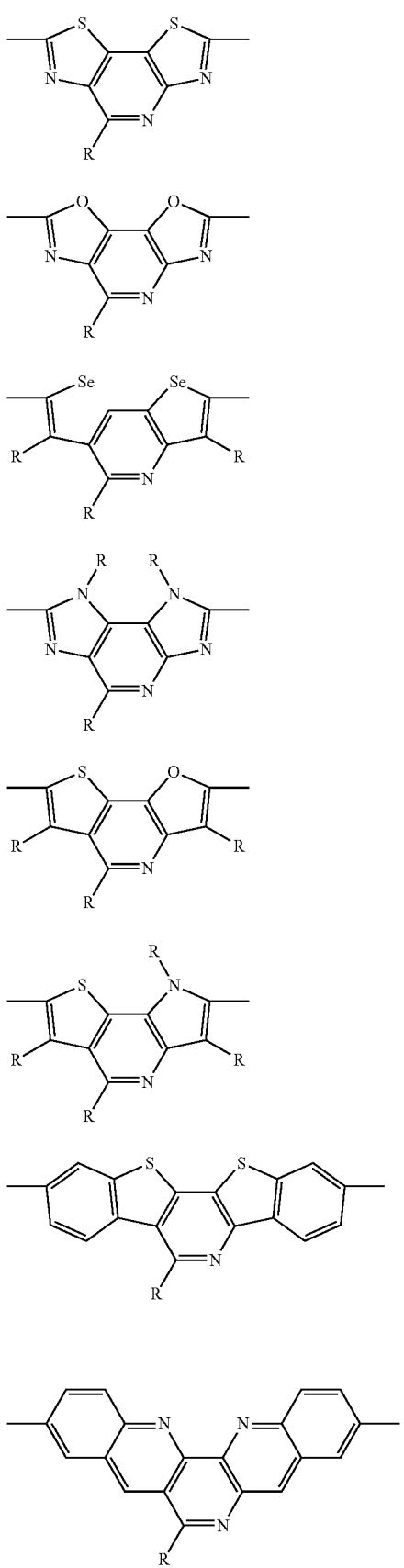
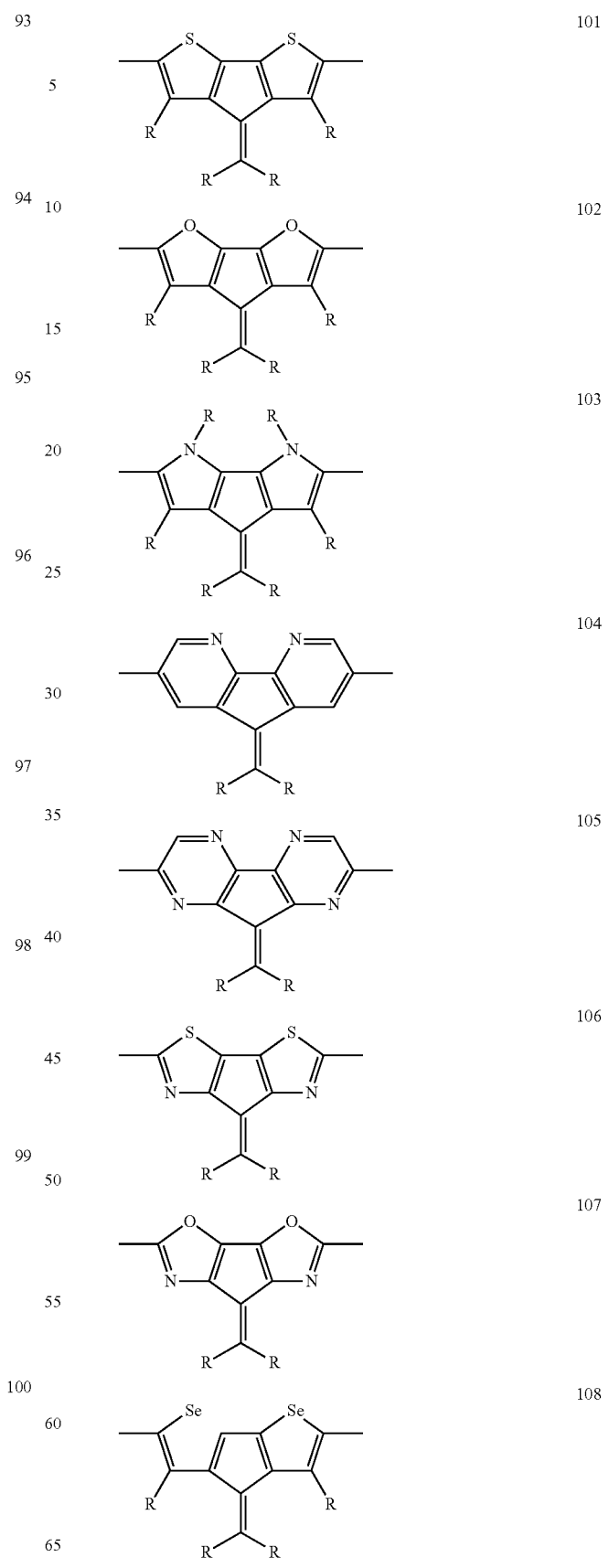

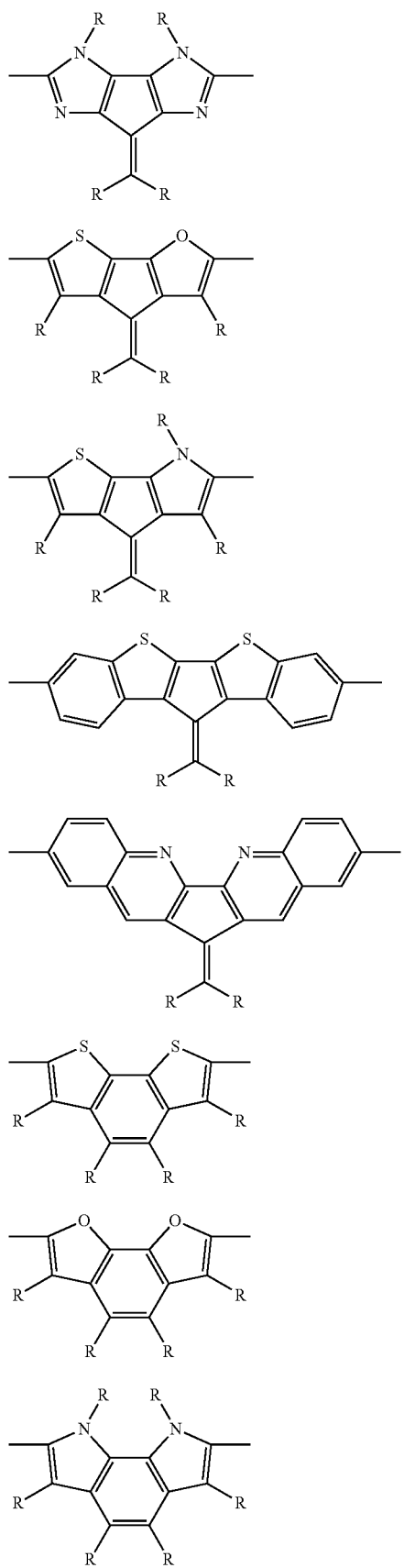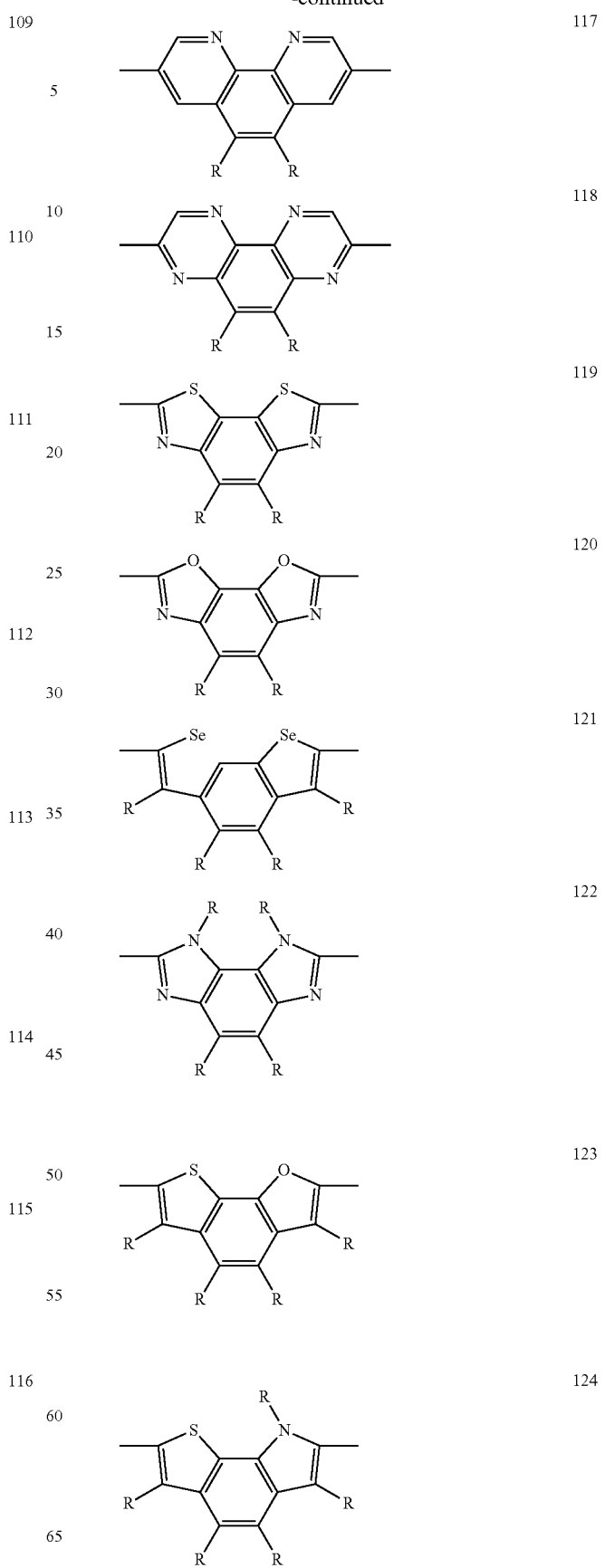

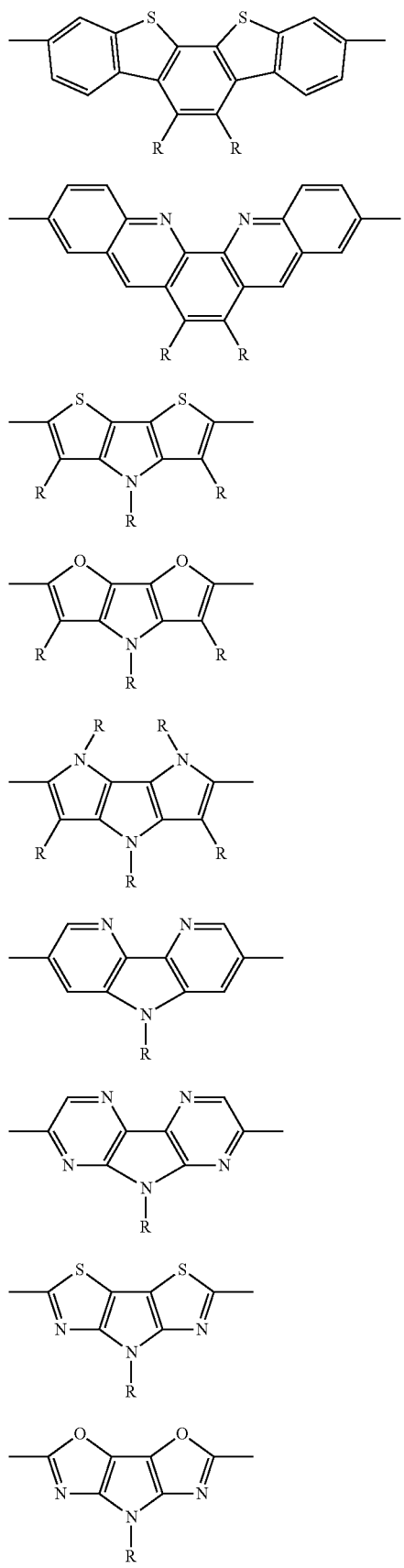
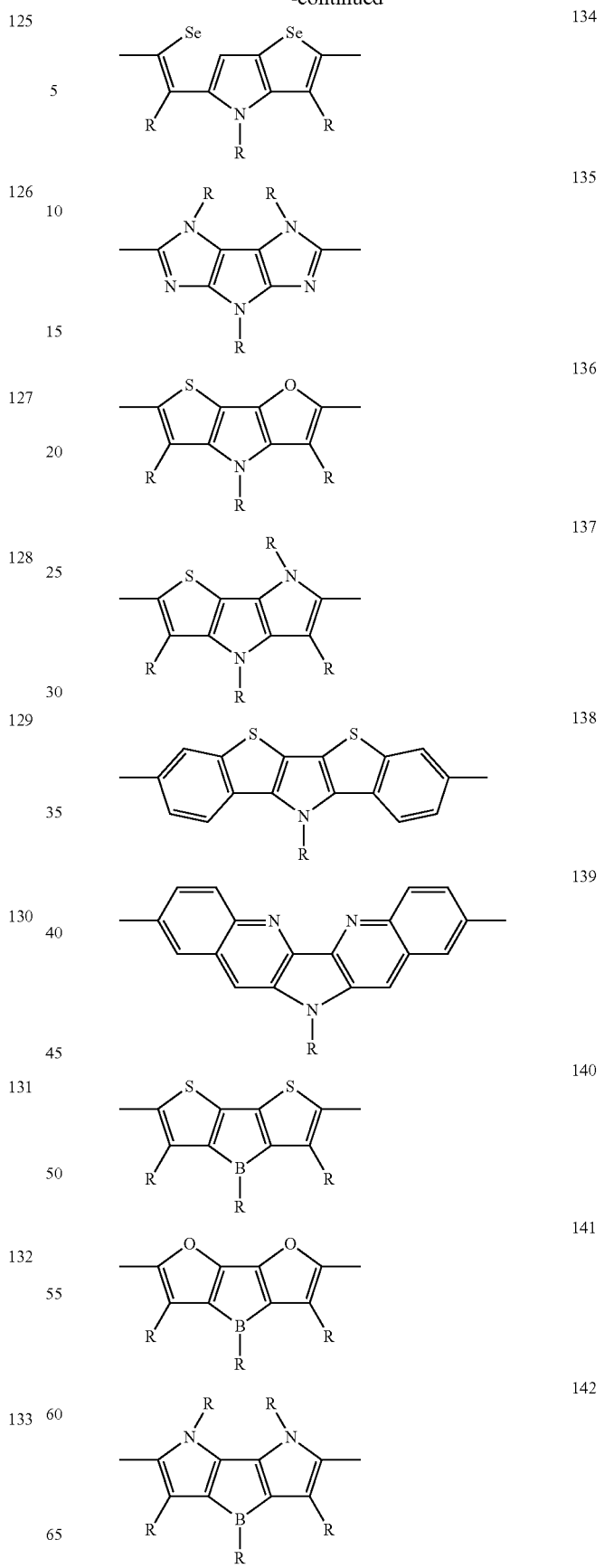

143
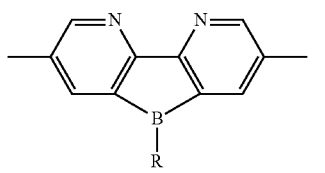
144
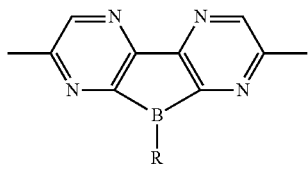
145
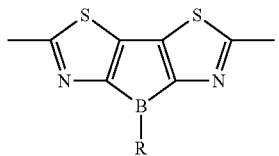
146
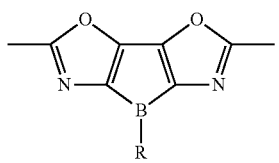
147
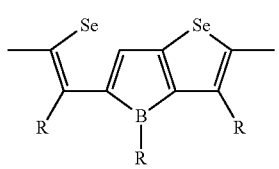
148
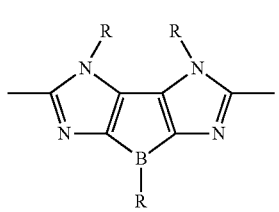
149
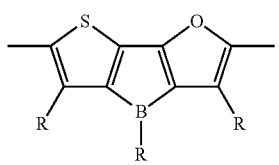
150
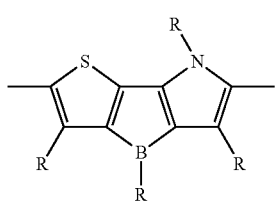
151
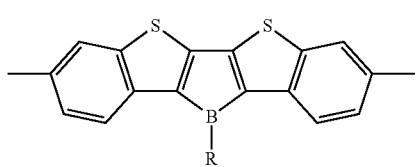
152
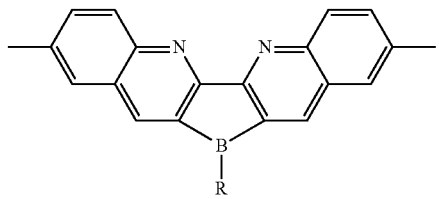
In the formula 1 to the formula 152, R represents the same meaning as described above.
The structural unit represented by the formula (D-3) includes groups represented by the formula 201 to the formula 234.
201
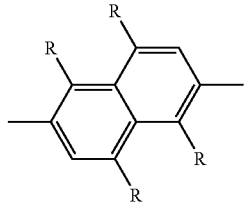
202
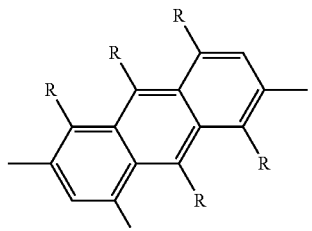
203
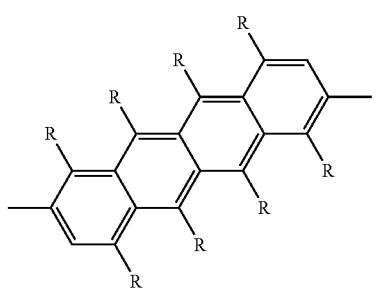
204
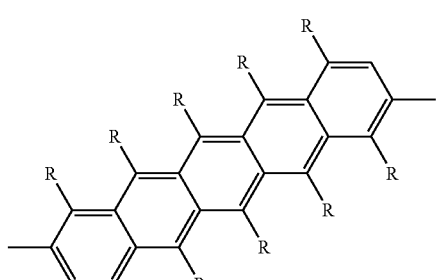

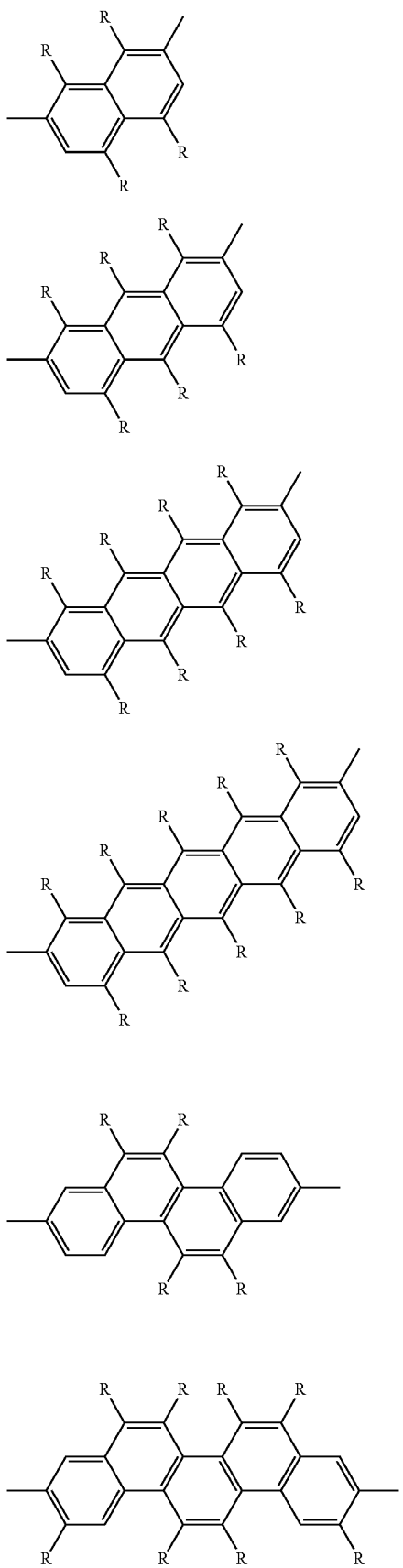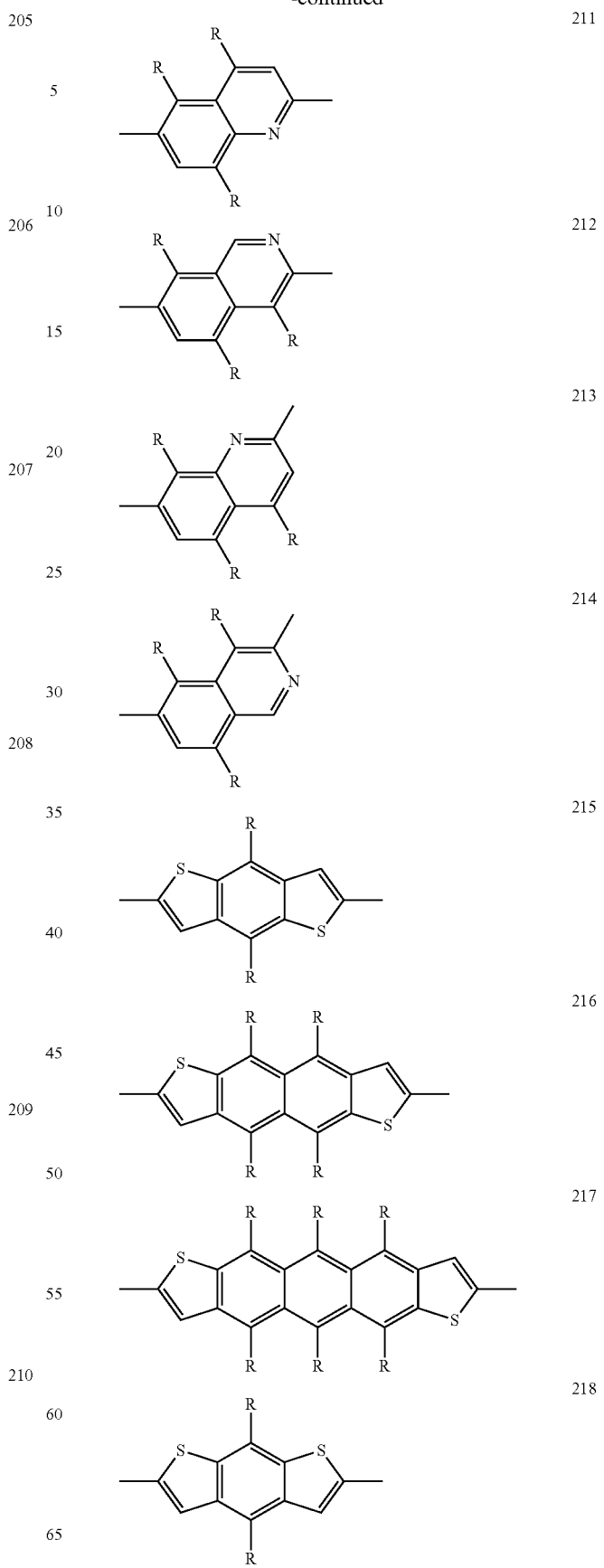

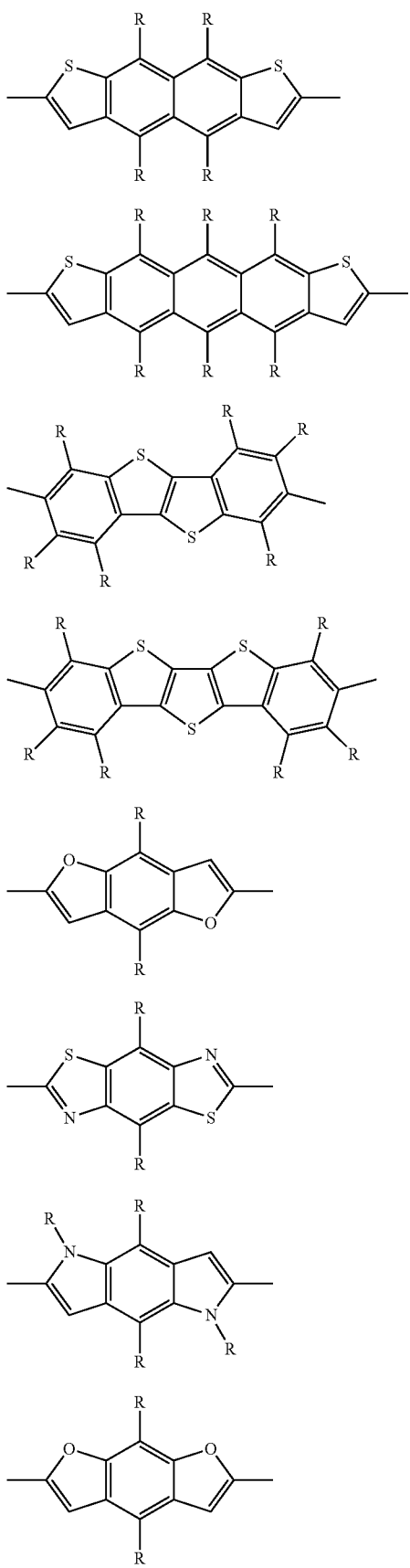
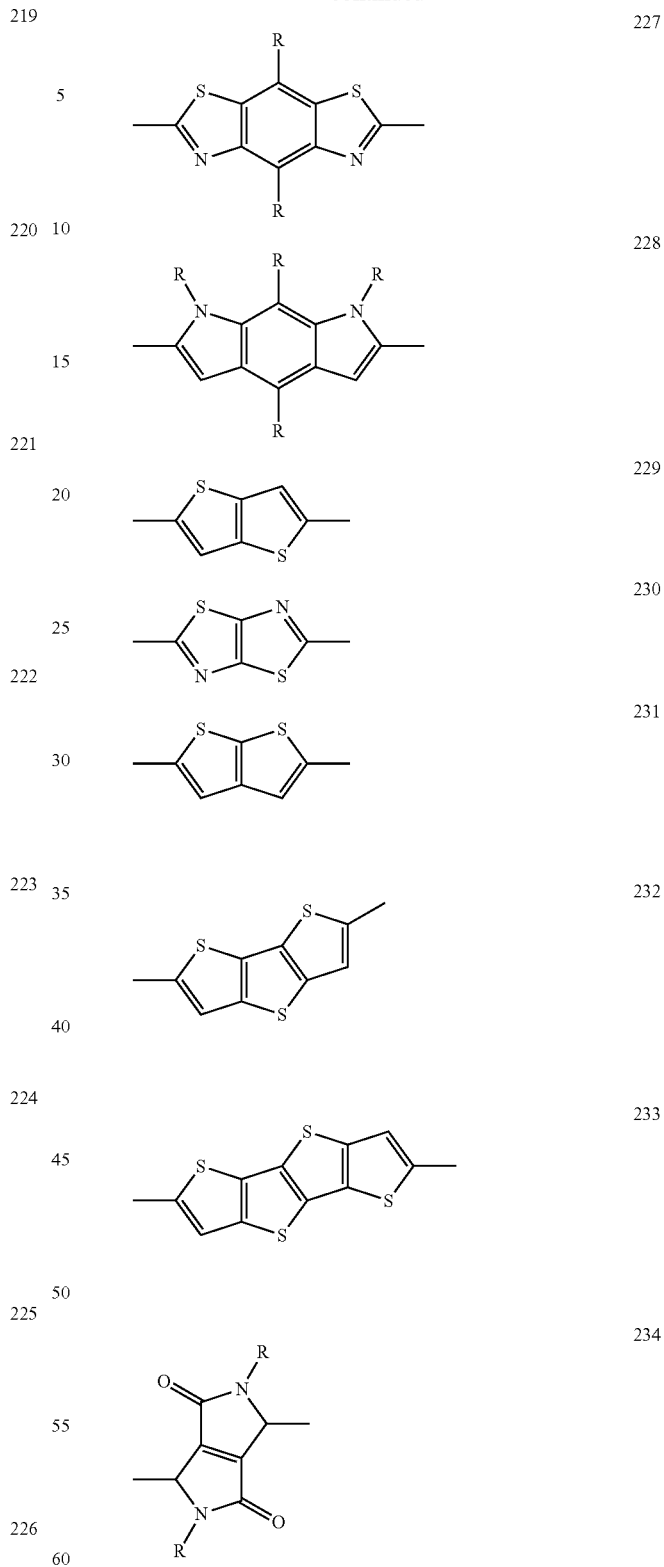
In the formula 201 to the formula 234, R represents the same meaning as described above.
The structural unit represented by the formula (D-4) includes groups represented by the formula 235 to the formula 238.

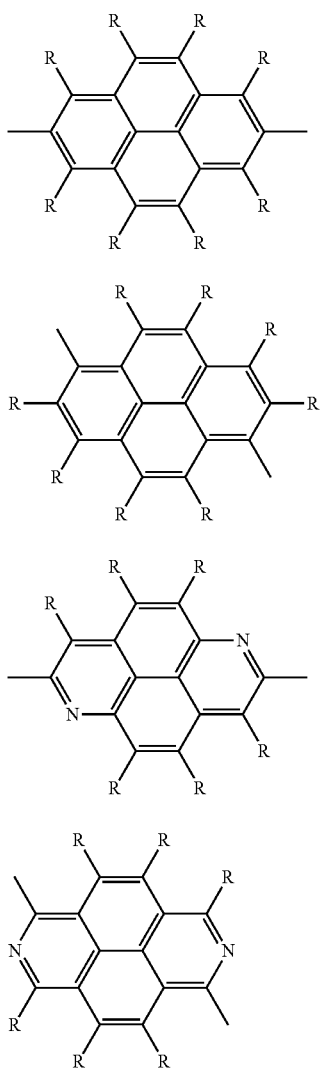
In the formula 235 to the formula 238, R represents the same meaning as described above.
The structural unit represented by the formula (D-5) includes groups represented by the formula 301 to the formula 323.
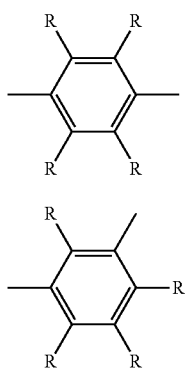
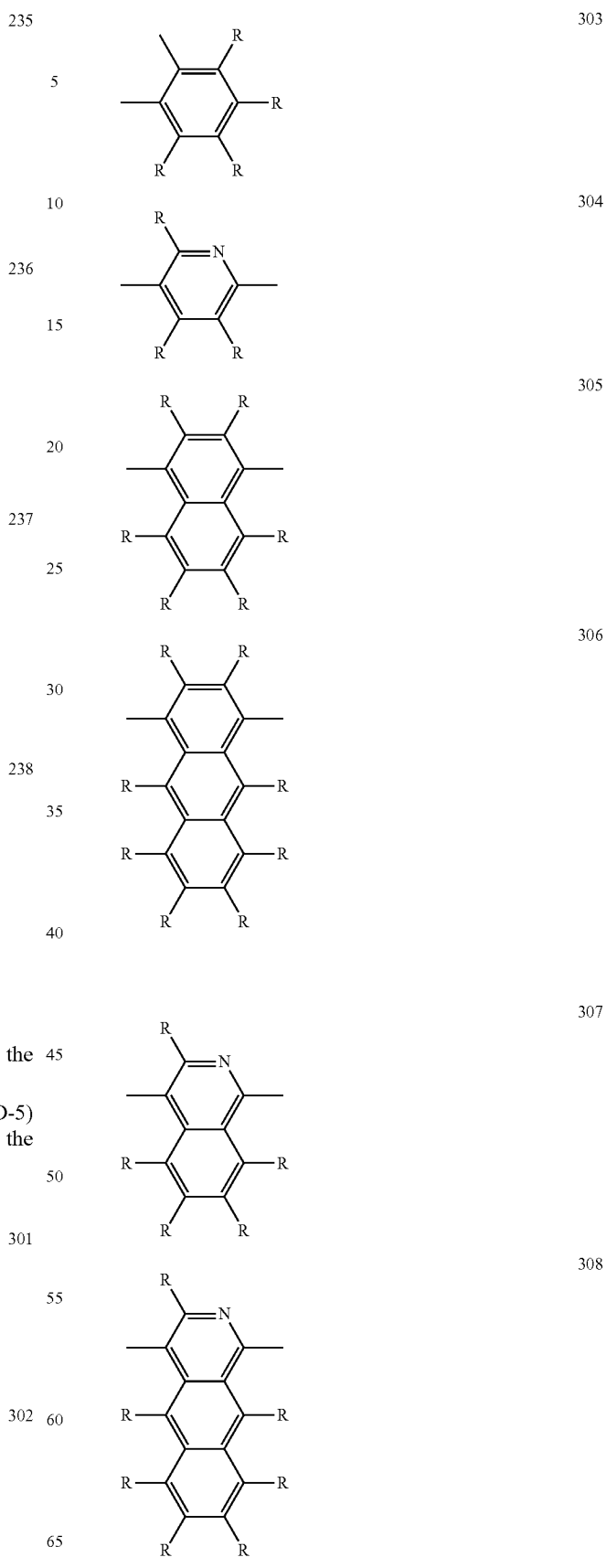

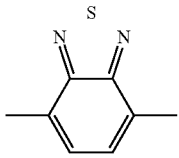 309

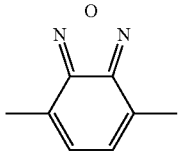 310

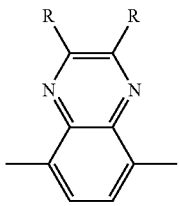 311

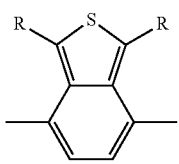 312

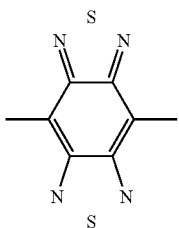 313

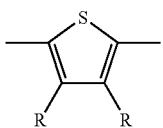 314

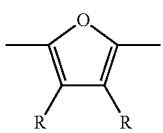 315

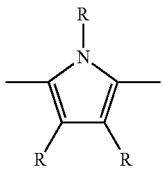 316

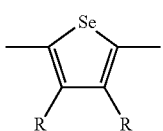 317

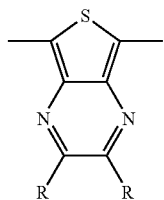 318

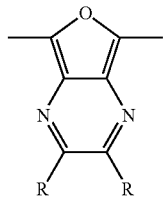 319

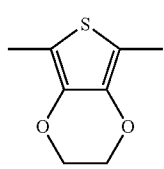 320

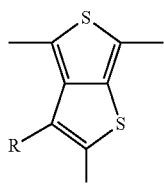 321

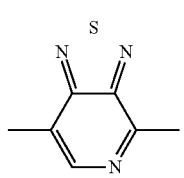 322

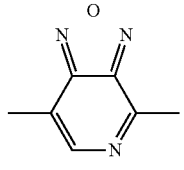 323

In the formula 301 to the formula 323, R represents the same meaning as described above.

When the compound of the present invention is used a material for a photoelectric conversion device, groups represented by the formula 1, the formula 5, the formula 7, the formula 8, the formula 12, the formula 14, the formula 15, the formula 25, the formula 35, the formula 39, the formula 41, the formula 49, the formula 50, the formula 54, the formula 60, the formula 62, the formula 63, the formula 67, the formula 73, the formula 75, the formula 76, the formula 80, the formula 86, the formula 101, the formula 106, the formula 112, the formula 114, the formula 119, the formula 125, the formula 127, the formula 132, the formula 138, the formula 140, the formula 145, the formula 151, the formula 215, the formula 218, the formula 229, the formula 230, the formula 234, the formula 309, the formula 310, the formula 311, the formula 312, the formula 313, the formula 314, the formula 318, the formula 321, the formula 322 and the formula 323 are preferable, groups represented by the formula 1, the formula 8, the formula 15, the formula 25, the formula 35, the formula 49, the formula 62, the formula 75, the formula 101, the formula 114, the formula 127, the formula 140, the formula 215, the formula 234, the formula 309, the formula 310, the formula 311, the formula 314, the formula 321, the formula 322 and the formula 323 are more preferable, groups represented by the formula 75, the formula 309, the formula 314, the formula 322 and the formula 323 are further preferable, a group represented by the formula 75 is further more preferable, among groups represented by the formula 1 to the formula 152, the formula 201 to the formula 238 and the formula 301 to the formula 323, from the standpoint of enhancing photoelectric conversion efficiency.

When the compound of the present invention is used in an organic film transistor, groups represented by the formula 1, the formula 8, the formula 25, the formula 35, the formula 49, the formula 54, the formula 62, the formula 67, the formula 75, the formula 80, the formula 101, the formula 114, the formula 201, the formula 202, the formula 203, the formula 204, the formula 205, the formula 206, the formula 207, the formula 208, the formula 209, the formula 210, the formula 215, the formula 216, the formula 217, the formula 218, the formula 219, the formula 220, the formula 221, the formula 222, the formula 229, the formula 230, the formula 231, the formula 232, the formula 233, the formula 235, the formula 236, the formula 237, the formula 238, the formula 309, the formula 310, the formula 311, the formula 312, the formula 313, the formula 314, the formula 318, the formula 319, the formula 322 and the formula 323 are preferable, groups represented by the formula 25, the formula 75, the formula 80, the formula 114, the formula 203, the formula 204, the formula 207, the formula 208, the formula 215, the formula 216, the formula 217, the formula 218, the formula 219, the formula 220, the formula 232, the formula 233, the formula 235, the formula 236, the formula 309, the formula 314 and the formula 322 are more preferable, groups represented by the formula 75, the formula 114, the formula 204, the formula 208, the formula 215, the formula 216, the formula 217, the formula 232, the formula 236, the formula 309 and the formula 314 are further preferable, a group represented by the formula 75 is further more preferable, among groups represented by the formula 1 to the formula 152, the formula 201 to the formula 238 and the formula 301 to the formula 323, from the standpoint of enhancing hole migration.

The compound of the present invention may have a group formed by linking two or more structural units represented by the formula (D-1) to the formula (D-5). This group includes, for example, groups represented by the formula 401 to the formula 414.

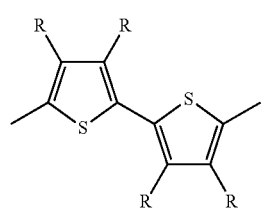
401

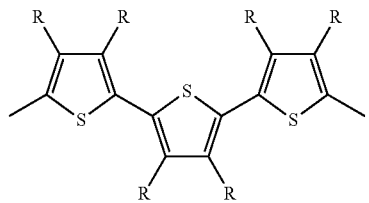
402

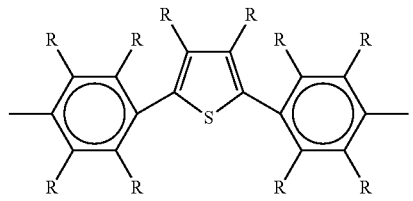
403

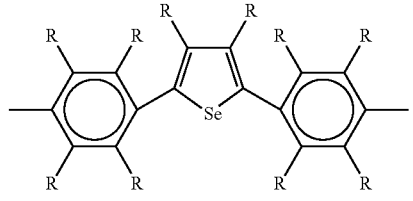
404

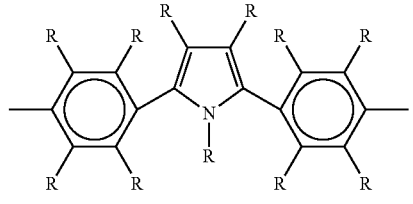
405

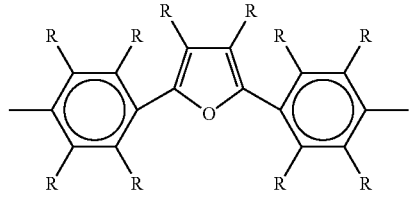
406

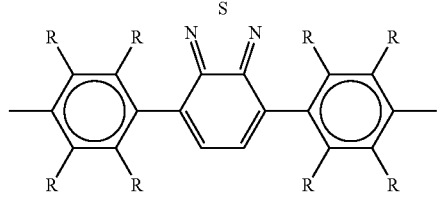
407

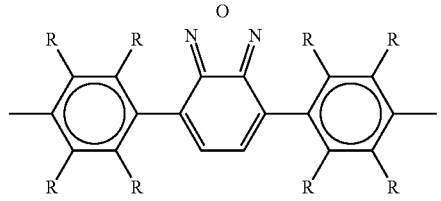
408

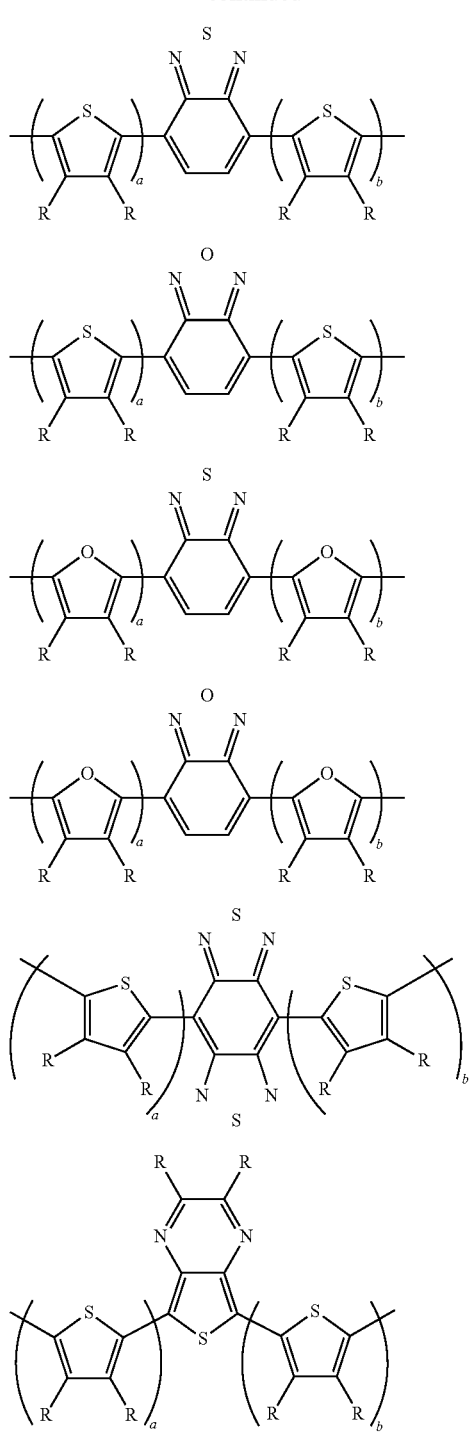

409
410
411
412
413
414

In the formula 401 to the formula 414, a and b are the same or mutually different, and represent an integer of 1 to 5, preferably 1 to 3, more preferably 1. In the formula 401 to the formula 414, R represents the same meaning as described above.

When the compound of the present invention is used as a material for a photoelectric conversion device, groups represented by the formula 401, the formula 402, the formula 409, the formula 410, the formula 411, the formula 412, the formula 413 and the formula 414 are preferable, groups represented by the formula 401, the formula 409, the for- mula 413 and the formula 414 are more preferable, groups represented by the formula 401 and the formula 409 are further preferable, among groups represented by the formula 401 to the formula 414, from the standpoint of enhancing photoelectric conversion efficiency.

Regarding the ratio of the number of the structural unit represented by the formula (1) and the number of the structural unit represented by the formula (2) in the compound of the present invention, the numerical value of P represented by the following formula is preferably 0.1 to 0.9, more preferably 0.2 to 0.8, further preferably 0.4 to 0.8, particularly preferably 0.5 to 0.8, from the standpoint of enhancing photoelectric conversion efficiency, when the compound of the present invention is used as a material for a photoelectric conversion device.

When the molecular weight of a compound obtained by linking a hydrogen atom to both of two connecting bonds of the structural unit represented by the formula (1) is larger than the molecular weight of a compound obtained by linking a hydrogen atom to both of two connecting bonds of the structural unit represented by the formula (2), P is represented by the following formula.

P=(the number of the structural unit represented by the formula (1))/{(the number of the structural unit represented by the formula (1)))+(the number of the structural unit represented by the formula (2))}

Regarding the sum of the number of the structural unit represented by the formula (1) and the number of the structural unit represented by the formula (2) in the compound of the present invention and the ratio of the number of the structural unit represented by the formula (3), the numerical value of S represented by the following formula is preferably 0.10 to 0.80, more preferably 0.15 to 0.60, further preferably 0.20 to 0.50, from the standpoint of enhancing the solubility of the compound of the present invention in a solvent, when the compound of the present invention has the structural unit represented by the formula (3).

S={(the number of the structural unit represented by the formula (1))+(the number of the structural unit represented by the formula (2))}/{(the number of the structural unit represented by the formula (1)))+(the number of the structural unit represented by the formula (2))+(the number of the structural unit represented by the formula (3))}

It is preferable that the compound of the present invention is a polymer compound, from the standpoint of enhancing photoelectric conversion efficiency.

The polymer compound in the present invention denotes a compound having a polystyrene-equivalent number-average molecular weight of 1000 or more measure by gel permeation chromatography (hereinafter, referred to as GPC in some cases). The polystyrene-equivalent number-average molecular weight of the polymer compound of the present invention is preferably 2000 to 1000000, more preferably 2500 to 1000000, further preferably 3000 to 100000.

It may be permissible that at least one structural unit represented by the formula (1) is contained in the polymer compound of the present invention. The number of the structural unit to be contained is preferably 2 or more on average per one polymer chain, more preferably 3 or more on average per one polymer chain, in the polymer compound.

It may be permissible that at least one structural unit represented by the formula (2) is contained in the polymer compound of the present invention. The number of the structural unit to be contained is preferably 2 or more on average per one polymer chain, more preferably 3 or more on average per one polymer chain, in the polymer compound.

The polymer compound of the present invention is preferably a n-conjugated polymer compound. The n-conjugated polymer compound denotes a polymer compound in which multiple bonds exist sandwiching one single bond, in the main chain.

One preferable embodiment of the compound of the present invention is a compound having a structural unit represented by the formula (1) ($Y^1$ is a sulfur atom) and a structural unit represented by the formula (2) ($Y^2$ is an oxygen atom).

In this case, P' defined by the following formula is preferably 0.1 to 0.9, more preferably 0.2 to 0.8, further preferably 0.4 to 0.8, particularly preferably 0.5 to 0.8.

> P'=(the number of the structural unit represented by the formula (1) ($Y^1$ is a sulfur atom))/{(the number of the structural unit represented by the formula (1) ($Y^1$ is a sulfur atom)))+(the number of the structural unit represented by the formula (2) ($Y^2$ is an oxygen atom))}

This compound may further contain a structural unit represented by the formula (3) described above.

The definition and specific examples of the structural unit represented by the formula (3) described above are as explained above.

In this case, S' defined by the following formula is preferably 0.10 to 0.80, more preferably 0.15 to 0.60, further preferably 0.20 to 0.50.

> S'={(the number of the structural unit represented by the formula (1) ($Y^1$ is a sulfur atom))+(the number of the structural unit represented by the formula (2) ($Y^2$ is an oxygen atom))}/{(the number of the structural unit represented by the formula (1) ($Y^1$ is a sulfur atom)))+(the number of the structural unit represented by the formula (2) ($Y^2$ is an oxygen atom))+(the number of the structural unit represented by the formula (3))}

It is desirable that the solubility of the compound of the present invention in a solvent is high, when used in a device, from the standpoint of easiness of fabrication of the device. Specifically, it is preferable that the compound of the present invention has solubility by which a solution containing the compound in an amount of 0.01 wt % or more can be produced, it is more preferable that it has solubility by which a solution containing the compound in an amount of 0.1 wt % or more can be produced, it is further preferable that it has solubility by which a solution containing the compound in an amount of 0.4 wt % or more can be produced.

Thought the method of producing the compound of the present invention is not particularly restricted, preferable are methods using the Suzuki coupling reaction and the Stille coupling reaction, from the standpoint of easiness of synthesis of the compound.

The method of using the Suzuki coupling reaction includes, for example, a production method having a step of reacting at least one compound represented by the formula (100):

(wherein $E^1$ represents a divalent group containing an aromatic ring. $Q^{100}$ and $Q^{200}$ are the same or mutually different, and represent a dihydroxyboryl group [—B(OH)$_2$] or a borate residue.) and at least one compound represented by the formula (200):

(wherein $E^2$ represents a structural unit represented by the formula (1). $T^1$ and $T^2$ are the same or mutually different, and represent a halogen atom or a sulfonic acid residue.) in the presence of a palladium catalyst and a base. $E^1$ is preferably an arylene group or a heteroarylene group, and further preferably, includes groups represented by the formula 1 to the formula 255 described above.

In this case, it is preferable that the total number of moles of one or more compounds represented by the formula (200) used in the reaction is excess over the total number of moles of one or more compounds represented by the formula (100). When the total number of moles of one or more compounds represented by the formula (200) used in the reaction is 1 mol, the total number of moles of one or more compounds represented by the formula (100) is preferably 0.6 to 0.99 mol, further preferably 0.7 to 0.95 mol.

The borate residue means a group obtained by removing a hydroxyl group from a boric acid diester, and includes a dialkyl ester residue, a diaryl ester residue, a di(arylalkyl) ester residue and the like. As specific examples of the borate residue, groups represented by the following formulae are exemplified.

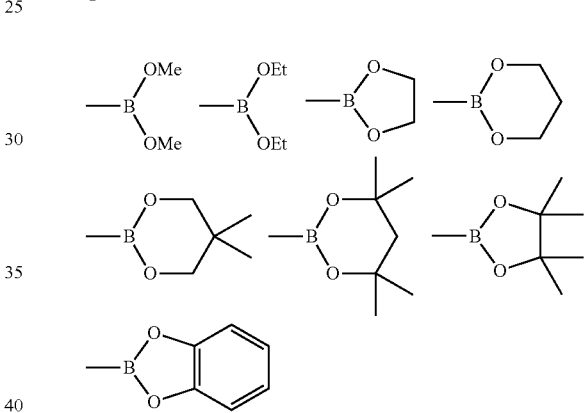

(wherein Me represents a methyl group and Et represents an ethyl group.).

The halogen atom represented by $T^1$ and $T^2$ in the formula (200) includes a fluorine atom, a chlorine atom, a bromine atom and an iodine atom. From the standpoint of easiness of synthesis of the polymer compound, a bromine atom and an iodine atom are preferable, a bromine atom is further preferable.

The sulfonic acid residue represented by $T^1$ and $T^2$ in the formula (200) denotes an atomic group obtained by removing an acidic hydrogen from sulfonic acid (—SO$_3$H), and specific examples thereof include alkyl sulfonate groups (for example, a methane sulfonate group, an ethane sulfonate group), aryl sulfonate groups (for example, a benzene sulfonate group, a p-toluene sulfonate group), arylalkyl sulfonate groups (for example, a benzyl sulfonate group) and a trifluoromethane sulfonate group.

The method of conducting the Suzuki coupling reaction includes, specifically, a method of reacting in the presence of a base using a palladium catalyst as the catalyst in any solvent.

The palladium catalyst used in the Suzuki coupling reaction includes, for example, Pd(0) catalyst and Pd(II) catalyst, specifically, palladium[tetrakis(triphenylphosphine)], palladium acetates, dichlorobis(triphenylphosphine) palladium, palladium acetate, tris(dibenzylideneacetone)dipalladium, bis(dibenzylideneacetone)palladium, and from the standpoint of easiness of the reaction (polymerization) operation and the reaction (polymerization) speed, preferable are dichlorobis(triphenylphosphine)palladium, palladium acetate and tris(dibenzylideneacetone)dipalladium.

The addition amount of the palladium catalyst is not particularly restricted, and amounts effective as the catalyst are permissible, and the amount with respect to 1 mol of a compound represented by the formula (100) is usually 0.0001 mol to 0.5 mol, preferably 0.0003 mol to 0.1 mol.

When palladium acetates are used as the palladium catalyst to be used in the Suzuki coupling reaction, for example, phosphorus compounds such as triphenylphosphine, tri(o-tolyl)phosphine, tri(o-methoxyphenyl)phosphine and the like can be added as a ligand. In this case, the addition amount of a ligand is usually 0.5 mol to 100 mol, preferably 0.9 mol to 20 mol, further preferably 1 mol to 10 mol with respect to 1 mol of the palladium catalyst.

The base to be used in the Suzuki coupling reaction includes inorganic bases, organic bases, inorganic salts and the like. The inorganic base includes, for example, potassium carbonate, sodium carbonate and barium hydroxide. The organic base includes, for example, triethylamine and tributylamine. The inorganic salt includes, for example, cesium fluoride.

The addition amount of the base is usually 0.5 mol to 100 mol, preferably 0.9 mol to 20 mol, further preferably 1 mol to 10 mol with respect to 1 mol of a compound represented by the formula (100).

The Suzuki coupling reaction is usually carried out in a solvent. As the solvent, exemplified are N,N-dimethylformamide, toluene, dimethoxyethane and tetrahydrofuran. From the standpoint of the solubility of the polymer compound used in the present invention, toluene and tetrahydrofuran are preferable. It may be permissible that an aqueous solution of a base is added, and the reaction is performed in a two-phase system. When an inorganic salt is used as the base, it is usual that an aqueous solution of a base is added and the reaction is performed, from the standpoint of the solubility of the inorganic salt.

When an aqueous solution of a base is added and the reaction is performed in a two-phase system, a phase transfer catalyst such as quaternary ammonium salts and the like may be added, if required.

The temperature for conducting the Suzuki coupling reaction is usually about 50 to 160° C., depending on the above-described solvent, and the temperature is preferably 60 to 120° C., from the standpoint of increasing the molecular weight of the polymer compound. It may also be permissible that the temperature is raised up close to the boiling point of a solvent and reflux is performed. Though the time when the intended degree of polymerization is attained is defined as the end point, the reaction time is usually about 0.1 hour to 200 hours. The reaction times around 1 hour to 30 hours are efficient and preferable.

The Suzuki coupling reaction is conducted in a reaction system not deactivating a Pd(0) catalyst, under an inert atmosphere such as an argon gas, a nitrogen gas and the like. It is conducted, for example, in a system sufficiently deaerated with an argon gas, a nitrogen gas and the like. Specifically, an atmosphere in a polymerization vessel (reaction system) is deaerated by sufficiently purging with a nitrogen gas, then, a compound represented by the formula (100), a compound represented by the formula (200) and dichlorobis(triphenylphosphine)palladium(II) are charged into this polymerization vessel, further, an atmosphere in the polymerization vessel is deaerated by sufficiently purging with a nitrogen gas, then, a solvent deaerated by previously bubbling with a nitrogen gas, for example, toluene, is added, then, a base deaerated by previously bubbling with a nitrogen gas, for example, a sodium carbonate aqueous solution, is dropped into this solution, then, the solution is heated and the temperature is raised, for example, up to the reflux temperature, and polymerization is carried out at this reflux temperature for 8 hours while keeping an inert atmosphere.

The method of using the Stille coupling reaction includes, for example, a production method having a step of reacting at least one compound represented by the formula (300):

$$Q^{300}\text{-}E^3\text{-}Q^{400} \quad (300)$$

(wherein $E^3$ represents a divalent group containing an aromatic ring. $Q^{300}$ and $Q^{400}$ are the same or mutually different, and represent a substituted stannyl group.).

and at least one compound represented by the formula (200) described above in the presence of a palladium catalyst. $E^3$ is preferably an arylene group or a heteroarylene group, and further preferably, includes groups represented by the formula 1 to the formula 255 described above.

The substituted stannyl group includes a group represented by $-\mathrm{SnR}^{100}_3$ and the like. Here, $R^{100}$ represents a monovalent organic group. The monovalent organic group includes an alkyl group, a cycloalkyl group, an aryl group and the like.

The number of carbon atoms of the alkyl group is usually 1 to 30, and specific examples thereof include a methyl group, an ethyl group, a n-propyl group, an isopropyl group, a n-butyl group, an isobutyl group, a sec-butyl group, a tert-butyl group, a n-pentyl group, an isopentyl group, a 2-methylbutyl group, a 1-methylbutyl group, a n-hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group, an eicosyl group and the like. The number of carbon atoms of the cycloalkyl group is usually 3 to 30, and specific examples thereof include a cyclopentyl group, a cyclohexyl group, an adamantyl group and the like. The aryl group includes a phenyl group, a naphthyl group and the like. The substituted stannyl group includes preferably $-\mathrm{SnMe}_3$, $-\mathrm{SnEt}_3$, $-\mathrm{SnBu}_3$ and $-\mathrm{SnPh}_3$, further preferably $-\mathrm{SnMe}_3$, $-\mathrm{SnEt}_3$ and $-\mathrm{SnBu}_3$. In the above-described preferable examples, Me represents a methyl group, Et represents an ethyl group, Bu represents a butyl group and Ph represents a phenyl group.

Specific examples thereof include a method of reacting in any solvent in the presence of, for example, a palladium catalyst as the catalyst.

The palladium catalyst used in the Stille coupling reaction includes, for example, Pd(0) catalysts and Pd(II) catalysts. Specifically, palladium[tetrakis(triphenylphosphine)], palladium acetates, dichlorobis(triphenylphosphine) palladium, palladium acetate, tris(dibenzylideneacetone)dipalladium and bis(dibenzylideneacetone)palladium are mentioned, and from the standpoint of easiness of the reaction (polymerization) operation and the reaction (polymerization) speed, preferable are palladium[tetrakis(triphenylphosphine)] and tris(dibenzylideneacetone)dipalladium.

The addition amount of the palladium catalyst used in the Stille coupling reaction is not particularly restricted, and amounts effective as the catalyst are permissible, and the amount with respect to 1 mol of a compound represented by the formula (100) is usually 0.0001 mol to 0.5 mol, preferably 0.0003 mol to 0.2 mol.

In the Stille coupling reaction, a ligand and a co-catalyst can also be used, if necessary. The ligand includes, for example, phosphorus compounds such as triphenylphosphine, tri(o-tolyl)phosphine (namely, tris(2-toluyl)phosphine), tri(o-methoxyphenyl)phosphine, tris(2-furyl)phosphine and the like, and arsenic compounds such as triphenylarsine, triphenoxyarsine and the like. The co-catalyst includes copper iodide, copper bromide, copper chloride, copper(I) 2-thenoate and the like.

In the case of use of a ligand or a co-catalyst, the addition amount of a ligand or a co-catalyst is usually 0.5 mol to 100 mol, preferably 0.9 mol to 20 mol, further preferably 1 mol to 10 mol with respect to 1 mol of a palladium catalyst.

The Stille coupling reaction is usually conducted in a solvent. The solvent includes N,N-dimethylformamide, N,N-dimethylacetamide, toluene, dimethoxyethane, tetrahydrofuran and the like. From the standpoint of the solubility of the polymer compound used in the present invention, toluene and tetrahydrofuran are preferable.

The temperature for conducting the Stille coupling reaction is usually about 50 to 160° C., depending on the solvent described above, however, from the standpoint of increasing the molecular weight of the compound, it is preferably 60 to 120° C. It may also be permissible that the temperature is raised up close to the boiling point of a solvent and reflux is performed.

Though the time when the intended degree of polymerization is attained is defined as the end point, the time for effecting the above-described reaction (reaction time) is usually about 0.1 hour to 200 hours. The reaction times around 1 hour to 30 hours are efficient and preferable.

The Stille coupling reaction is conducted in a reaction system not deactivating a Pd catalyst, under an inert atmosphere such as an argon gas, a nitrogen gas and the like. It is conducted, for example, in a system sufficiently deaerated with an argon gas, a nitrogen gas and the like. Specifically, an atmosphere in a polymerization vessel (reaction system) is deaerated by sufficiently purging with a nitrogen gas, then, a compound represented by the formula (300), a compound represented by the formula (200) and a palladium catalyst are charged into this polymerization vessel, further, an atmosphere in the polymerization vessel is deaerated by sufficiently purging with a nitrogen gas, then, a solvent deaerated by previously bubbling with a nitrogen gas, for example, toluene, is added, then, if necessary, a ligand and a co-catalyst are added, and thereafter, the solution is heated and the temperature is raised, for example, up to the reflux temperature, and polymerization is carried out at this reflux temperature for 8 hours while keeping an inert atmosphere.

When the end group of the compound of the present invention has a polymerization active group as represented by $Q^{100}$ to $Q^{400}$, $T^1$ and $T^2$, the polymerization active group may be protected with a stable group. When the polymerization active group on the end group of the compound of the present invention is protected with a stable group, the property and life of a device using the compound of the present invention are not easily deteriorated. The stable group is preferably a group having a conjugated bond consecutive to the conjugated structure of the main chain. The stable group may also have a structure linking to an aryl group or a heterocyclic group via a vinylene group. The stable group includes a phenyl group having no substituent, a naphthyl group, a methyl group, an ethyl group, a propyl group, a butyl group, a trifluoromethyl group, a pentafluoroethyl group and the like.

It is preferable that the amount of metal elements contained in the compound of the present invention is smaller since photoelectric conversion efficiency and hole migration increase. Particularly, it is preferable that the amount of transition metal elements contained in the compound of the present invention is small. The transition metal element includes palladium, iron, tin, nickel and copper. Especially, it is preferable that the amount of palladium, iron and tin is small. The amount of impurities contained in the compound of the present invention is measured by elemental analysis, and the total amount of palladium, iron and tin is preferably 1000 ppm or less, further preferably 500 ppm or less, further more preferably 100 ppm or less, particularly preferably 30 ppm or less.

The elemental analysis method includes atomic absorption analysis, emission spectrometric analysis, plasma emission analysis, fluorescent X-ray analysis, plasma mass analysis, glow discharge mass analysis, ion chromatograph analysis and the like.

The compound of the present invention is characterized by having a structural unit represented by the formula (1) and a structural unit represented by the formula (2). The compound can be synthesized, for example, by using a compound represented by the formula (4) and a compound represented by the formula (5) as essential components of raw materials.

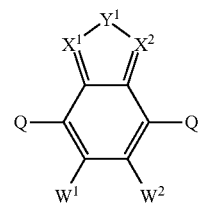

(4)

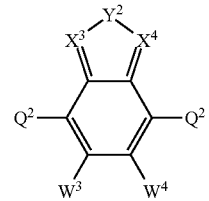

(5)

In the formulae, $X^1$, $X^2$, $X^3$, $X^4$, $Y^1$, $Y^2$, $W^1$, $W^2$, $W^3$ and $W^4$ represent the same meaning as described above. Q and $Q^2$ are the same or mutually different, and represent a hydrogen atom, a halogen atom, a dihydroxyboryl group or a monovalent organic group. Two Q may be the same or mutually different. Two $Q^2$ may be the same or mutually different.

It is preferable that at least one of $X^1$, $X^2$, $X^3$ and $X^4$ is a nitrogen atom and it is further preferable that $X^1$, $X^2$, $X^3$ and $X^4$ are all a nitrogen atom, in the formula (4) and the formula (5).

In the formula (4) and the formula (5), $Y^1$ and $Y^2$ are preferably a sulfur atom, an oxygen atom, —N($R^1$)— or —$CR^2$=$CR^3$—. $Y^1$ is more preferably a sulfur atom, an oxygen atom or —$CR^2$=$CR^3$—, further preferably a sulfur atom. $Y^2$ is more preferably a sulfur atom, an oxygen atom or —$CR^2$=$CR^3$—, further preferably an oxygen atom.

The monovalent organic group represented by Q or $Q^2$ includes a substituted silyl group, a borate residue and a substituted stannyl group.

The definition and specific examples of the borate residue and the substituted stannyl group include the same definition and specific examples as explained for $Q^{100}$ or $Q^{300}$ described above. The substituted silyl group includes a group represented by —$SiR^{500}_3$. Here, $R^{500}$ represents a monovalent organic group. The monovalent organic group includes an alkyl group, a cycloalkyl group, an aryl group and the like.

The alkyl group has a number of carbon atoms of usually 1 to 30, and specific examples thereof include a methyl group, an ethyl group, a n-propyl group, an isopropyl group, a n-butyl group, an isobutyl group, a sec-butyl group, a tert-butyl group, a n-pentyl group, an isopentyl group, a 2-methylbutyl group, a 1-methylbutyl group, a n-hexyl group, an isohexyl group, a 3-methylpentyl group, a 2-methylpentyl group, a 1-methylpentyl group, a heptyl group, an octyl group, an isooctyl group, a 2-ethylhexyl group, a nonyl group, a decyl group, an undecyl group, a dodecyl group, a tetradecyl group, a hexadecyl group, an octadecyl group and an eicosyl group. The cycloalkyl group has a number of carbon atoms of usually 3 to 30, and specific examples thereof include a cyclopentyl group, a cyclohexyl group and an adamantyl group. The aryl group includes a phenyl group, a naphthyl group and the like. The substituted silyl group is preferably $SiMe_3$,—$SiEt_3$,—$SiBu_3$ or —$SiPh_3$, further preferably $SiMe_3$,—$SiEt_3$ or—$SiBu_3$. In the above-described preferable examples, Me represents a methyl group, Et represents an ethyl group, Bu represents a butyl group and Ph represents a phenyl group.

The halogen atom represented by Q includes a fluorine atom, a chlorine atom, a bromine atom and an iodine atom.

Q is preferably a bromine atom, a dihydroxyboryl group, a borate residue, a substituted stannyl group or a substituted silyl group, more preferably a bromine atom, a dihydroxyboryl group or a borate residue, further preferably a bromine atom.

As the compound represented by the formula (4), compounds represented by the formula 501 to the formula 652 are exemplified.

501
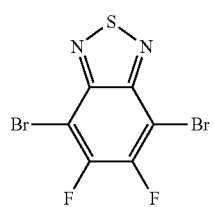

502
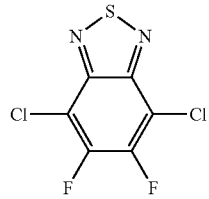

503
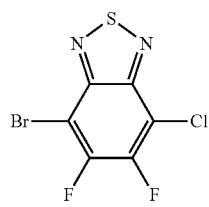

-continued

504
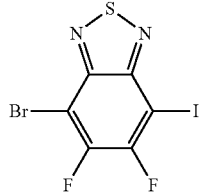

505
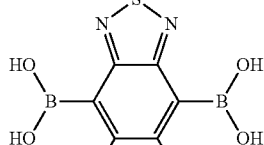

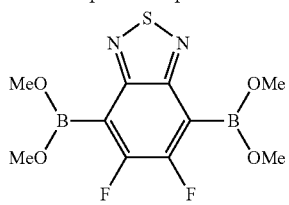

507
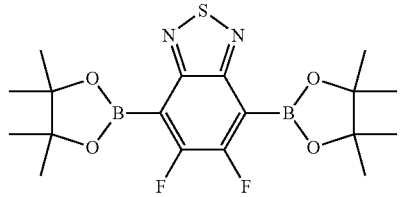

508
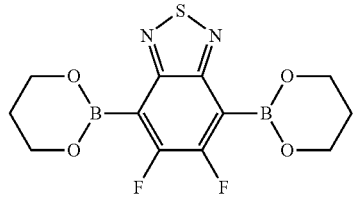

509
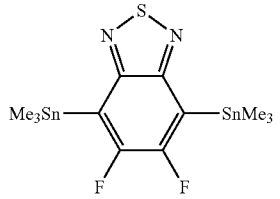

510
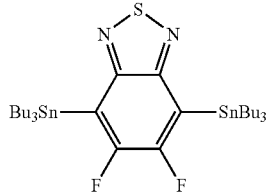

511
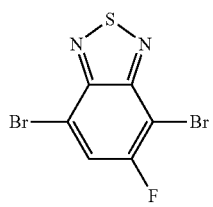

| | |
|---|---|
| 512 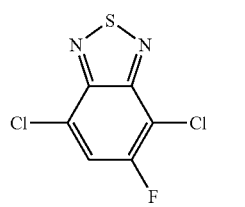 | 519 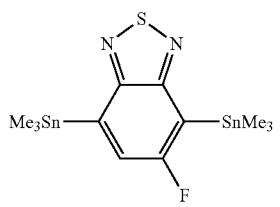 |
| 513 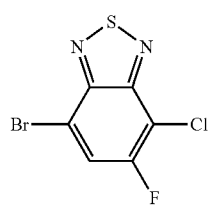 | 520 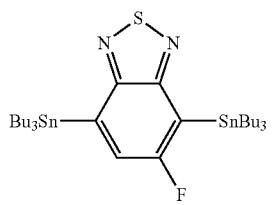 |
| 514 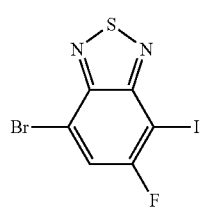 | 521 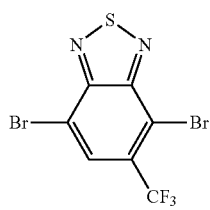 |
| 515 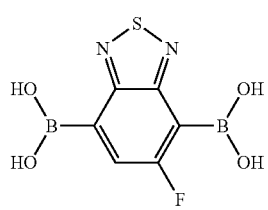 | 522 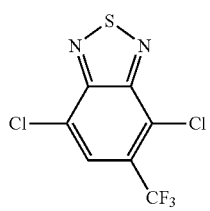 |
| 516 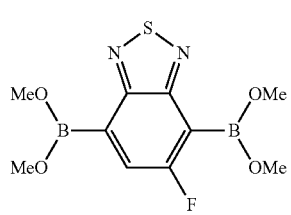 | 523 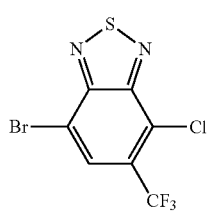 |
| 517 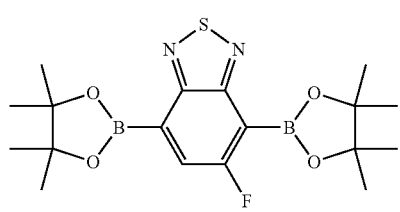 | 524 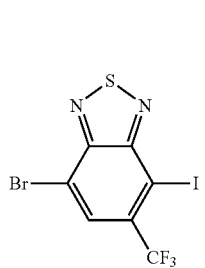 |
| 518 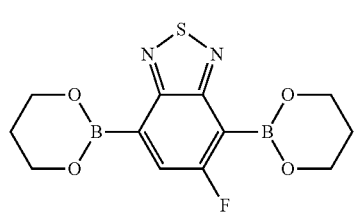 | 525 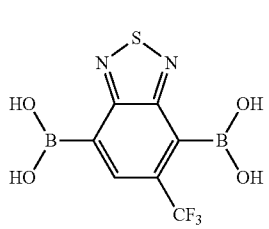 |

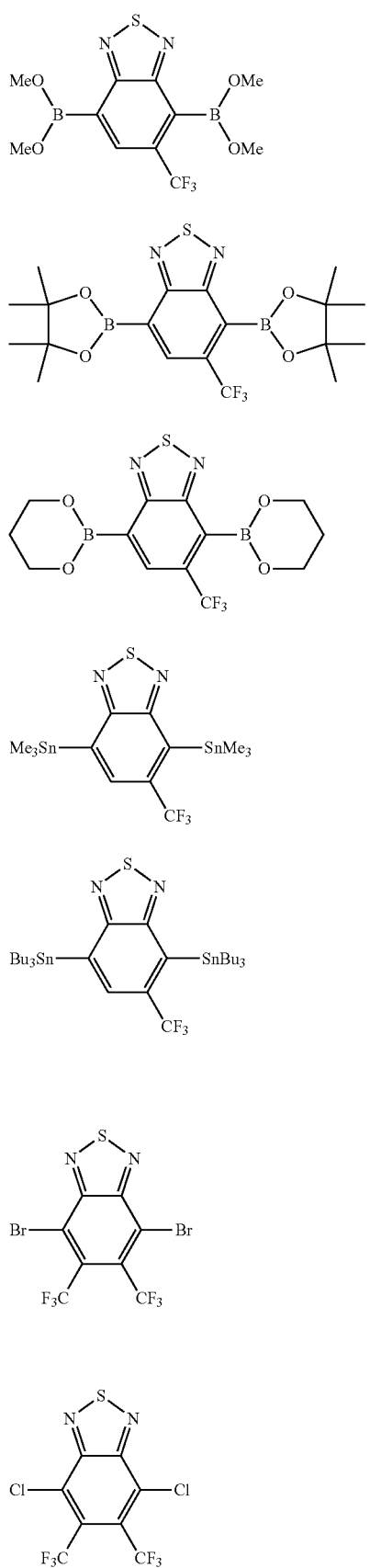
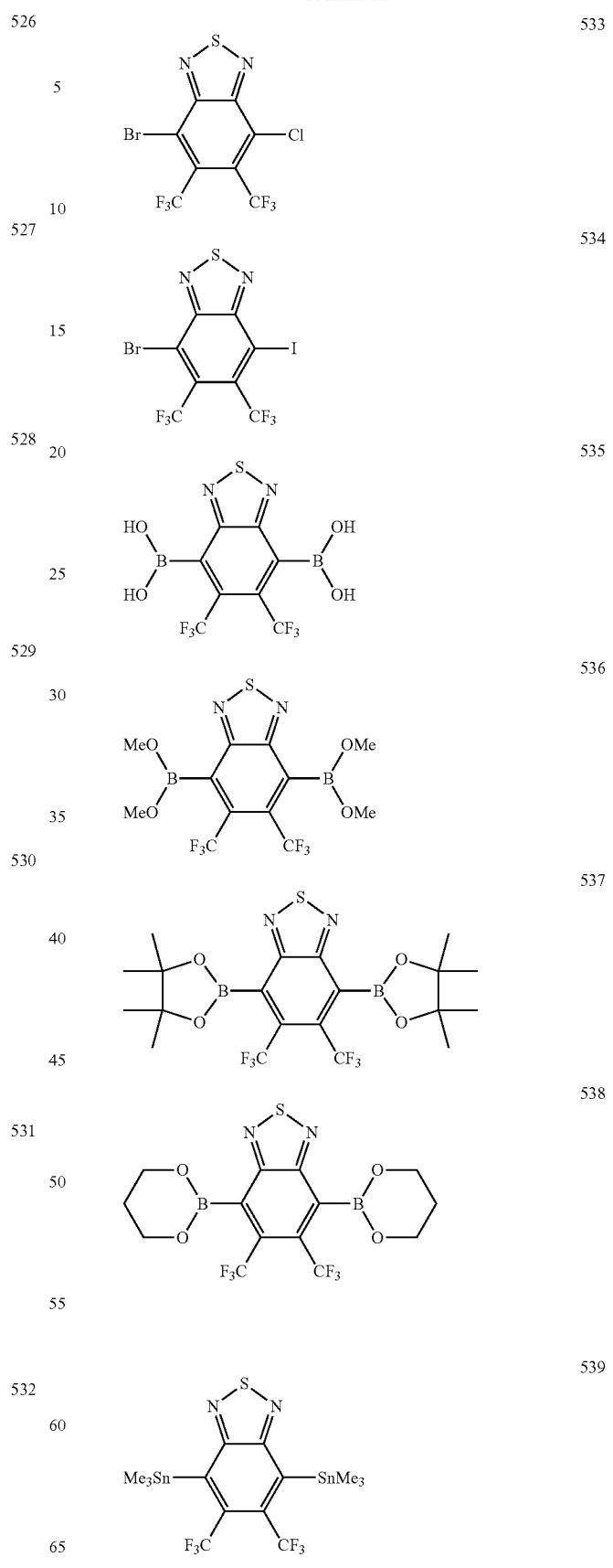

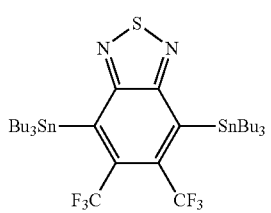
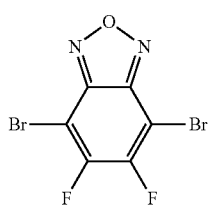
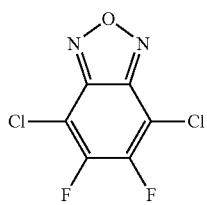
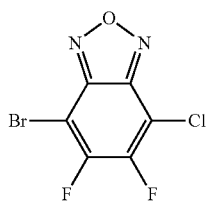
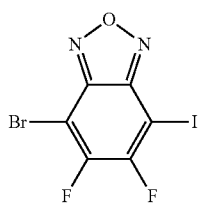
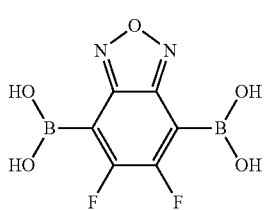
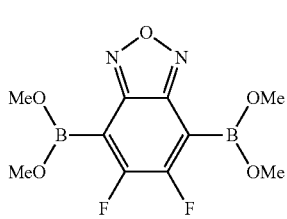
540
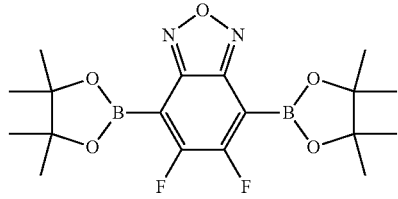
541
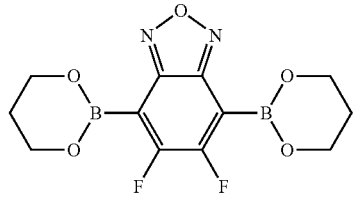
542
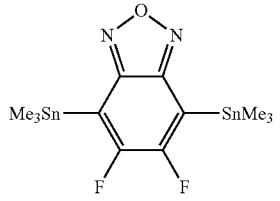
543
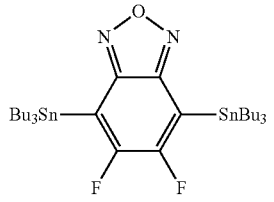
544
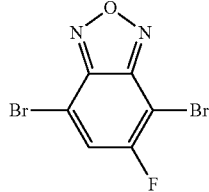
545
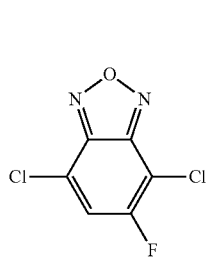
546
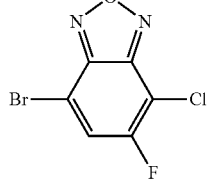
547
548
549
550
551
552
553

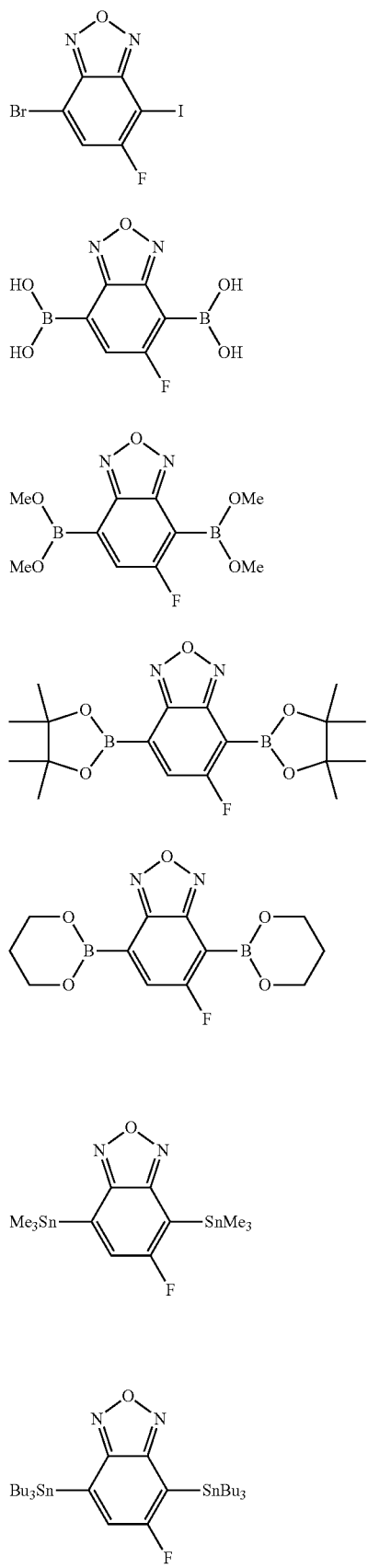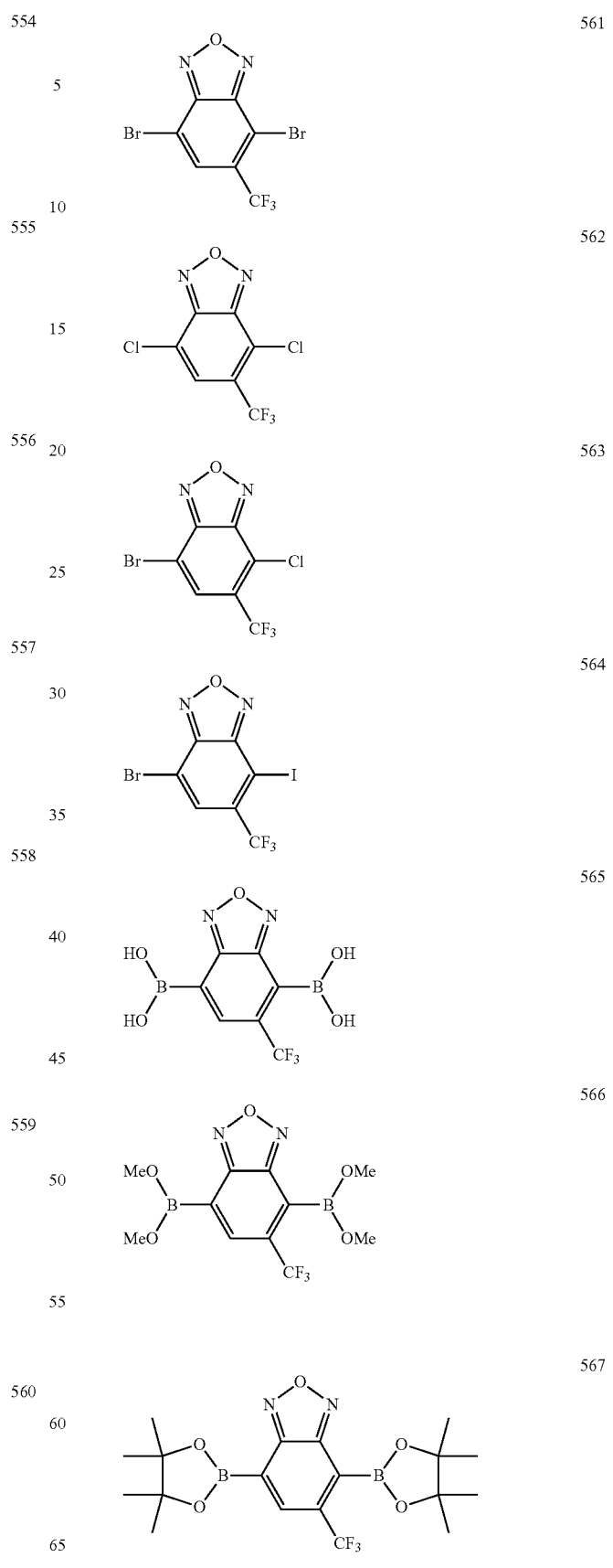

-continued
568 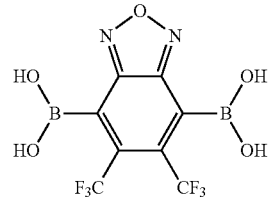
569 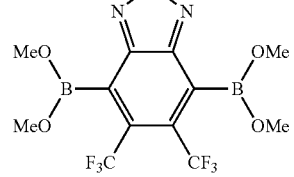
570 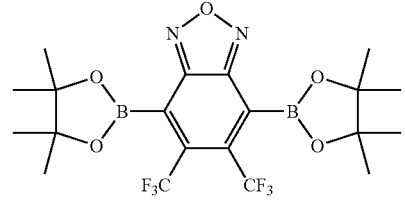
571 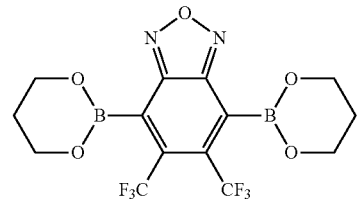
572 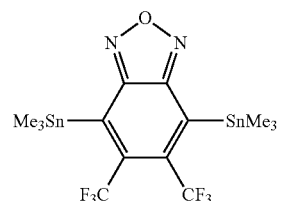
573 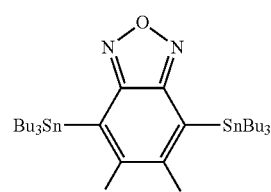
574 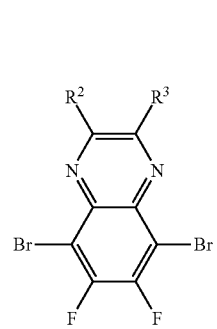
-continued
575 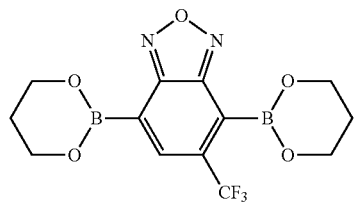
576 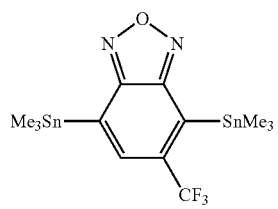
577 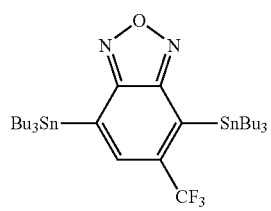
578 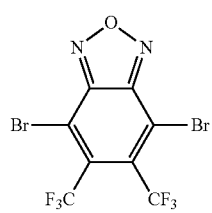
579 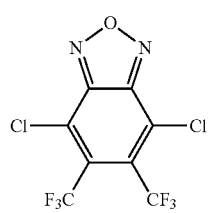
580 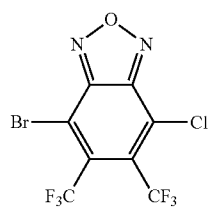
581 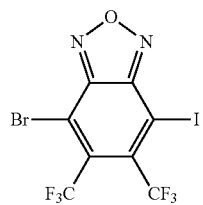

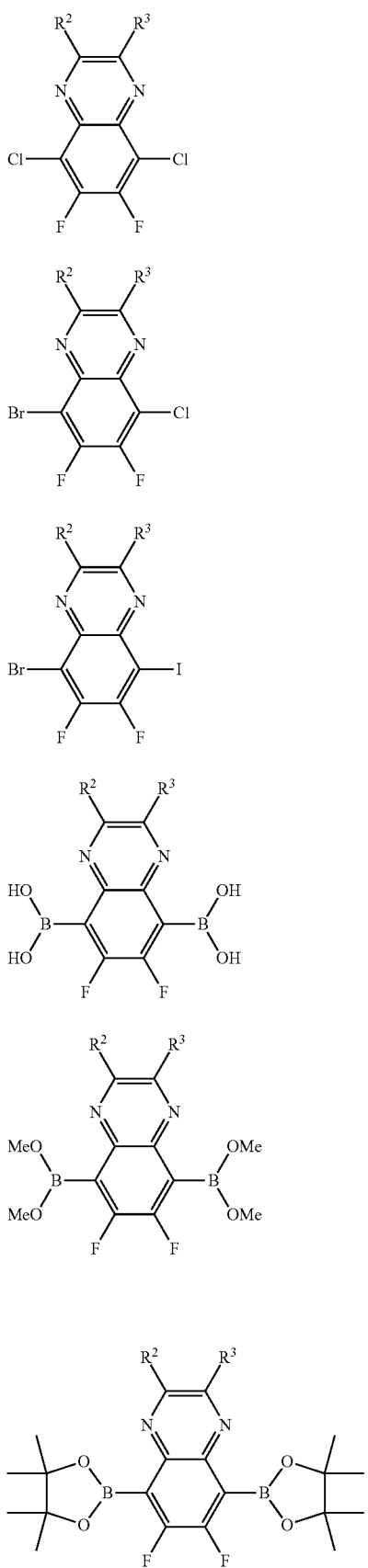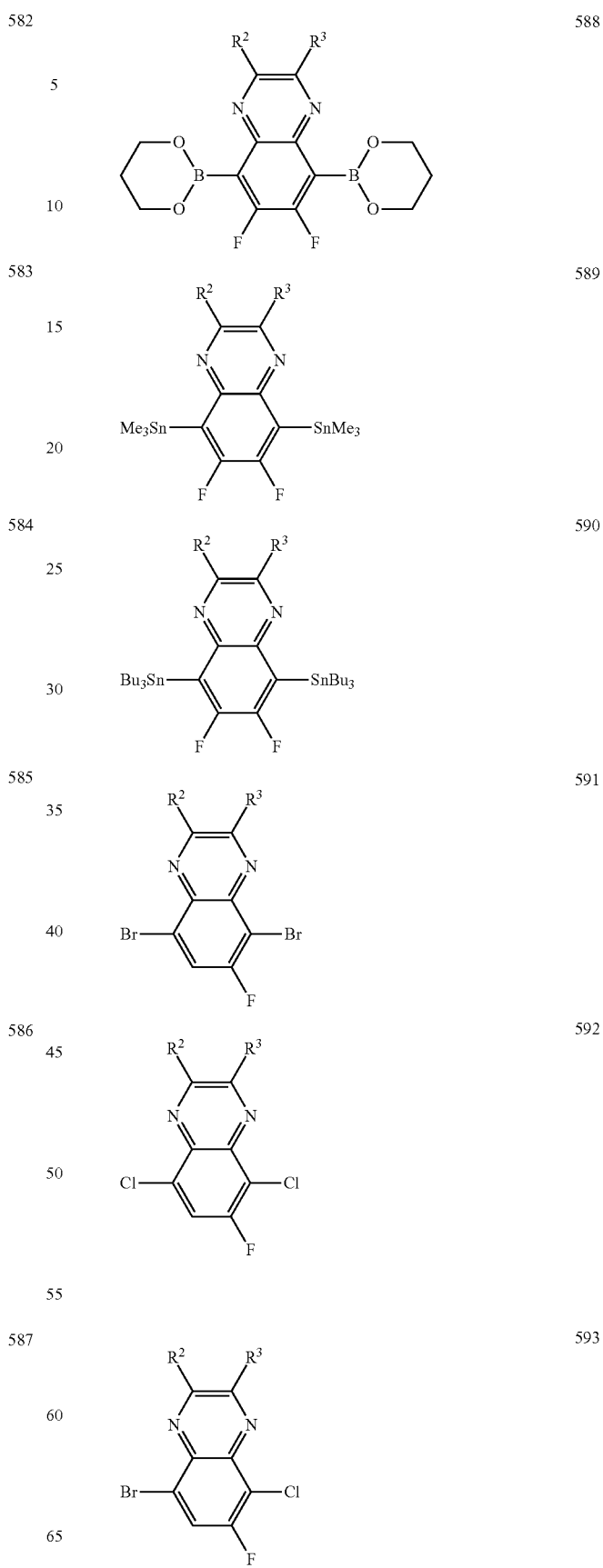

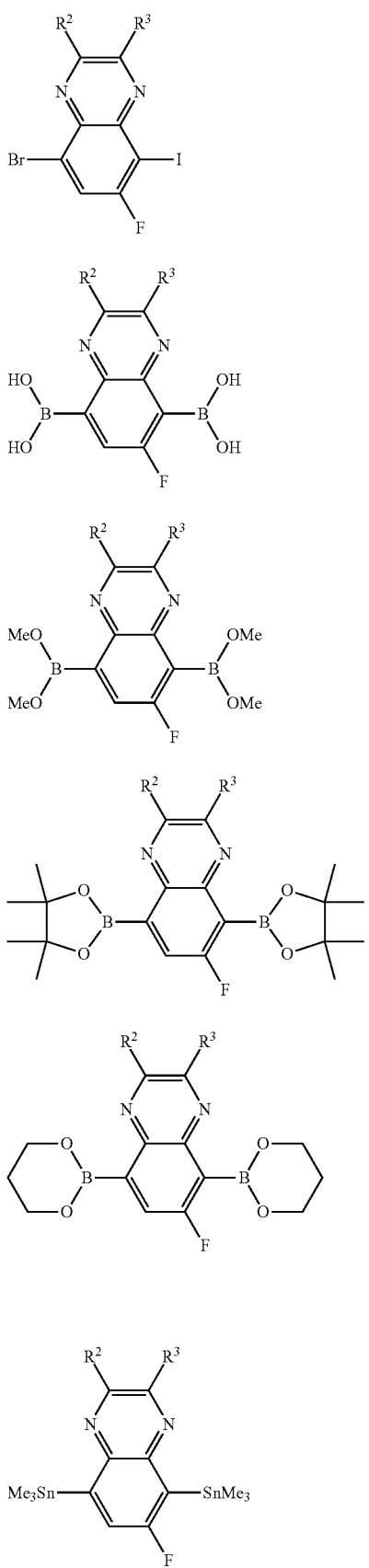
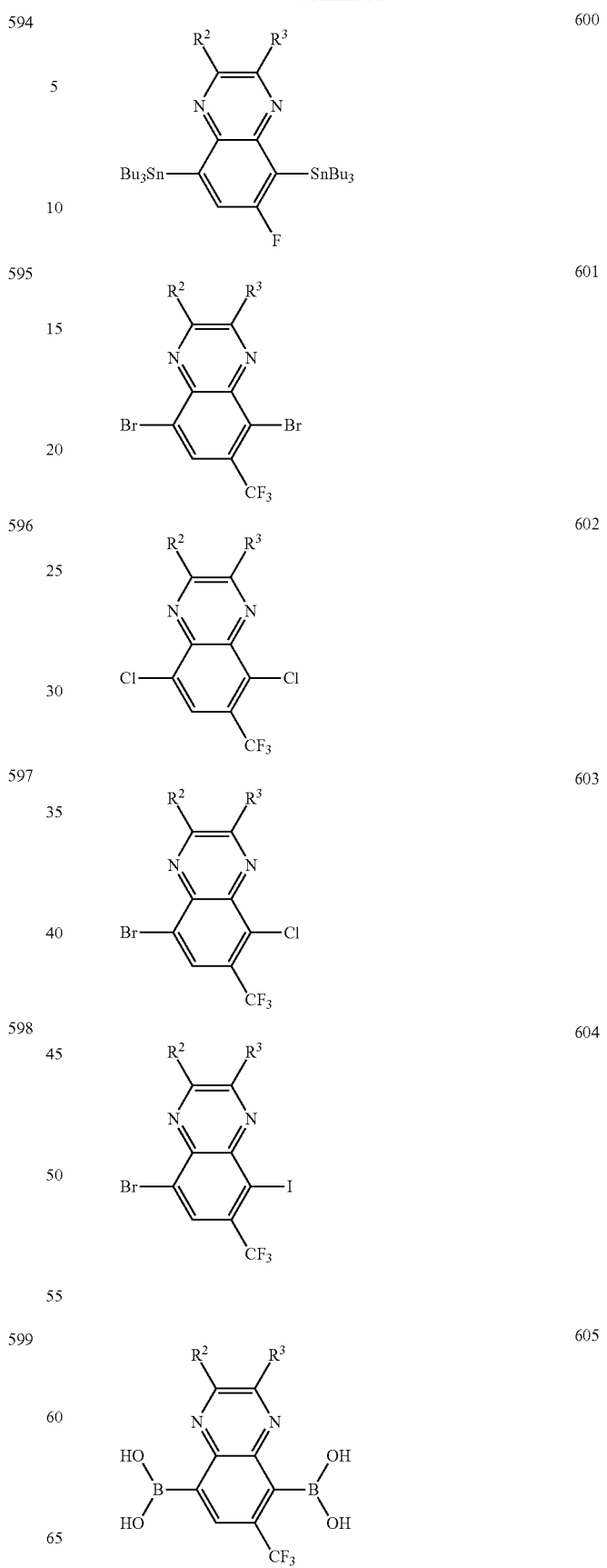

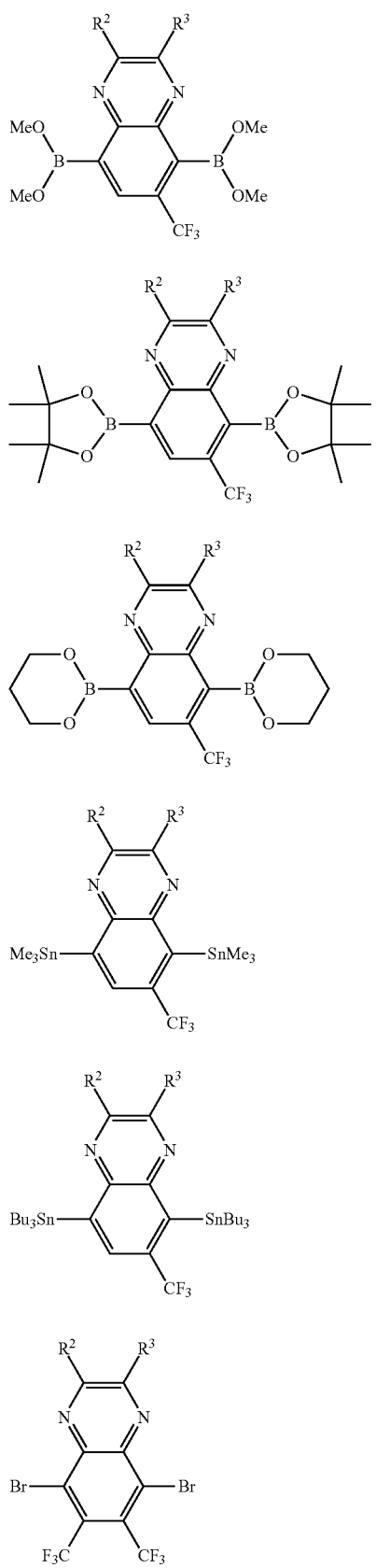
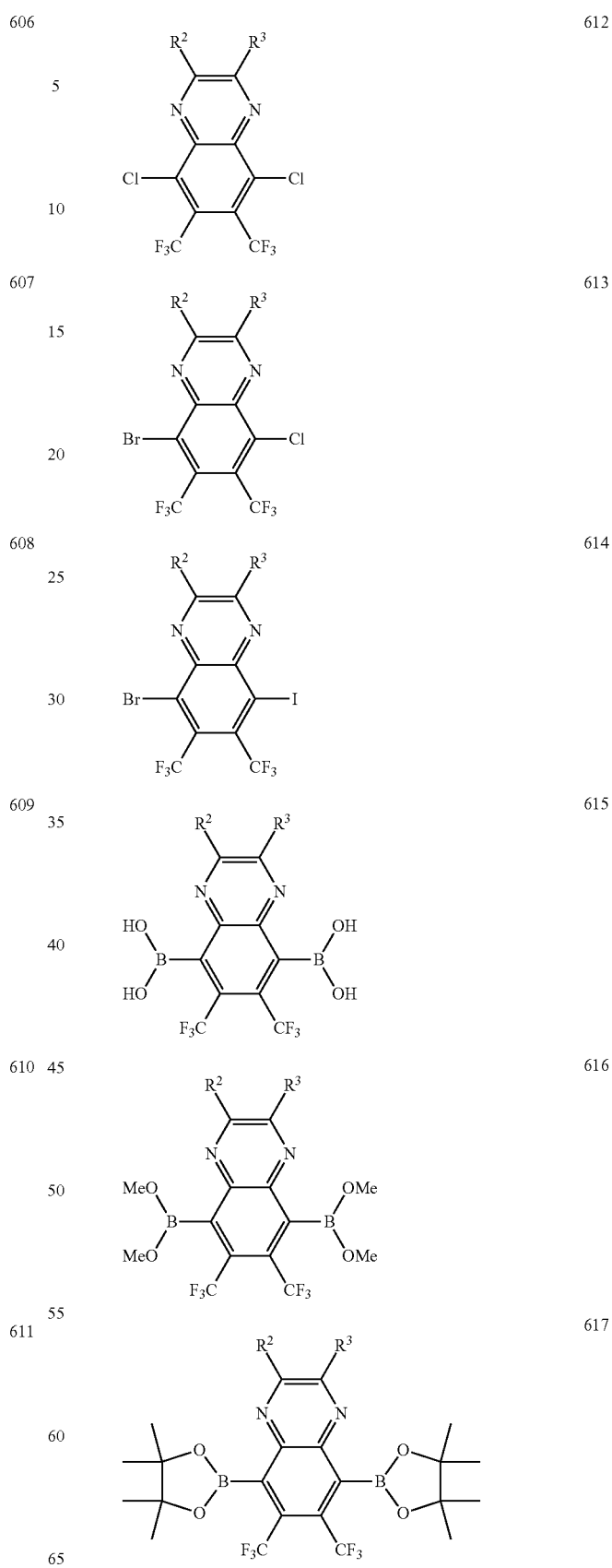

618 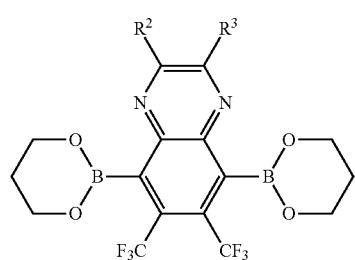
619 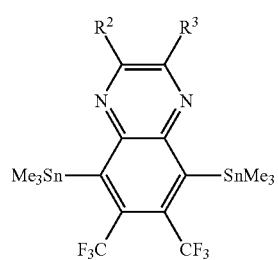
620 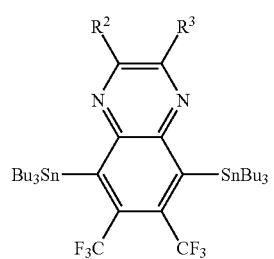
621 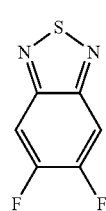
622 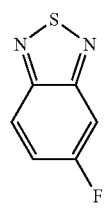
623 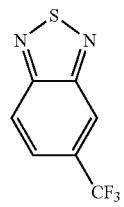
624 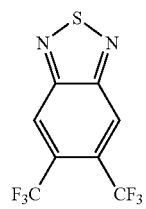
625 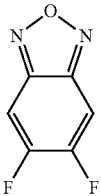
626 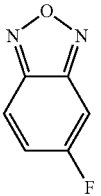
627 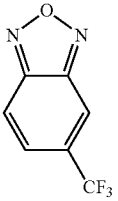
628 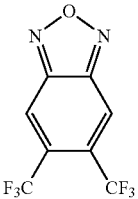
629 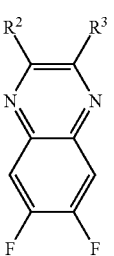
630 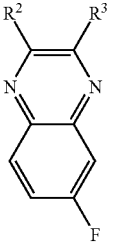
631 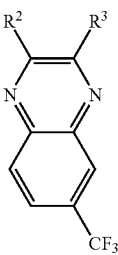

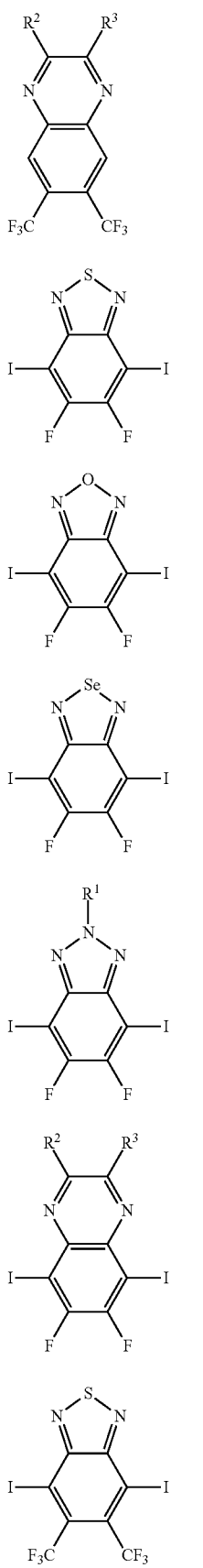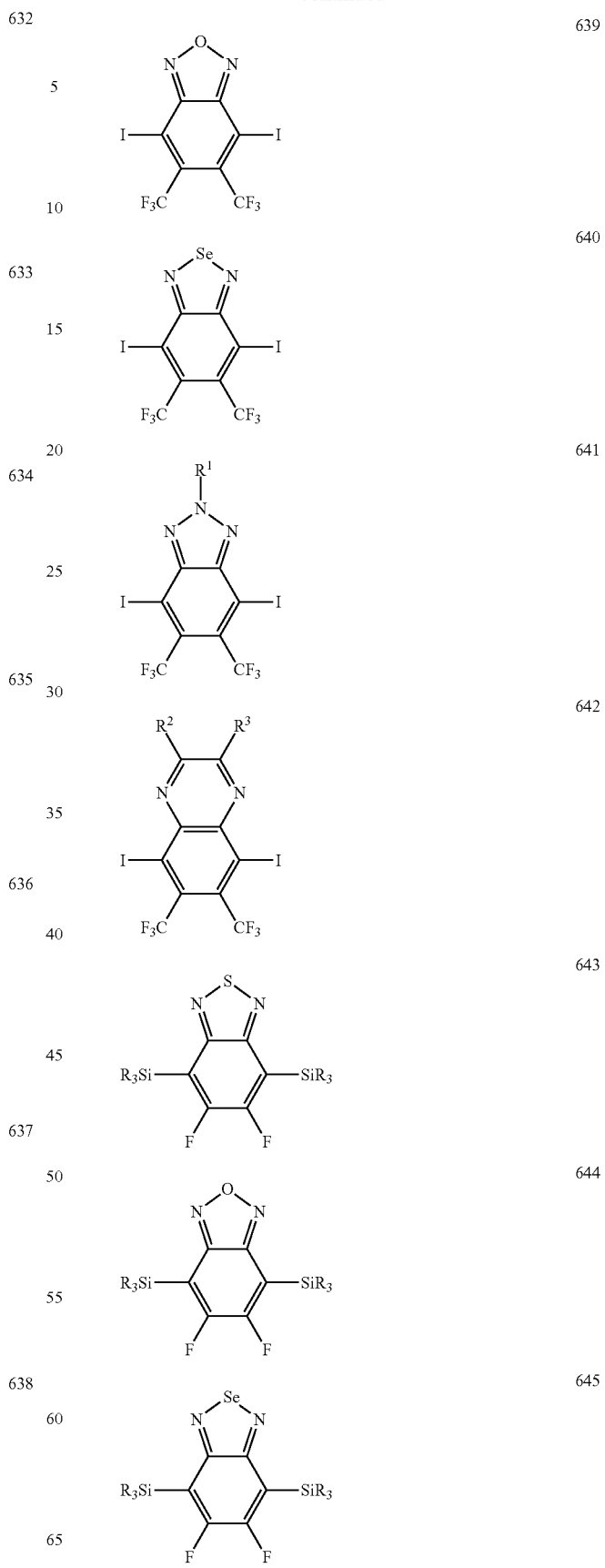

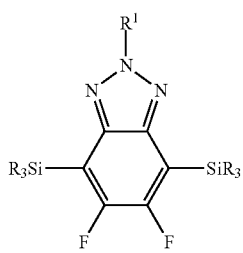

646

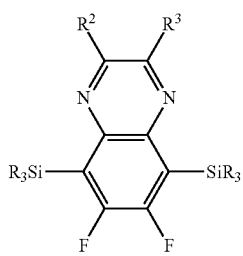

647

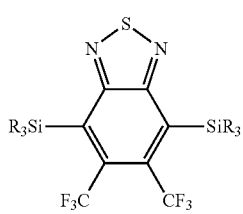

648

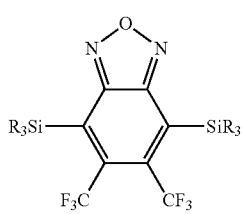

649

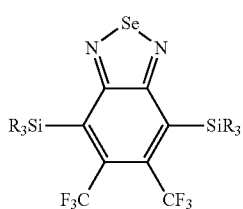

650

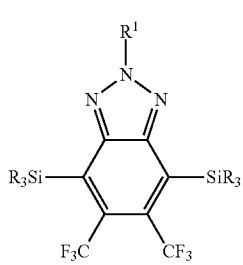

651

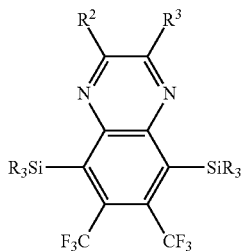

652

In the formula 501 to the formula 652, R, $R^1$, $R^2$ and $R^3$ represent the same meaning as described above.

Of compounds represented by the formula 501 to the formula 652, compounds represented by the formula 501 to the formula 510, the formula 531 to the formula 550, the formula 571 to the formula 590, the formula 611 to the formula 620, the formula 621, the formula 624, the formula 625, the formula 628, the formula 629, the formula 632, the formulae 633 to 642 and the formula 643 to the formula 652 are preferable, from the standpoint of enhancing photoelectric conversion efficiency of a photoelectric conversion device containing a polymerized compound. Further preferable are compounds represented by the formula 501 to the formula 510, the formula 541 to the formula 550, the formula 581 to the formula 590, the formula 621, the formula 625, the formula 629, the formula 633 to the formula 637 and the formula 643 to the formula 647. Further more preferable are compounds represented by the formula 501, the formula 507, the formula 541, the formula 547, the formula 581, the formula 587, the formula 621, the formula 634 and the formula 643. Compounds represented by the formula 501, the formula 507, the formula 541, the formula 581, the formula 634 and the formula 643 are preferable from the standpoint of easiness of synthesis.

A compound represented by the formula (4-1):

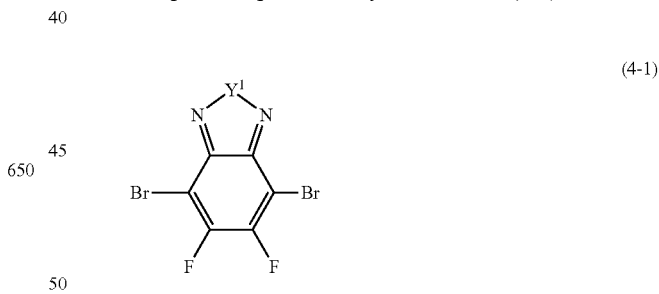

(4-1)

(wherein $Y^1$ represents the same meaning as described above.) which is one embodiment of the compound represented by the formula (4) can be produced by brominating a compound represented by the formula (4-2):

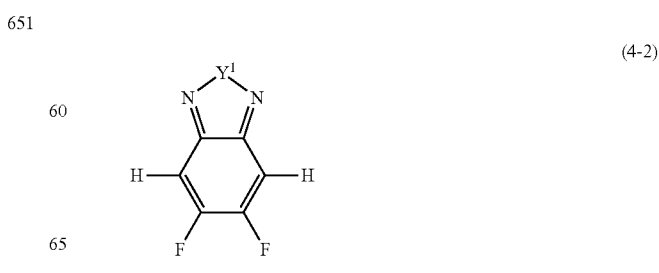

(4-2)

(wherein $Y^1$ represents the same meaning as described above.)

For bromination, known methods can be used, and the bromination method includes, for example, a method of bromination using a brominating agent in a solvent or without solvent.

When a solvent is used, the solvent used in the reaction includes saturated hydrocarbons such as pentane, hexane, heptane, octane, cyclohexane and the like, unsaturated hydrocarbons such as benzene, toluene, ethylbenzene, xylene and the like, halogenated saturated hydrocarbons such as carbon tetrachloride, chloroform, dichloromethane, chlorobutane, bromobutane, chloropentane, bromopentane, chlorohexane, bromohexane, chlorocyclohexane, bromocyclohexane and the like, halogenated unsaturated hydrocarbons such as chlorobenzene, dichlorobenzene, trichlorobenzene and the like, etc.

The brominating agent includes bromine, N-bromosuccinimide (hereinafter, referred to as NBS in some cases), carbon tetrachloride, hydrobromic acid and the like. It is also possible to use some of these brominating agents in combination. The use amount of the brominating agent is usually 2 to 100000 equivalents with respect to the number of moles of a compound represented by the formula (4-2).

It is also possible that a catalyst for promoting bromination is allowed to coexist in bromination. The catalyst includes metals such as iron, cobalt, nickel, copper and the like, halogenated metals such as iron halide, cobalt halide, nickel halide, copper halide and the like, radical generators such as benzoyl peroxide, azoisobutyronitrile and the like, etc. As the catalyst, metals and halogenated metals are preferable, iron and iron bromide are further preferable. The use amount of the catalyst is usually 0.001 to 10 equivalents, preferably 0.01 to 1 equivalent with respect to the number of moles of a compound represented by the formula (4-2). The reaction temperature is usually −50 to 200° C., preferably 0 to 150° C.

After the reaction, usual post treatments such as, for example, adding water to stop the reaction, then, extraction of the product with an organic solvent, and distillation off of the solvent and the like can be conducted to obtain a compound represented by the formula (4-1). Isolation and purification of the product can be carried out by methods such as chromatographic fractionation, recrystallization and the like.

As the compound represented by the formula (4-2), those commercially available can be used, and for example, a compound in which $Y^1$ is a sulfur atom can be produced by reacting a compound represented by the formula (4-3) and thionyl chloride by a production method described in Patent document (International Patent Publication WO2011/136311A1) and used.

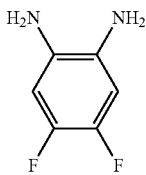

(4-3)

Since the compound of present invention can manifest high electron and/or hole transportability, a device having an organic film containing the compound can transport electrons and holes injected from an electrode or charges generated by light absorption. By utilizing such properties, the compound of the present invention can be suitably used in various devices such a photoelectric conversion device, an organic film transistor, an organic electroluminescent device, a sensor and the like. These devices will be illustrated individually below.

In the compound of the present invention, the absorption end wavelength is preferably a long wavelength. The absorption end wavelength can be determined by the following method.

For measurement, use is made of a spectrophotometer functioning in a region of the wavelength of ultraviolet, visible and near-infrared (for example, ultraviolet visible near-infrared spectrophotometer JASCO—V670, manufactured by JASCO Corporation). Since the measurable wavelength range is from 200 to 1500 nm in the case of use of JASCO—V670, measurement is performed in this wavelength range. First, the absorption spectrum of a substrate used for measurement is measured. As the substrate, use is made of a quartz substrate, a glass substrate and the like. Then, on the substrate, a film containing the compound is formed from a solution containing the compound or a molten material containing the compound. In film formation from a solution, drying is performed after the film formation. Thereafter, the absorption spectrum of a laminate of the film and the substrate is measured. The difference between the absorption spectrum of a laminate of the film and the substrate and the absorption spectrum of the substrate is regarded as the absorption spectrum of the film.

In the absorption spectrum of the film, the ordinate axis represents the absorbance of the compound and the abscissa axis represents wavelength. It is desirable to regulate the thickness of a film so that the absorbance of the largest absorption peak is about 0.5 to 2. The absorbance of an absorption peak of the longest wavelength among absorption peaks is regarded as 100%, and an intersection point of a straight line parallel to the abscissa axis (wavelength axis) containing the 50% absorbance thereof and the absorption peak, situated at the longer side than the peak wavelength of the absorption peak, is defined as a first point. An intersection point of a straight line parallel to the wavelength axis containing the 25% absorbance thereof and the absorption peak, situated at the longer side than the peak wavelength of the absorption peak, is defined as a second point. An intersection point of the baseline and a straight line connecting the first point and the second point is defined as the light absorption end wavelength. With respect to the baseline, the absorbance of an absorption peak of the longest wavelength is regarded as 100%, and the wavelength of an intersection point of a straight line parallel to the wavelength axis containing the 10% absorbance thereof and the absorption peak, situated at the longer side than the peak wavelength of the absorption peak, is regarded as the basis, and a straight line connecting a third point on the absorption spectrum having wavelength longer by 100 nm than the basis wavelength and a fourth point on the absorption spectrum having wavelength longer by 150 nm than the basis wavelength is defined as the base line.

<Photoelectric Conversion Device>

A photoelectric conversion device containing the compound of the present invention has at least one active layer containing the compound of the present invention between a first electrode and a second electrode.

A preferable embodiment of the photoelectric conversion device containing the compound of the present invention has a pair of electrodes at least one of which is transparent or semi-transparent and an active layer formed of an organic composition composed of a p-type organic semiconductor and an n-type organic semiconductor. It is preferable that the compound of the present invention is used as a p-type organic semiconductor. The motion mechanism of the photoelectric conversion device of this embodiment will be explained. Incident optical energy from a transparent or semi-transparent electrode is absorbed in an electron accepting compound such as fullerene derivatives and the like (n-type organic semiconductor) and/or an electron donating compound such as the compound of the present invention and the like (p-type organic semiconductor), to generate excitons binding electrons and holes. When the generated excitons move and reach the heterojunction interface at which the electron accepting compound and the electron donating compound are adjacent, electrons and holes separate due to differences of respective HOMO energy and LUMO energy at the interface, and independently movable charges (electrons and holes) are generated. The generated charges move to respective electrodes, thus, electric energy (current) can be taken outside.

The photoelectric conversion device produced by using the compound of the present invention is usually formed on a substrate. This substrate may advantageously be one which does not chemically change in forming an electrode and in forming a layer of an organic substance. The material of the substrate includes, for example, glass, plastic, polymer film and silicon. In the case of an opaque substrate, it is preferable that the opposite electrode (namely, remote electrode from substrate) is transparent or semi-transparent.

Another embodiment of the photoelectric conversion device containing the compound of the present invention is a photoelectric conversion device having a first active layer containing the compound of the present invention and a second active layer adjacent to the first active layer and containing an electron accepting compound such as fullerene derivatives and the like, between a pair of electrodes at least one which is transparent or semi-transparent.

It is preferable that the photoelectric conversion device of the present invention has an active layer containing the above-described compound.

The material of the above-described transparent or semi-transparent electrode includes an electrically conductive metal oxide film, a semi-transparent metal film and the like. Specifically, films fabricated by using an electrically conductive material such as indium oxide, zinc oxide, tin oxide, and a composite thereof: indium.tin.oxide (ITO), indium.zinc.oxide and the like, and NESA, gold, platinum, silver, copper and the like are used, and ITO, indium.zinc.oxide and tin oxide are preferable. The electrode fabrication method includes a vacuum vapor deposition method, a sputtering method, an ion plating method, a plating method and the like.

As the electrode material, transparent electrically conductive films made of organic substances such as polyaniline and derivatives thereof, polythiophene and derivatives thereof and the like may be used.

One electrode may not be transparent, and as the material of this electrode, metals, electrically conductive polymers and the like can be used. Specific examples of the electrode material include metals such as lithium, sodium, potassium, rubidium, cesium, magnesium, calcium, strontium, barium, aluminum, scandium, vanadium, zinc, yttrium, indium, cerium, samarium, europium, terbium, ytterbium and the like, and alloys composed of these two or more metals, or alloys composed of at least one of the above-described metals and at least one metal selected from the group consisting of gold, silver, platinum, copper, manganese, titanium, cobalt, nickel, tungsten and tin; graphite, graphite intercalation compounds, polyaniline and derivatives thereof, and polythiophene and derivatives thereof. The alloy includes a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy and the like.

An additional intermediate layer other than the active layer may be used as a means for improving photoelectric conversion efficiency. The material used as the intermediate layer includes halides of alkali metals and alkaline earth metals such as lithium fluoride and the like, oxides such as titanium oxide and the like, PEDOT (poly-3,4-ethylenedioxythiophene), and the like.

<Active Layer>

The above-described active layer may contain one compound of the present invention singly or may contain two or more compounds of the present invention in combination. Compounds other than the compound of the present invention may be mixed and used as an electron donating compound and/or an electron accepting compound in the active layer, for enhancing hole transportability of the active layer. The electron donating compound and the electron accepting compound are determined relatively based on energy levels of these compounds.

The above-described electron donating compound includes, for example, pyrazoline derivatives, arylamine derivatives, stilbene derivatives, triphenyldiamine derivatives, oligothiophene and derivatives thereof, polyvinylcarbazole and derivatives thereof, polysilane and derivatives thereof, polysiloxane derivatives having an aromatic amine residue on the side chain or main chain, polyaniline and derivatives thereof, polythiophene and derivatives thereof, polypyrrole and derivatives thereof, polyphenylenevinylene and derivatives thereof and polythienylenevinylene and derivatives thereof, in addition to the compound of the present invention.

The above-described electron accepting compound includes, for example, carbon materials, metal oxides such as titanium oxide and the like, oxadiazole derivatives, anthraquinodimethane and derivatives thereof, benzoquinone and derivatives thereof, naphthoquinone and derivatives thereof, anthraquinone and derivatives thereof, tetracyanoanthraquinodimethane and derivatives thereof, fluorenone derivatives, diphenyldicyanoethylene and derivatives thereof, diphenoquinone derivatives, metal complexes of 8-hydroxyquinoline and derivatives thereof, polyquinoline and derivatives thereof, polyquinoxaline and derivatives thereof, polyfluorene and derivatives thereof, phenanthroline derivatives such as 2,9-dimethyl-4,7-diphenyl-1,10-phenanthroline (vasocuproine) and the like, fullerene, and fullerene derivatives, in addition to the compound of the present invention, and includes preferably titanium oxide, carbon nano tube, fullerene and fullerene derivatives, particularly preferably fullerene and fullerene derivatives.

The fullerene and fullerene derivatives include $C_{60}$, $C_{70}$, $C_{76}$, $C_{78}$, $C_{84}$ and derivatives thereof. The fullerene derivative denotes a compound obtained by at least partially modifying fullerene.

The fullerene derivative includes, for example, a compound represented by the formula (I), a compound represented by the formula (II), a compound represented by the formula (III) and a compound represented by the formula (IV).

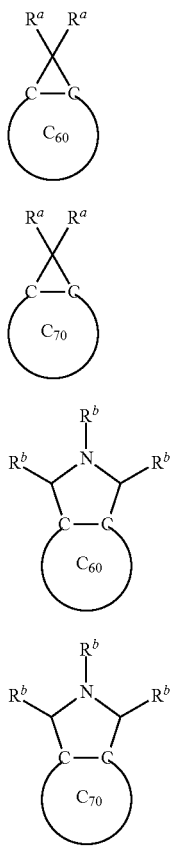

(I)

(II)

(III)

(IV)

(in the formulae (I) to (IV), $R^a$ is an alkyl group, an aryl group, a heteroaryl group or a group having an ester structure. A plurality of $R^a$ may be the same or mutually different. $R^b$ represents an alkyl group or an aryl group. A plurality of $R^b$ may be the same or mutually different.)

The definition and specific examples of the alkyl group and the aryl group represented by $R^a$ and $R^b$ are the same as the definition and specific examples of the alkyl group and the aryl group represented by $R^1$.

The heteroaryl group represented by $R^a$ includes, for example, a thiophenediyl group, a pyridinediyl group, a furandiyl group and a pyrrolediyl group.

The group having an ester structure represented by $R^a$ includes, for example, a group represented by the formula (V).

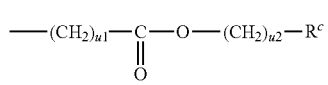

(V)

(wherein u1 represents an integer of 1 to 6, u2 represents an integer of 0 to 6, and $R^c$ represents an alkyl group, an aryl group or a heteroaryl group.)

The definition and specific examples of the alkyl group, the aryl group and the heteroaryl group represented by $R^c$ are the same as the definition and specific examples of the alkyl group, the aryl group and the heteroaryl group represented by $R^a$.

Specific examples of the $C_{60}$ derivative include those shown below.

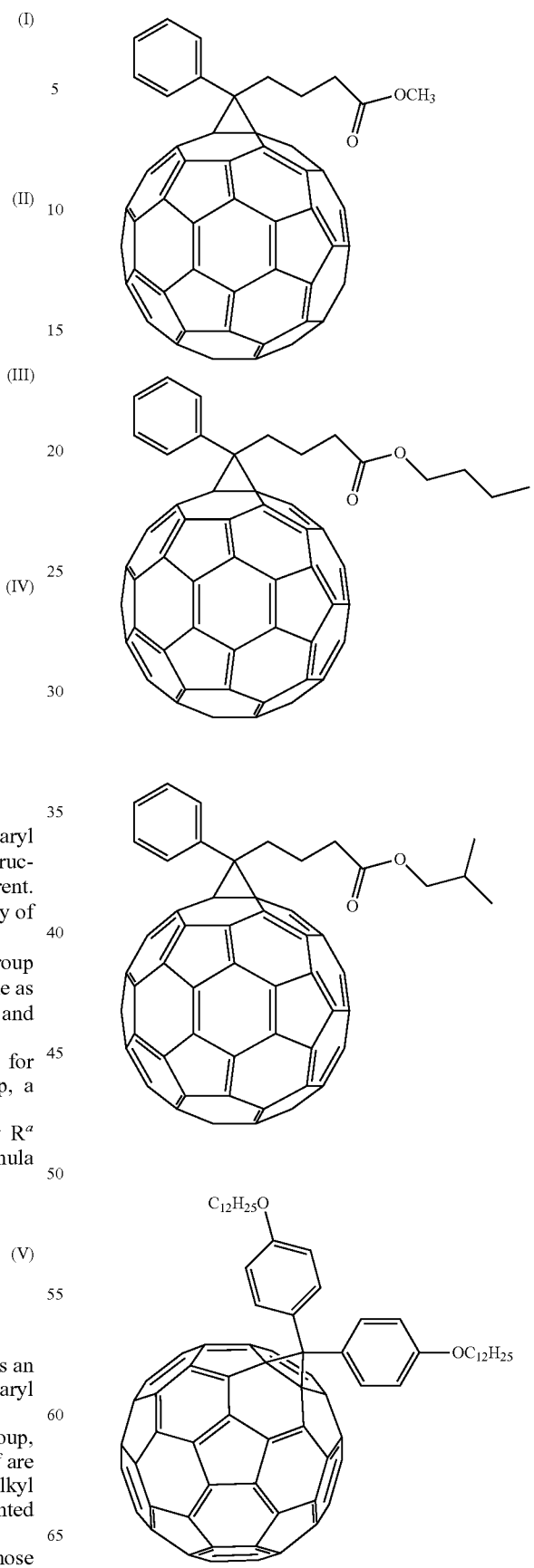

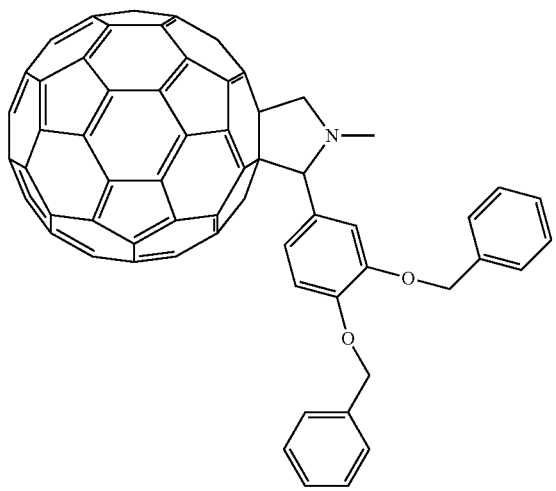
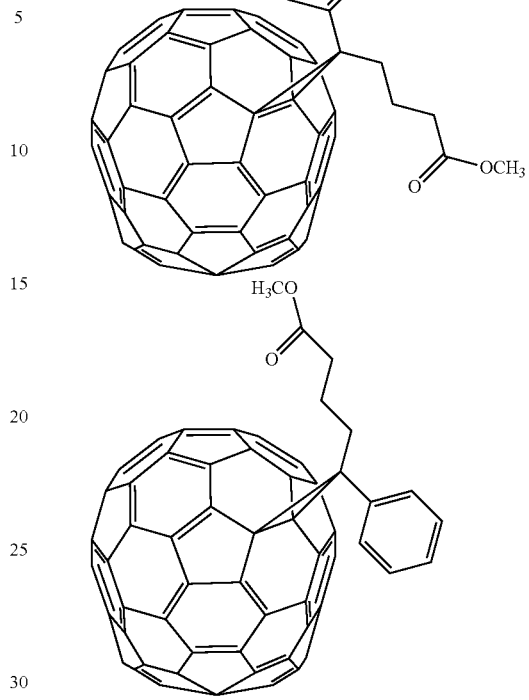
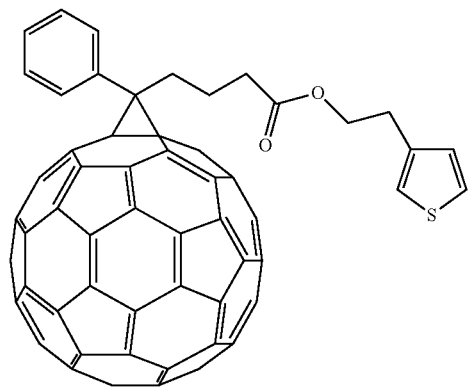
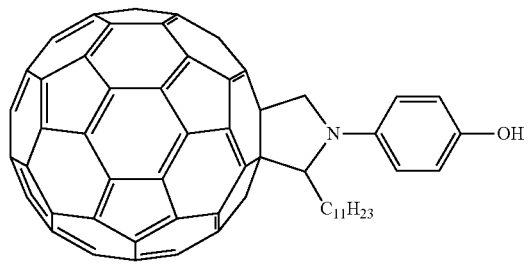
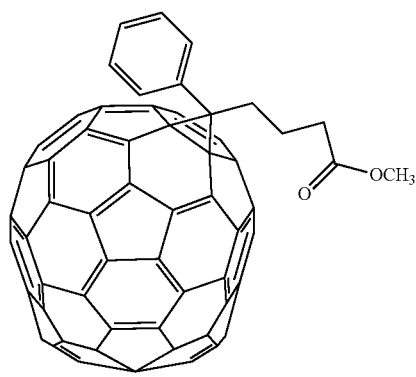

Specific examples of the $C_{70}$ derivative include those shown below.

Examples of the fullerene derivative include [6,6]phenyl-C61 butyric acid methyl ester (C60PCBM, [6,6]-Phenyl C61 butyric acid methyl ester), [6,6]phenyl-C71 butyric acid methyl ester (C70PCBM, [6,6]-Phenyl C71 butyric acid methyl ester), [6,6]phenyl-C85 butyric acid methyl ester (C84PCBM, [6,6]-Phenyl C85 butyric acid methyl ester) and [6,6]thienyl-C61 butyric acid methyl ester ([6,6]-Thienyl C61 butyric acid methyl ester).

When the compound of the present invention and a fullerene derivative are contained in the active layer, the proportion of the fullerene derivative is preferably 10 to 1000 parts by weight, more preferably 20 to 500 parts by weight with respect to 100 parts by weight of the compound of the present invention.

The thickness of the active layer is, usually, preferably 1 nm to 100 μm, more preferably 2 nm to 1000 nm, further preferably 5 nm to 500 nm, more preferably 20 nm to 200 nm.

The production method of the above-described active layer may be any method and includes, for example, a method of film formation from a solution containing the compound and a solvent, and a method of film formation by a vacuum vapor deposition method.

<Production Method of Photoelectric Conversion Device>

A preferable method of producing a photoelectric conversion device is a method of producing a device having a first electrode and a second electrode and having an active layer between the first electrode and the second electrode, comprising a step in which a solution (ink) containing the compound of the present invention and a solvent is coated on the first electrode by a coating method to form an active layer, and a step of forming the second electrode on the active layer.

The solvent used for film formation from a solution may advantageously be one which dissolves the compound of the present invention. The solvent includes, for example, unsaturated hydrocarbon solvents such as toluene, xylene, mesitylene, tetralin, decalin, bicyclohexyl, n-butylbenzene, sec-butylbenzene, tert-butylbenzene and the like, halogenated saturated hydrocarbon solvents such as carbon tetrachloride, chloroform, dichloromethane, dichloroethane, chlorobutane, bromobutane, chloropentane, bromopentane, chlorohexane, bromohexane, chlorocyclohexane, bromocyclohexane and the like, halogenated unsaturated hydrocarbon solvents such as chlorobenzene, dichlorobenzene, trichlorobenzene and the like, and ether solvents such as tetrahydrofuran, tetrahydropyran and the like. The compound of the present invention can be usually dissolved at a concentration of 0.1 wt % or more in the above-described solvent.

In the case of film formation using a solution, coating methods such as a slit coat method, a knife coat method, a spin coat method, a casting method, a micro gravure coat method, a gravure coat method, a bar coat method, a roll coat method, a wire bar coat method, a dip coat method, a spray coat method, a screen printing method, a gravure printing method, a flexo printing method, an offset printing method, an inkjet coat method, a dispenser printing method, a nozzle coat method, a capillary coat method and the like can be used, and a slit coat method, a capillary coat method, a gravure coat method, a micro gravure coat method, a bar coat method, a knife coat method, a nozzle coat method, an inkjet coat method and a spin coat method are preferable.

From the standpoint of film formability, the surface tension of the solvent at 25° C. is preferably larger than 15 mN/m, more preferably larger than 15 mN/m and smaller than 100 mN/m, further preferably larger than 25 mN/m and smaller than 60 mN/m.

<Organic Film Transistor>

The compound of the present invention can also be used in an organic film transistor. The organic film transistor includes one having a constitution having a source electrode and a drain electrode, an organic semiconductor layer (active layer) acting as a current pathway between these electrodes, and a gate electrode controlling the quantity of current passing the current pathway, in which the organic semiconductor layer is constituted of the above-described organic film. Such an organic film transistor includes a field effect transistor, an electrostatic induction transistor and the like.

The field effect organic film transistor preferably has a source electrode and a drain electrode, an organic semiconductor layer (active layer) acting as a current pathway between these electrodes, a gate electrode controlling the quantity of current passing the current pathway, and an insulation layer disposed between the organic semiconductor layer and the gate electrode. Particularly, it is preferable that a source electrode and a drain electrode are disposed in contact with an organic semiconductor layer (active layer), and further, a gate electrode is disposed sandwiching an insulation layer in contact with the organic semiconductor layer. In the field effect organic film transistor, the organic semiconductor layer is constituted of an organic film containing the compound of the present invention.

The electrostatic induction organic film transistor preferably has a source electrode and a drain electrode, an organic semiconductor layer (active layer) acting as a current pathway between these electrodes, and a gate electrode controlling the quantity of current passing the current pathway, wherein the gate electrode is disposed in the organic semiconductor layer. Particularly, it is preferable that a source electrode, a drain electrode and, a gate electrode disposed in an organic semiconductor layer are disposed in contact with the organic semiconductor layer. Here, the gate electrode may have a structure by which a current pathway flowing from a source electrode to a drain electrode can be formed and the quantity of current passing the current pathway can be controlled by voltage applied to the gate electrode, and for example, a comb-shaped electrode is mentioned. Also in the electrostatic induction organic film transistor, the organic semiconductor layer is constituted of an organic film containing the compound of the present invention.

<Application of Device>

A photoelectric conversion device using the compound of the present invention can be irradiated with a light such as solar light and the like from a transparent or semi-transparent electrode, to generate photovoltaic power between electrodes, and can be operated as an organic film solar battery. By integrating several organic film solar batteries, an organic film solar battery module can be obtained and used.

By irradiating with a light from a transparent or semi-transparent electrode under condition of application of voltage between electrodes or under condition of no application of voltage, photocurrent flows, and the battery can be operated as an organic optical sensor. By integrating several organic optical sensors, an organic image sensor can also be obtained and used.

The above-described organic film transistor can be used, for example, as a pixel driving element used for regulation of picture elements, for uniformity of screen brilliance and for control of screen rewriting speed of an electrophoresis display, a liquid crystal display, an organic electroluminescent display and the like.

<Solar Battery Module>

An organic film solar battery can take basically an identical module structure to a conventional solar battery module. The solar battery module generally has a structure in which a cell is constituted on a supporting substrate made of a metal, ceramic and the like, its upper side is covered with a filling resin, a protective glass or the like, and a light is incorporated from the opposite side of the supporting substrate, however, a structure in which a transparent material such as reinforced glass and the like is used as the supporting substrate, a cell is constituted thereon and a light is incorporated from its transparent supporting substrate is also possible. Specifically, module structures called super straight type, sub straight type and potting type and a substrate-integrated module structure and the like used in an amorphous silicon solar battery and the like are known. Also an organic film solar battery produced by using the compound of the present invention can appropriately select these module structures depending on the use object, the use place and environments.

Typical super straight type or sub straight type modules have a structure in which cells are disposed at a constant distance between supporting substrates of which one side or both sides are transparent and having undergone an antireflection treatment, adjacent cells are mutually connected via a metal lead or flexible wiring and the like, a collector electrode is disposed at the outer peripheral part, and generated electric power is taken outside. Between the substrate and the cell, various kinds of plastic materials such as ethylene vinyl acetate (EVA) and the like may be used in the form of a film or filling resin depending on the object, for protection of the cell and improvement of power collection efficiency. When used at a place needing no covering of the surface with a hard material such as a place receiving little impact from the outside, the surface protective layer is constituted of a transparent plastic film or the above-described filling resin is hardened to give protective function, and one of supporting substrates can be omitted.

The periphery of the supporting substrate is fixed in the form of a sandwich by metal frames for confirming interior tight seal and rigidity of a module, and a space between the supporting substrate and the frame is tightly sealed with a sealing material. If a flexible material is used in the cell itself or the supporting substrate, the filling material and the sealing material, it is also possible to constitute a solar batter on a curved surface.

In the case of a solar battery using a flexible supporting body such as a polymer film and the like, cells are formed in sequence while feeding a supporting body in the form of a roll, and cut into desired size, then, peripheral parts are sealed with a flexible material having a moisture-proof property, thus, a battery body can be fabricated. The solar battery can also take a module structure called "SCAF" described in Solar Energy Materials and Solar Cells, 48, pp. 383-391. Further, the solar battery using a flexible supporting body can also be adhered and fixed to curved glass and the like and used.

<Organic Electroluminescent Device>

The compound of the present invention can also be used in an organic electroluminescent device ("organic EL device"). The organic EL device has a light emitting layer between a first electrode and a second electrode. The organic EL device may contain a hole transporting layer and an electron transporting layer, in addition to the light emitting layer. The compound of the present invention is contained in any of the light emitting layer, the hole transporting layer and the electron transporting layer. The light emitting layer may contain a charge transporting material (denoting a generic name for an electron transporting material and a hole transporting material), in addition to the compound of the present invention. The organic EL device includes a device having an anode, a light emitting layer and a cathode, a device having an anode, a light emitting layer, an electron transporting layer and a cathode wherein an electron transporting layer containing an electron transporting material is further disposed next to the light emitting layer between the cathode and the light emitting layer, a device having an anode, a hole transporting layer, a light emitting layer and a cathode wherein a hole transporting layer containing a hole transporting material is further disposed next to the light emitting layer between the anode and the light emitting layer, a device having an anode, a hole transporting layer, a light emitting layer, an electron transporting layer and a cathode; and the like. It is preferable that at least one a first electrode and a second electrode is transparent or semitransparent.

<Sensor>

The compound of the present invention can be used for production of an organic field effect transistor (OFET) sensor. In the OFET sensor of the present invention, an organic field effect transistor is used as a signal conversion device in outputting an input signal as an electric signal, and sensitivity or selectivity is imparted to any one in a metal-insulation film-semiconductor structure. The OFET sensor of the present invention includes a biosensor, a gas sensor, an ion sensor, a humidity sensor and the like.

The biosensor of the present invention has a substrate and an organic transistor disposed on the substrate, and the above-described organic transistor has an organic semiconductor layer containing the compound of the present invention, a source region and a drain region disposed in contact with the above-described organic semiconductor, a channel region disposed in the above-described organic semiconductor layer and acting as a channel between the above-described source region and the above-described drain region, a gate electrode capable of applying electric filed on the above-described channel region, and a gate insulation film disposed between the above-described channel region and the above-described gate electrode, and a sensitive region as a probe specifically showing mutual action with a standard substance is present on the above-described channel region and/or the above-described gate insulation film. When the concentration of the standard substance changes, a characteristic change occurs in the sensitive region, thus, the biosensor of the present invention functions as a biosensor device.

As a method of detecting the standard substance in a specimen, a method of using a biosensor in which biomolecules such as nucleic acids, proteins and the like and artificially synthesized functional groups are fixed as a probe to the surface of a solid phase support is widely used.

In this method, the standard substance is captured to the surface of a solid phase support by utilizing specific affinity of biomolecules such as a mutual action of complementary nucleic acid chains, an antigen-antibody reaction, an enzyme-substrate reaction, a receptor-ligand mutual action and the like, therefore, a substance showing specific affinity with the standard substance is selected as a probe.

The probe is fixed to the surface of a solid phase support by a method suitable to the kinds of the probe and the solid phase support. Alternatively, it is also possible to synthesize a probe on the surface of a solid phase support (for example, nucleic acid elongating reaction and the like), and in any cases, the probe-fixed solid phase support surface is brought into contact with a specimen, and culturing is performed under suitable conditions, thus, a probe-standard substance complex is formed on the surface of the solid phase support. The above-described channel region and/or the above-described gate insulation film may itself function as a probe.

The gas sensor of the present invention has a substrate and an organic transistor disposed on the substrate, and the above-described organic transistor has an organic semiconductor layer containing the compound of the present invention, a source region and a drain region disposed in contact with the above-described organic semiconductor, a channel region disposed in the above-described organic semiconductor layer and acting as a channel between the above-described source region and the above-described drain region, a gate electrode capable of applying electric field to the above-described channel region, and a gate insulation film disposed between the above-described channel region and the above-described gate electrode, and the above-described channel region and/or the above-described gate insulation film is used as a gas sensitive part. When a gas is adsorbed to or desorbed from the channel region and/or the above-described gate insulation film, a characteristic change of electric conductivity, dielectric constant and the like occurs, thus, the gas sensor of the present invention functions as a gas sensor device.

The detectable gas includes an electron accepting gas such as halogens such as $F_2$, $Cl_2$ and the like; nitrogen oxides; sulfur oxides; organic acids such as acetic acid and the like, and an electron donating gas such as ammonia; amines such as aniline and the like; carbon monoxide; hydrogen, and the like.

The compound of the present invention can be used for production of a pressure sensor. The pressure sensor of the present invention has a substrate and an organic transistor disposed on the substrate, and the above-described organic transistor has an organic semiconductor layer containing the compound of the present invention, a source region and a drain region disposed in contact with the above-described organic semiconductor, a channel region disposed in the above-described organic semiconductor layer and acting as a channel between the above-described source region and the above-described drain region, a gate electrode capable of applying electric field to the above-described channel region, and a gate insulation film disposed between the above-described channel region and the above-described gate electrode, and the above-described channel region and/or the above-described gate insulation film is used as a pressure sensitive part. When the pressure sensitive part senses pressure, a characteristic change occurs, thus, the pressure sensor of the present invention functions as a pressure sensitive device.

When the gate insulation film is used as a pressure sensitive part, an organic material is preferable as a pressure sensitive part of a pressure sensor since organic materials are softer and have a higher stretching property than inorganic materials in general.

When the above-described channel region is used as a pressure sensitive part, an orientation layer may be provided for enhancing the crystallinity of an organic semiconductor. The orientation layer includes a monomolecular film and the like formed of a silane coupling agent such as hexamethyldisilazane and the like on a gate insulation film.

The compound of the present invention can also be used in a conductivity modulation sensor. The conductivity modulation sensor of the present invention is one using a conductivity measuring device as a signal conversion device in outputting an input signal as an electric signal, and sensitivity or selectivity against sensor target input is imparted to an organic semiconductor layer using the compound of the present invention or a covering film covered on at least a part of an organic semiconductor layer using the compound of the present invention, and input of a sensor target is detected as a change of conductivity of the above-described polymer compound. The sensor includes a biosensor, a gas sensor, an ion sensor, a humidity sensor and the like.

The compound of the present invention can also be used for production of an amplifying circuit containing an organic field effect transistor (OFET) for amplifying the output signal from various sensors such as a biosensor, a gas sensor, an ion sensor, a humidity sensor, a pressure sensor and the like separately formed.

The compound of the present invention can be used as a sensor array containing a plurality of various sensors such as a biosensor, a gas sensor, an ion sensor, a humidity sensor, a pressure sensor and the like described above.

The compound of the present invention can also be used for production of an amplifying circuit-equipped sensor array containing a plurality of various sensors such as a biosensor, a gas sensor, an ion sensor, a humidity sensor, a pressure sensor and the like separately formed and containing as an amplifying circuit an organic field effect transistor (OFET) for separately amplifying the output signal from each sensor.

EXAMPLES

Examples are shown below for illustrating the present invention further in detail, but the present invention is not limited to them.

Synthesis Example 1

Deprotonation Reaction of Difluorobenzoxadiazole and Reaction of Trimethylsilyl Chloride

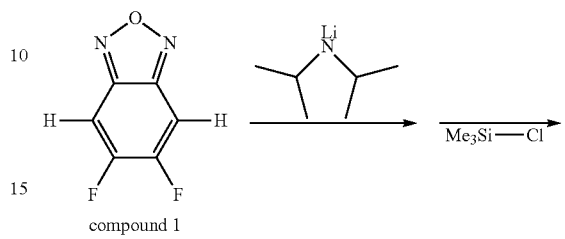

compound 1

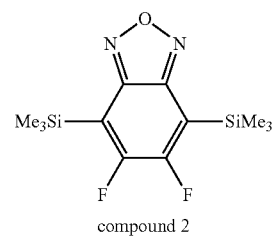

compound 2

Into a 200 mL three-necked flask were charged 3.24 g (32.0 mmol) of diisopropylamine and 40 mL of dehydrated THF. While keeping the flask at −78° C., 20 mL (32 mmol) of a hexane solution (1.6 M) of n-BuLi was added. Thereafter, the flask was warmed up to room temperature over a period of 10 minutes, and the mixture was stirred for 1 hour at the same temperature. The solution thus obtained is called a solution A.

Into another 300 mL flask were charged 2.00 g (12.8 mmol) of the compound 1 and 20 mL of dehydrated THF, and a uniform solution was prepared. The flask was cooled down to −78° C., and the above-described solution A was dropped over a period of 5 minutes. After dropping, the mixture was stirred at −78° C. for 5 minutes, and thereafter, 3.63 mL (33.4 mmol) of trimethylsilyl chloride was dropped over a period of 5 minutes. After dropping, the flask was warmed up to room temperature over a period of 10 minutes, and thereafter, the mixture was stirred at room temperature for 2 hours. Thereafter, water was added to stop the reaction, and extraction with ethyl acetate was performed. The organic layer was dried over sodium sulfate, and the solvent was distilled off by an evaporator. The resultant solid was dissolved in hexane, and the solution was passed through silica gel column chromatography. The solvent of the filtrate was distilled off by an evaporator, to obtain 3.33 g (11.1 mmol) of the targeted compound 2. The yield was 86.5%.

Synthesis Example 2

Bromination Reaction of Trimethylsilylated Difluorobenzoxadiazole in the Presence of Silver Tetrafluoroborate

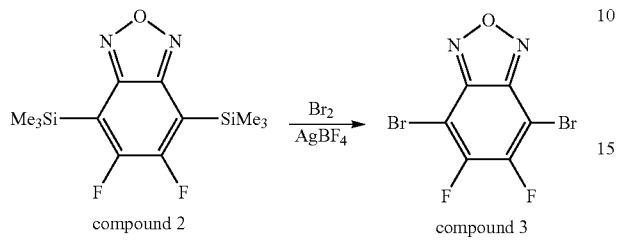

Into a 200 mL three-necked flask were charged 4.00 g (13.3 mmol) of the compound 2 and 150 mL of dehydrated dichloromethane, and a uniform solution was prepared. To this was added 7.76 g (39.9 mmol) of silver tetrafluoroborate. A solution prepared by dissolving 15.5 g (96.9 mmol) of bromine into 50 mL of dichloromethane was dropped into this over a period of 30 minutes, and after dropping, the mixture was stirred at room temperature for 2 hours. After completion of the reaction, the reaction solution was added gradually to a solution prepared by dissolving 50 g of sodium sulfite into 200 mL of water. The organic layer was fractionated, then, the aqueous layer was extracted with dichloromethane twice. The organic layers were combined and dried over sodium sulfate, and the solvent was distilled off by an evaporator, to obtain 4.14 g of a coarse product. The resultant coarse product was recrystallized from methanol, to obtain 3.27 g (10.4 mmol) of the targeted compound 3. The yield was 78.4%.

Example 1 compound 4

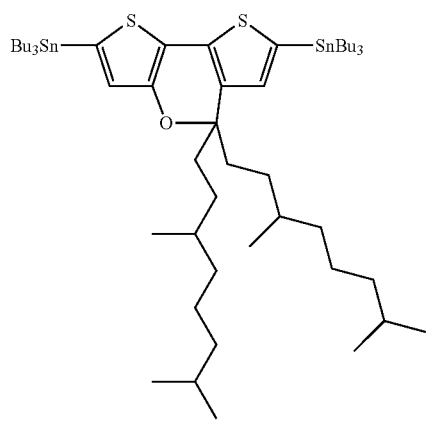

compound 5

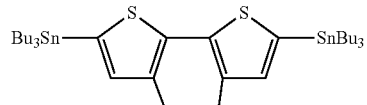

compound 3

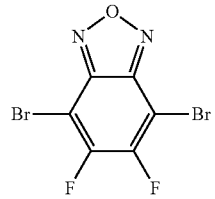

compound 6

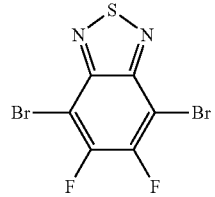

Into a 200 mL flask of which gas in the flask had been purged with argon were charged 203.6 mg (0.193 mmol) of a compound 4 synthesized by a method described in International Publication WO2011/052709, 214.5 mg (0.193 mmol) of a compound 5 synthesized by a method described in International Publication WO2011/052709, 61.3 mg (0.186 mmol) of a compound 6 synthesized by a method described in International Publication WO2011/052709, 58.3 g (0.186 mmol) of the compound 3 synthesized in Synthesis Example 2 described above, 10.2 mg (0.033 mmol) of tris(2-toluyl)phosphine and 25 ml of toluene, and a uniform solution was prepared. The resultant toluene solution was bubbled with argon for 30 minutes. Thereafter, to the toluene solution was added 5.10 mg (0.0056 mmol) of tris(dibenzylideneacetone)dipalladium, and the mixture was stirred at 100° C. for 4 hours. Thereafter, to the reaction solution was added 254 mg of phenyl bromide and they were reacted for 1 hour at 100° C. Thereafter, the flask was cooled to 25° C., and the reaction solution was poured into 300 mL of methanol. The deposited polymer was filtrated and collected, and the resultant polymer was dissolved in 25 mL of o-dichlorobenzene, and the solution was passed through an alumina/silica gel column. The resultant solution was poured into methanol to cause deposition of a polymer, and the polymer was filtrated, then, dried, to obtain 210 mg of a purified polymer. Hereinafter, this polymer is referred to as a polymer compound A.

Example 2

Fabrication and Evaluation of Ink and Organic Film Solar Battery

A glass substrate carrying thereon an ITO film with a thickness of 150 nm formed by a sputtering method was subjected to surface treatment using an ozone UV apparatus. Next, the polymer compound A and phenyl C61-butyric acid methyl ester (fullerene C60PCBM) (manufactured by Frontier Carbon Corporation) were dissolved in ortho dichlorobenzene so that the weight ratio of fullerene C60PCBM to the polymer compound A was 2, to produce an ink 1. In the ink 1, the sum of the weight of the polymer compound A and the weight of fullerene C60PCBM was 2.0% by weight with respect to the weight of the ink 1. The ink 1 was applied on the indium tin oxide (ITO) film of the glass substrate, to fabricate an organic film containing the polymer compound A. The organic film had a film thickness of about 100 nm. The light absorption end wavelength of the organic film was measured to find a value of 890 nm. Thereafter, on the organic film, calcium was vapor-deposited at a thickness of 42 nm by a vacuum vapor deposition machine, then, aluminum was vapor-deposited at a thickness of 100 nm, to fabricate an organic film solar battery. The shape of the resultant organic film solar battery was 2 mm×2 mm square. The resultant organic film solar battery was irradiated with constant light using a solar simulator (manufactured by Bunkoukeiki Co. Ltd., trade name: OTENTO-SUNII: AM 1.5 G filter, irradiance: 100 mW/cm$^2$), and current and voltage generated were measured and photoelectric conversion efficiency, short circuit current density, open circuit voltage and fill factor were determined. Jsc (short circuit current density) was 13.9 mA/cm$^2$, Voc (open circuit voltage) was 0.793 V, FF (fill factor) was 0.639 and photoelectric conversion efficiency ($\eta$) was 7.02%.

Comparative Example 1

Synthesis of Polymer Compound B compound 4

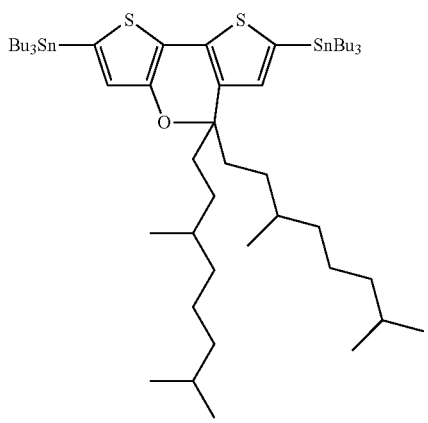

compound 5

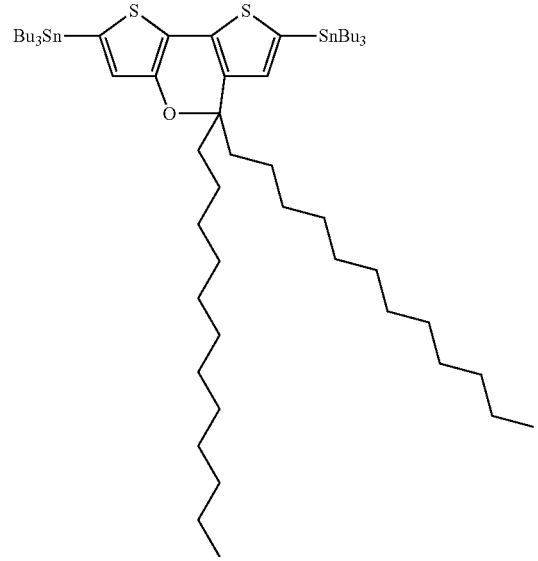

compound 6

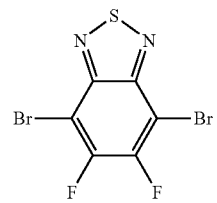

Into a 1000 mL flask of which gas in the flask had been purged with argon were charged 3200 mg (3.039 mmol) of a compound 4 synthesized by a method described in International Publication WO2011/052709, 3371 mg (3.039 mmol) of a compound 5 synthesized by a method described in International Publication WO2011/052709, 2100 mg (6.365 mmol) of a compound 6 synthesized by a method described in International Publication WO2011/052709, 174.3 mg (0.573 mmol) of tris(2-toluyl)phosphine and 435 ml of toluene, and a uniform solution was prepared. The resultant toluene solution was bubbled with argon for 30 minutes. Thereafter, to the toluene solution was added 87.42 mg (0.0955 mmol) of tris(dibenzylideneacetone)dipalladium, and the mixture was stirred at 100° C. for 5 hours. Thereafter, to the reaction solution was added 4127 mg of phenyl bromide and they are reacted for 1 hour at 100° C. Thereafter, the flask was cooled to 25° C., and the reaction solution was poured into 2000 mL of methanol. The deposited polymer was filtrated and collected, and the resultant polymer was dissolved in 413 mL of o-dichlorobenzene, and the solution was passed through an alumina/silica gel column. The resultant solution was poured into methanol to cause deposition of a polymer, and the polymer was filtrated, then, dried, to obtain 3980 mg of a purified polymer. Hereinafter, this polymer is referred to as a polymer compound B.

Comparative Example 2

Fabrication and Evaluation of Ink and Organic Film Solar Battery

An organic film solar battery was fabricated in the same manner as in Example 2 excepting that the polymer compound B was used instead of the polymer compound A, and photoelectric conversion efficiency, short circuit current density, open circuit voltage and fill factor were determined in the same manner as in Example 2. Jsc (short circuit current density) was 15.0 mA/cm$^2$, Voc (open circuit voltage) was 0.712 V, FF (fill factor) was 0.637 and photoelectric conversion efficiency (n) was 6.81%.

Comparative Example 3

Synthesis of Polymer Compound C

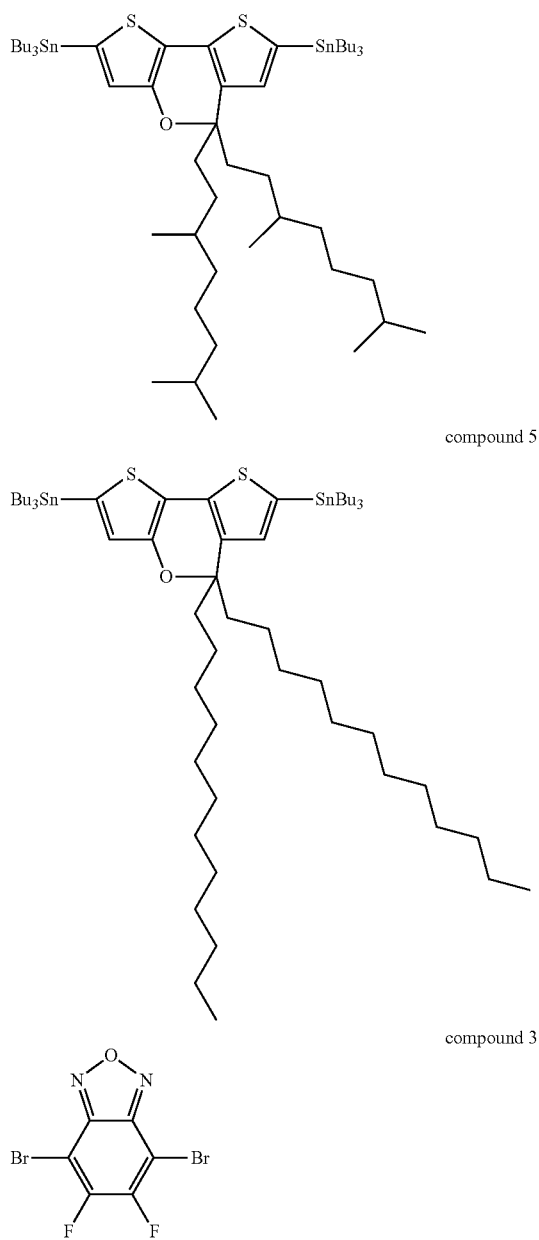

Into a 100 mL flask of which gas in the flask had been purged with argon were charged 167.7 mg (0.159 mmol) of a compound 4 synthesized by a method described in International Publication WO2011/052709, 176.7 mg (0.159 mmol) of a compound 5 synthesized by a method described in International Publication WO2011/052709, 100 mg (0.319 mmol) of the compound 3 synthesized in Synthesis Example 2, 8.70 mg (0.029 mmol) of tris(2-toluyl)phosphine and 23 mL of toluene, and a uniform solution was prepared. The resultant toluene solution was bubbled with argon for 30 minutes. Thereafter, to the toluene solution was added 4.38 mg (0.0048 mmol) of tris(dibenzylideneacetone)dipalladium, and the mixture was stirred at 100° C. for 8 hours. Thereafter, to the reaction solution was added 209 mg of phenyl bromide, and they were reacted for 1 hour at 100° C. Thereafter, the flask was cooled to 25° C., and the reaction solution was poured into 100 mL of methanol. The deposited polymer was filtrated and collected, and the resultant polymer was dissolved in 21 mL of o-dichlorobenzene, and the solution was passed through an alumina/silica gel column. The resultant solution was poured into methanol to cause deposition of a polymer, and the polymer was filtrated, then, dried, to obtain 130 mg of a purified polymer. Hereinafter, this polymer is referred to as a polymer compound C.

Comparative Example 4

Fabrication and Evaluation of Ink and Organic Film Solar Battery

An organic film solar battery was fabricated in the same manner as in Example 2 excepting that the polymer compound C was used instead of the polymer compound A, and photoelectric conversion efficiency, short circuit current density, open circuit voltage and fill factor were determined in the same manner as in Example 2. Jsc (short circuit current density) was 0.21 mA/cm$^2$, Voc (open circuit voltage) was 0.891V, FF (fill factor) was 0.421 and photoelectric conversion efficiency (n) was 0.787%.

TABLE 8

|  | fill factor | photoelectric conversion efficiency (%) |
| --- | --- | --- |
| Example 2 | 0.639 | 7.02 |
| Comparative Example 2 | 0.637 | 6.81 |
| Comparative Example 4 | 0.421 | 0.787 |

Example 3

Into a 200 mL flask of which gas in the flask had been purged with argon were charged 293.8 mg (279.0 mmol) of the compound 4, 309.5 mg (279.0 mmol) of the compound 5, 125.0 mg (378.9 mmol) of the compound 6, 50.9 mg (162.4 mmol) of the compound 3, 12.2 mg (0.040 mmol) of tris(2-toluyl)phosphine and 32 ml of toluene, and a uniform solution was prepared. The resultant toluene solution was bubbled with argon for 30 minutes. Thereafter, to the toluene solution was added 6.0 mg (0.0065 mmol) of tris(dibenzylideneacetone)dipalladium, and the mixture was stirred at 100° C. for 4 hours. Thereafter, to the reaction solution was added 284 mg of phenyl bromide, and they were reacted for 1 hour at 100° C. Thereafter, the flask was cooled to 25° C., and the reaction solution was poured into 400 mL of methanol. The deposited polymer was filtrated and collected, and the resultant polymer was dissolved in 33 mL of o-dichlorobenzene, and the solution was passed through an alumina/silica gel column. The resultant solution was poured into methanol to cause deposition of a polymer, and the polymer was filtrated, then, dried, to obtain 246 mg of a purified polymer. Hereinafter, this polymer is referred to as a polymer compound D.

Example 4

Fabrication and Evaluation of Ink and Organic Film Solar Battery

An organic film solar battery was fabricated in the same manner as in Example 2 excepting that the polymer compound D was used instead of the polymer compound A, and photoelectric conversion efficiency, short circuit current density, open circuit voltage and fill factor were determined in the same manner as in Example 2. Jsc (short circuit current density) was 15.4 mA/cm$^2$, Voc (open circuit voltage) was 0.738 V, FF (fill factor) was 0.627 and photoelectric conversion efficiency (η) was 7.12%.

Example 5

Into a 200 mL flask of which gas in the flask had been purged with argon were charged 284.5 mg (270.2 mmol) of the compound 4, 128.4 mg (115.8 mmol) of the compound 5, 61.3 mg (0.186 mmol) of the compound 6, 58.3 mg (0.186 mmol) of the compound 3, 10.2 mg (0.033 mmol) of tris(2-toluyl)phosphine and 25 ml of toluene, and a uniform solution was prepared. The resultant toluene solution was bubbled with argon for 30 minutes. Thereafter, to the toluene solution was added 5.10 mg (0.0056 mmol) of tris(dibenzylideneacetone)dipalladium, and the mixture was stirred at 100° C. for 4 hours. Thereafter, to the reaction solution was added 254 mg of phenyl bromide, and they were reacted for 1 hour at 100° C. Thereafter, the flask was cooled to 25° C., and the reaction solution was poured into 300 mL of methanol. The deposited polymer was filtered and collected, and the resultant polymer was dissolved in 25 mL of o-dichlorobenzene, and the solution was passed through an alumina/silica gel column. The resultant solution was poured into methanol to cause deposition of a polymer, and the polymer was filtrated, then, dried, to obtain 198 mg of a purified polymer. Hereinafter, this polymer is referred to as a polymer compound E.

Example 6

Fabrication and Evaluation of Ink and Organic Film Solar Battery

An organic film solar battery was fabricated in the same manner as in Example 2 excepting that the polymer compound E was used instead of the polymer compound A, and photoelectric conversion efficiency, short circuit current density, open circuit voltage and fill factor were determined in the same manner as in Example 2. Jsc (short circuit current density) was 14.0 mA/cm$^2$, Voc (open circuit voltage) was 0.795 V, FF (fill factor) was 0.638 and photoelectric conversion efficiency (η) was 7.10%.

TABLE 9

| | fill factor | photoelectric conversion efficiency (%) |
|---|---|---|
| Example 4 | 0.627 | 7.12 |
| Example 6 | 0.638 | 7.10 |

INDUSTRIAL APPLICABILITY

An organic film solar battery having an organic layer containing the compound of the present invention is useful since the battery shows high photoelectric conversion efficiency.

The invention claimed is:

1. A photoelectric conversion device comprising a first electrode and a second electrode and comprising an active layer between the first electrode and the second electrode, wherein the active layer comprises a polymer compound comprising a structural unit represented by the formula (1) and a structural unit represented by the formula (2):

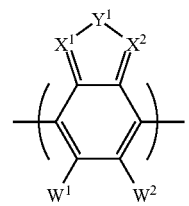

(1)

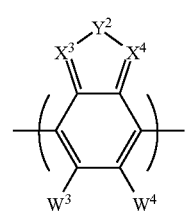

(2)

wherein $X^1$, $X^2$, $X^3$ and $X^4$ represent a nitrogen atom, $Y^1$ represents an oxygen atom; $Y^2$ represents a sulfur atom; $W^2$ and $W^3$ are the same or mutually different and represent a halogen atom, a cyano group or a monovalent organic group; $W^2$ and $W^4$ are the same or mutually different and represent a hydrogen atom, a halogen atom, a cyano group or a monovalent organic group; and the structural unit represented by the formula (1) and the structural unit represented by the formula (2) are not the same; and further comprising a structural unit represented by the following formula:

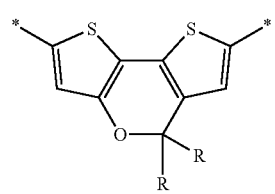

wherein R represents a hydrogen atom, a halogen atom, an amino group, a cyano group or a monovalent organic group, the two R may be the same or mutually different, and two R may be mutually linked to form a cyclic structure together with carbon atoms to which they are linked.

2. The photoelectric conversion device according to claim 1, wherein $W^1$, $W^2$, $W^3$ and $W^4$ are all a halogen atom.

3. The photoelectric conversion device according to claim 1, wherein the polymer compound has a polystyrene-equivalent weight-average molecular weight of $3\times10^3$ g/mol or more.

* * * * *